(12) United States Patent
Shimotsusa et al.

(10) Patent No.: US 7,056,798 B2
(45) Date of Patent: Jun. 6, 2006

(54) SEMICONDUCTOR DEVICE, METHOD FOR MANUFACTURING THE SAME, AND LIQUID JET APPARATUS

(75) Inventors: Mineo Shimotsusa, Tokyo (JP); Kei Fujita, Kanagawa (JP); Yukihiro Hayakawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/657,269

(22) Filed: Sep. 9, 2003

(65) Prior Publication Data

US 2004/0046211 A1    Mar. 11, 2004

Related U.S. Application Data

(62) Division of application No. 10/025,674, filed on Dec. 26, 2001, now Pat. No. 6,825,543.

(30) Foreign Application Priority Data

| Dec. 28, 2000 | (JP) | ............................. | 2000-403335 |
| Feb. 9, 2001 | (JP) | ............................. | 2001-034045 |
| Feb. 9, 2001 | (JP) | ............................. | 2001-034046 |
| Feb. 9, 2001 | (JP) | ............................. | 2001-034048 |

(51) Int. Cl.
    *H01L 21/336* (2006.01)
(52) U.S. Cl. ...................................... 438/301; 438/232
(58) Field of Classification Search ................ 438/301, 438/232, 308
    See application file for complete search history.

(56) References Cited

U.S. PATENT DOCUMENTS

| 5,369,045 A | 11/1994 | Ng et al. ........................ 437/41 |
| 5,382,536 A | 1/1995 | Malhi et al. ................... 437/41 |
| 5,517,224 A | 5/1996 | Kaizu et al. ................... 347/59 |
| 5,602,576 A | 2/1997 | Murooka et al. .............. 347/59 |
| 5,666,142 A | 9/1997 | Fujita et al. ................... 347/59 |
| 5,786,620 A * | 7/1998 | Richards et al. ............. 257/408 |
| 5,801,431 A | 9/1998 | Ranjan ........................ 257/659 |
| 5,850,242 A | 12/1998 | Asaba .......................... 347/59 |
| 6,025,237 A * | 2/2000 | Choi ........................... 438/301 |
| 6,290,334 B1 | 9/2001 | Ishinaga et al. .............. 347/59 |
| 6,302,504 B1 | 10/2001 | Imanaka et al. ................ 347/9 |

FOREIGN PATENT DOCUMENTS

| JP | 62-98764 | 5/1987 |
| JP | 5-129597 | 5/1993 |
| JP | 5-185594 | 7/1993 |
| JP | 6-69497 | 3/1994 |
| JP | 8-97410 | 4/1996 |
| JP | 62-98764 | 5/1997 |
| JP | 9-307110 | 11/1997 |
| JP | 10-34898 | 2/1998 |
| JP | 11-138775 | 5/1999 |

* cited by examiner

*Primary Examiner*—Long Pham
(74) *Attorney, Agent, or Firm*—Fitzpatrick, Cella, Harper & Scinto

(57) ABSTRACT

A semiconductor device in which electro-thermal conversion elements and switching devices for flowing currents through the elements are integrated on a first conductive type semiconductor substrate. The switching devices are insulated gate type field effect transistors having a second conductive type first semiconductor region on one principal surface of the semiconductor substrate; a first conductive type second semiconductor region for supplying a channel region and for adjoining the first semiconductor region; a second conductive type source region on the surface of the second semiconductor region; a second conductive type drain region on the surface of the first semiconductor region; and gate electrodes on the channel region with a gate insulator film between them. The second semiconductor region is formed by a semiconductor having an impurity concentration higher than that of the first semiconductor region, and is disposed between two adjacent drain regions, separating them in a traverse direction.

4 Claims, 34 Drawing Sheets

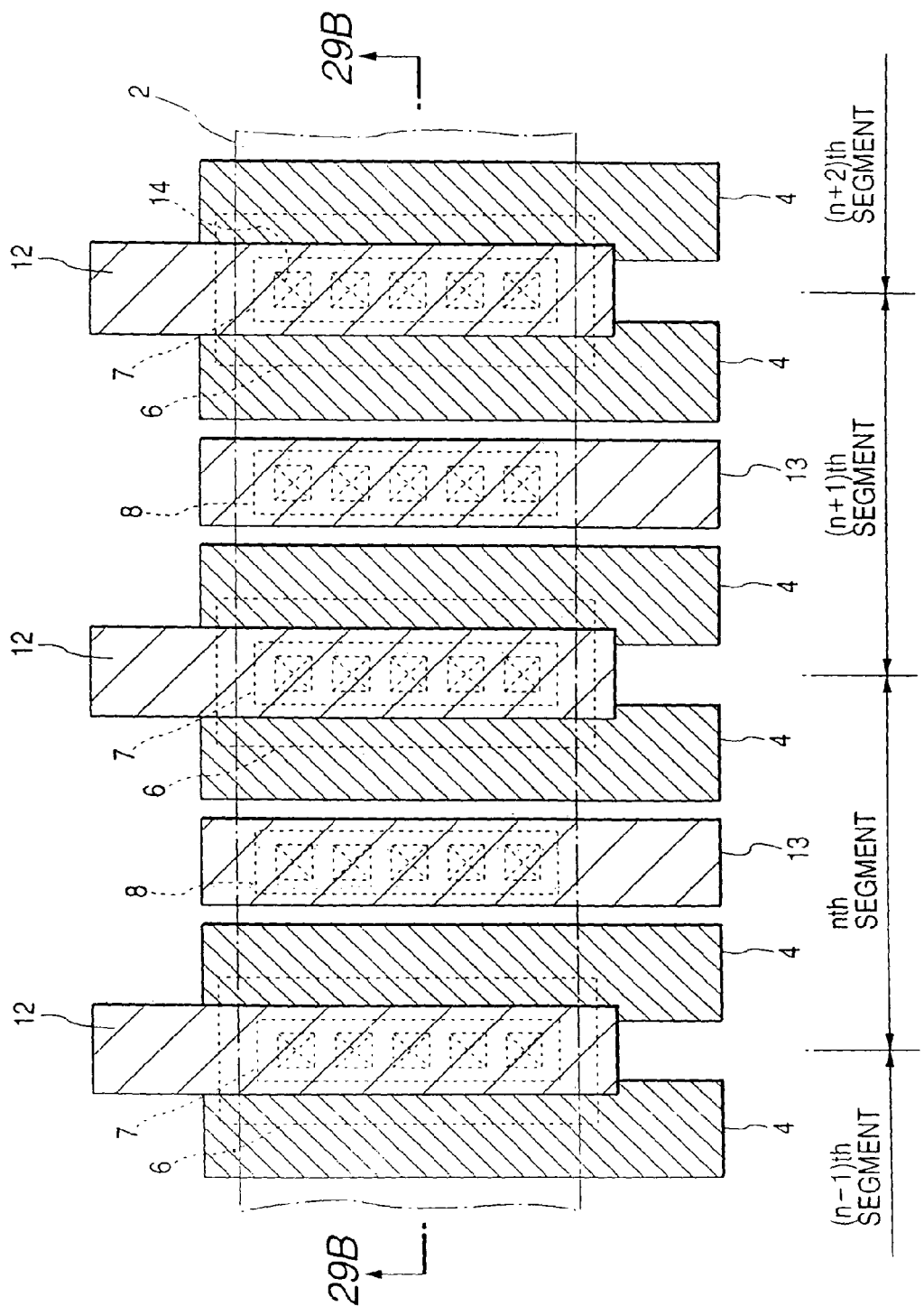

SEMICONDUCTOR DEVICE, METHOD FOR MANUFACTURING THE SAME, AND LIQUID JET APPARATUS

This application is a division of application Ser. No. 10/025,674, filed Dec. 26, 2001 now U.S. Pat. No. 6,825,543.

BACKGROUND OF THE INVENTION

1. Field of the Invention

The present invention relates to a semiconductor device, a method for manufacturing the same, and a liquid jet apparatus, in particular, to a liquid jet apparatus applicable to a recording apparatus to be used as an output terminal of information equipment such as a copying machine, a facsimile, a word processor, a computer or the like, an apparatus to be used for manufacturing a deoxyribonucleic acid (DNA) chip, an organic transistor, a color filter or the like, and the like, a semiconductor device usable to the liquid jet apparatus suitably, and a method for manufacturing the same.

2. Related Background Art

A description is given to a liquid jet apparatus by illustrating a recording apparatus such as an ink jet printer.

A conventional recording apparatus installs an electro-thermal conversion element and a semiconductor for driving the same (hereinafter referred to as an "electro-thermal conversion element driving semiconductor device") therein as the recording head thereof.

FIG. 38 is a sectional view showing the section structure of a part of a conventional ink jet recording head. A reference numeral 101 indicates a semiconductor substrate made of a single crystal silicon.

A reference numeral 102 designates an n-type well region; a reference numeral 108 designates a drain region; a reference numeral 115 designates an n-type field relaxation drain region; a reference numeral 107 designates an n-type source region; and a reference numeral 104 designates a gate electrode. These components constitute an electro-thermal conversion element driving semiconductor device 130 using a metal-insulator semiconductor (MIS) type field effect transistor.

Moreover, a reference numeral 117 designates a silicon oxide layer as a thermal storage layer and an insulator layer; a reference numeral 118 designates a tantalum nitride film as a heat resistor layer; a reference numeral 119 designates an aluminum alloy film as wiring; and a reference numeral 120 designates a silicon nitride film as a protective film. All of the components described above constitute a substrate 140 of the recording head.

Hereupon, a reference numeral 150 designates a portion being a heating portion, and a reference numeral 160 designates a portion where ink is jetted. Moreover, a top plate 170 forms a liquid path 180 in association with the substrate 140.

Other electro-thermal conversion element driving semiconductor devices are disclosed in Japanese Patent Application Laid-Open Nos. 5-185594, 6-069497, 10-034898, and the like.

Now, although many improvements have been made in the aforesaid conventionally structured recording head and the aforesaid electro-thermal conversion element driving semiconductor device, recently the following properties of these products have further been required: being capable of being driven in high speed, using less energy, being highly integrated, being manufactured at low costs, and having high properties. In particular, the high density integration of switching devices has been insufficient in conventional head structures. Moreover, it has been easy to happen the rise of a substrate potential (latch up) caused by the lowness of the breakdown voltages of the conventional head structures can easily occur in operation.

Besides, the structures of electro-thermal conversion element driving semiconductor devices have been known which are disclosed in Japanese Patent Application Laid-Open Nos. 62-098764, 5-129597, 8-097410, 9-307110, and the like.

When insulated gate type transistors are used for driving electro-thermal conversion elements, in addition to the improvements of their breakdown voltages, the improvements of the following properties have become required more: being capable of being driven in high speed, using less energy, being highly integrated, being manufactured at low costs, and having high properties. In particular, the uniformity of properties of transistor devices has been insufficient when the transistor devices are integrated in a high density in conventional semiconductor device structures.

SUMMARY OF THE INVENTION

A first object of the present invention is to provide a semiconductor device, a method for manufacturing the same, and a liquid jet apparatus that can decrease the occupation areas of switching devices superior in break down resistances on chips to enable the further higher integration of electro-thermal conversion element driving semiconductor devices.

A second object of the present invention is to provide a semiconductor device, a method for manufacturing the same, and a liquid jet apparatus that have low possibilities of the occurrence of disadvantages owing to channeling and have transistors equal in characteristics and further are possible to realize the higher integration of semiconductor devices.

The aforesaid first object of the present invention is achieved by a semiconductor device comprising: a plurality of electro-thermal conversion elements; and a plurality of switching devices for flowing electric currents through the plural electro-thermal conversion elements, wherein: the electro-thermal conversion elements and the switching devices are integrated on a first conductive type semiconductor substrate; the switching devices are insulated gate type field effect transistors that severally include: a second conductive type first semiconductor region formed on one principal surface of the semiconductor substrate; a first conductive type second semiconductor region for supplying a channel region, the second semiconductor region being formed to adjoin the first semiconductor region; a second conductive type source region formed on the surface side of the second semiconductor region; a second conductive type drain region formed on the surface side of the first semiconductor region; and gate electrodes formed on the channel region with a gate insulator film put between them; and the second semiconductor region is formed by a semiconductor having an impurity concentration higher than that of the first semiconductor region, the second semiconductor region being disposed between two of the drain regions arranged side by side so as to separate the drain regions in a traverse direction.

Here, it is preferable that the second semiconductor region is formed adjacently to the semiconductor substrate.

Moreover, the source region and the drain region are preferably disposed alternately in traverse directions.

The electro-thermal conversion elements are preferably connected with the drain region.

Two of the gate electrodes are preferably formed with the source region put between them.

An arrangement direction of the plural electro-thermal conversion elements and an arrangement direction of the plural switching devices are preferably in parallel.

The drain regions of at least two of the insulated gate type field effect transistors are preferably connected with one of the electro-thermal conversion elements, and the source regions of the plural insulated gate type field effect transistors are preferably commonly connected.

The effective channel lengths of the insulated gate type field effect transistors are preferably determined on a difference of transversal diffusion quantities between in the second semiconductor region and in the source region.

The insulated gate type field effect transistors severally preferably comprise a first conductive type diffusion layer for pulling out an electrode such that the diffusion layer penetrates the source region.

Drain sides of the gate electrodes are preferably formed on insulator films thicker than the gate insulator film.

Drain sides of the gate electrodes are preferably formed on field insulator films.

The first semiconductor region is preferably a well formed by introducing a reverse conductive type impurity from a surface of the semiconductor substrate.

The first semiconductor region is preferably composed of a plurality of wells formed by introducing a reverse conductive type impurity from a surface of the semiconductor substrate and by transversal separation at every drain region.

The second semiconductor region preferably includes a lower region and a higher region in which its impurity concentration is higher than that in the lower region.

The drain region is preferably disposed separately from drain side end portions of the gate electrodes.

The source region preferably overlaps the gate electrodes.

The drain sides of the gate electrodes are preferably formed on insulator films thicker than the gate insulator film, and the drain region preferably aligns itself with end portions of the thicker insulator films.

The second semiconductor region, the source region and the drain region preferably have sectional structures symmetrical on its right side and on its left side, the structures being formed by introducing impurities by oblique ion implantation.

The semiconductor substrate is preferably an OFF substrate.

Liquid exhaust portions corresponding to the electro-thermal conversion elements are preferably formed.

Moreover, the first object is achieved by a method for manufacturing a semiconductor device in which a plurality of electro-thermal conversion elements and a plurality of switching devices for flowing electric currents through the plural electro-thermal conversion elements are integrated on a first conductive type semiconductor substrate, the method comprising the steps of: forming a second conductive type semiconductor layer on one principal surface of the first conductive type semiconductor substrate; forming a gate insulator film on the semiconductor layer; forming a gate electrode on the gate insulator film; doping a first conductive type impurity by utilizing the gate electrode as a mask; forming a semiconductor region by diffusing the first conductive type impurity; and forming a second conductive type source region on the surface side of the semiconductor region by utilizing the gate electrode as a mask and a second conductive type drain region on the surface side of the second conductive type semiconductor layer.

Moreover, the first object is achieved by a method for manufacturing a semiconductor device in which a plurality of electro-thermal conversion elements and a plurality of switching devices for flowing electric currents through the plural electro-thermal conversion elements are integrated on a first conductive type semiconductor substrate, the method comprising the steps of: forming a second conductive type semiconductor layer on one principal surface of the first conductive type semiconductor substrate; forming a field insulator film on the semiconductor layer selectively; forming a gate insulator film on the semiconductor layer; forming a gate electrode on the gate insulator film and the field insulator film; doping a first conductive type impurity by utilizing the gate electrode as a mask; forming a semiconductor region by diffusing the first conductive type impurity; and forming a second conductive type source region on the surface side of the semiconductor region by utilizing the gate electrode as a mask and a second conductive type drain region on the surface side of the second conductive type semiconductor layer by utilizing the field insulator film as a mask.

Here, it is preferable for the method to comprise the steps of: performing a first conductive type ion implantation into at least a channel region put between the source region and the semiconductor layer on the surface side of the semiconductor region through the gate electrode after the step of forming the semiconductor region; and performing a heat treatment for activating the implanted impurity electrically.

It is also preferable for the method to comprise the steps of: performing a first conductive type ion implantation into at least a channel region put between the source region and the semiconductor layer on the surface side of the semiconductor region through the gate electrode after the step of forming the semiconductor region; and performing a heat treatment for activating the implanted impurity electrically, wherein the ion implantation is ion implantation in which ions of boron are implanted in energy of 100 keV or more.

At least two of the drain regions of MIS type field effect transistors being switching devices are preferably connected with one of the electro-thermal conversion elements, and the sources of the plural MIS type field effect transistors are preferably commonly connected.

Besides, the aforesaid second object is achieved by a method for manufacturing a semiconductor device, the method comprising the steps of: forming a second conductive type semiconductor layer on one principal surface of the first conductive type semiconductor substrate; forming a gate insulator film on the semiconductor layer; forming a gate electrode on the gate insulator film; doping a first conductive type impurity by utilizing the gate electrode as a mask; forming a semiconductor region by diffusing the first conductive type impurity; and forming a second conductive type source region on the surface side of the semiconductor region by utilizing the gate electrode as a mask and a second conductive type drain region on the surface side of the second conductive type semiconductor layer, wherein the method can obtain a transistor structure symmetrical to the source region.

Here, the step of doping the first conductive type impurity preferably includes a step of performing ion implantation obliquely to the principal surface of the semiconductor substrate while rotating the semiconductor substrate.

The step of forming the second conductive type source region preferably includes a step of performing ion implantation obliquely to the principal surface of the semiconductor substrate while rotating the semiconductor substrate.

The step of forming the second conductive type drain region preferably includes a step of performing ion implantation obliquely to the principal surface of the semiconductor substrate while rotating the semiconductor substrate.

The step of doping the first conductive type impurity preferably includes a step of performing ion implantation into the principal surface of an OFF substrate being the semiconductor substrate in a normal line direction of the principal surface.

The step of forming the second conductive type source region preferably includes a step of performing ion implantation into the principal surface of an OFF substrate being the semiconductor substrate in a normal line direction of the principal surface.

The step of forming the second conductive type drain region preferably includes a step of performing ion implantation into the principal surface of an OFF substrate being the semiconductor substrate in a normal line direction of the principal surface.

The step of doping the first conductive type impurity preferably includes a step of performing ion implantation of boron in high energy of 100 keV or more.

The present invention is a method for manufacturing a semiconductor device in which a plurality of insulated gate type field effect transistors are arranged in an array, the method comprising the steps of: forming a second conductive type first semiconductor region on one principal surface of a first conductive type semiconductor substrate; forming a gate insulator film on the first semiconductor region; forming a plurality of gate electrodes on the gate insulator film; forming a first conductive type second semiconductor region by diffusing a first conductive type impurity after implanting the impurity between adjoining two of the gate electrodes by using the two gate electrodes as masks at a fixed angle to a normal line direction of the semiconductor substrate while rotating the semiconductor substrate; and forming a second conductive type source region in the second semiconductor region by utilizing the two gate electrodes as masks and a second conductive type drain region severally in two of the first semiconductor regions disposed to put the second semiconductor region between them by implanting the impurity at the fixed angle to the normal line direction of the semiconductor substrate while rotating the semiconductor substrate.

The present invention is a method for manufacturing a semiconductor device in which a plurality of insulated gate type field effect transistors are arranged in an array, the method comprising the steps of: forming a second conductive type first semiconductor region on one principal surface of a first conductive type semiconductor substrate; forming a field insulator film selectively on the first semiconductor region; forming a gate insulator film on the first semiconductor region; forming gate electrodes on the gate insulator film and the field insulator film; forming a first conductive type second semiconductor region by diffusing a first conductive type impurity after implanting the impurity between two of the gate electrodes by using the two gate electrodes as masks at a fixed angle to a normal line direction of the semiconductor substrate while rotating the semiconductor substrate; and forming a second conductive type source region in the second semiconductor region by utilizing the two gate electrodes as masks and a second conductive type drain region severally in two of the first semiconductor regions disposed to put the second semiconductor region between them by utilizing the field insulator film as a mask by implanting the impurity at the fixed angle to the normal line direction of the semiconductor substrate while rotating the semiconductor substrate.

Here, the second semiconductor region is preferably formed deeper than the first semiconductor region.

A heating resistance element connected with the drain region electrically is preferably formed.

The present invention is a method for manufacturing a semiconductor device, the method comprising the steps of: forming a second conductive type first semiconductor region on a first conductive type semiconductor substrate including one principal surface having a plane direction inclining against a lower dimensional plane direction; forming a gate insulator film in the first semiconductor region; forming a gate electrode on the gate insulator film; forming a second semiconductor region by diffusing a first conductive type impurity after performing ion implantation of the impurity into the semiconductor substrate perpendicularly by utilizing the gate electrode as a mask; and forming a second conductive type source region in the second semiconductor region by utilizing the gate electrode as a mask and a second conductive type drain region in the second semiconductor region by performing ion implantation of impurities severally perpendicularly to the semiconductor substrate.

The present invention is a method for manufacturing a semiconductor device, the method comprising the steps of: forming a second conductive type first semiconductor layer on a first conductive type semiconductor substrate including one principal surface having a plane direction inclining against a lower dimensional plane direction; forming a field insulator film in the first semiconductor region selectively; forming a gate insulator film in the first semiconductor region; forming a gate electrode on the gate insulator film and the field insulator film; forming a second semiconductor region by diffusing a first conductive type impurity after performing ion implantation of the impurity into the semiconductor substrate perpendicularly by utilizing the gate electrode as a mask; and forming a second conductive type source region in the second semiconductor region by utilizing the gate electrode as a mask and a second conductive type drain region in the second conductive type second semiconductor region by utilizing the field insulator film as a mask by performing ion implantation of impurities severally perpendicularly to the semiconductor substrate.

Here, the plane direction of the principal surface of the semiconductor substrate preferably inclines to the lower dimensional plane direction at a degree of a range from 3° to 10°.

Moreover, the plane direction of the principal surface of the semiconductor substrate preferably inclines to a (100) plane at a degree of a range from 3° to 10°.

The plane direction of the principal surface f the semiconductor substrate preferably inclines to a (100) plane at an angle of 4°.

The step of forming the second semiconductor region preferably diffuses the first conductive type impurity such that the impurity is deeper than the first semiconductor region.

A plurality of insulated gate type field effect transistors are preferably arranged in an array.

The present invention is a semiconductor device in which a plurality of insulated gate type field effect transistors are disposed in an array, the insulated gate type field effect transistors severally comprising: a second conductive type first semiconductor region formed on a first conductive type semiconductor substrate including one principal surface having a plane direction inclining to a lower dimensional plane direction; a first conductive type second semiconductor region formed to separate the first semiconductor region, the second semiconductor region having a concentration higher than that of the first semiconductor region; a second conductive type source region formed in the second semiconductor region; and a second conductive type drain region formed in the first semiconductor region.

Here, the plane direction of the principal surface of the semiconductor substrate preferably inclines to the lower dimensional plane direction at a degree of a range from 3° to 10°.

Moreover, the plane direction of the principal surface of the semiconductor substrate preferably inclines to a (100) plane at a degree of a range from 3° to 10°.

Furthermore, the plane direction of the principal surface of the semiconductor substrate preferably inclines to a (100) plane at an angle of 4°.

The depth of the second semiconductor region is preferably deeper than that of the first semiconductor region.

A liquid jet apparatus according to the present invention comprises: the aforementioned semiconductor device including liquid exhaust portions corresponding to electrothermal conversion elements, a liquid container for containing liquid jetted from the liquid exhaust portions by means of the electro-thermal conversion elements; and a controller for supplying a drive controlling signal for driving insulated gate type field effect transistors in the semiconductor device.

According to the present invention, because a drain concentration can be set to be lower than a channel concentration and the drain can be formed to be sufficiently deep, a semiconductor device has a high breakdown voltage that makes it possible to flow a large amount of electric currents, and the semiconductor device has a low on-resistance that makes it possible to operate at a higher speed, and further the semiconductor device can realize the high integration thereof and the saving of its consumption energy. Then, according to the aforesaid configurations of the present invention, even in a case of a semiconductor device requiring an array configuration compose of a plurality of transistors, electrical isolation between devices can be performed without increasing costs.

Moreover, according to the present invention, a transistor array having even characteristics and being highly integrated can be provided. In particular, when double-diffused MOS FET's (DMOS transistors) are used as switching devices, leakage currents flowing from drains to the substrate can be suppressed and the concentration of an electric field can be suppressed, and thereby the breakdown voltage can be improved.

BRIEF DESCRIPTION OF THE DRAWINGS

The above and other objects, features and advantages of the present invention will become more apparent from the following description of the presently preferred exemplary embodiments of the present invention taken in conjunction with the accompanying drawings, in which:

FIG. 29A is a mimetic plan view of a semiconductor device according to the present invention;

DETAILED DESCRIPTION OF THE PREFERRED EMBODIMENTS

Figure 1:
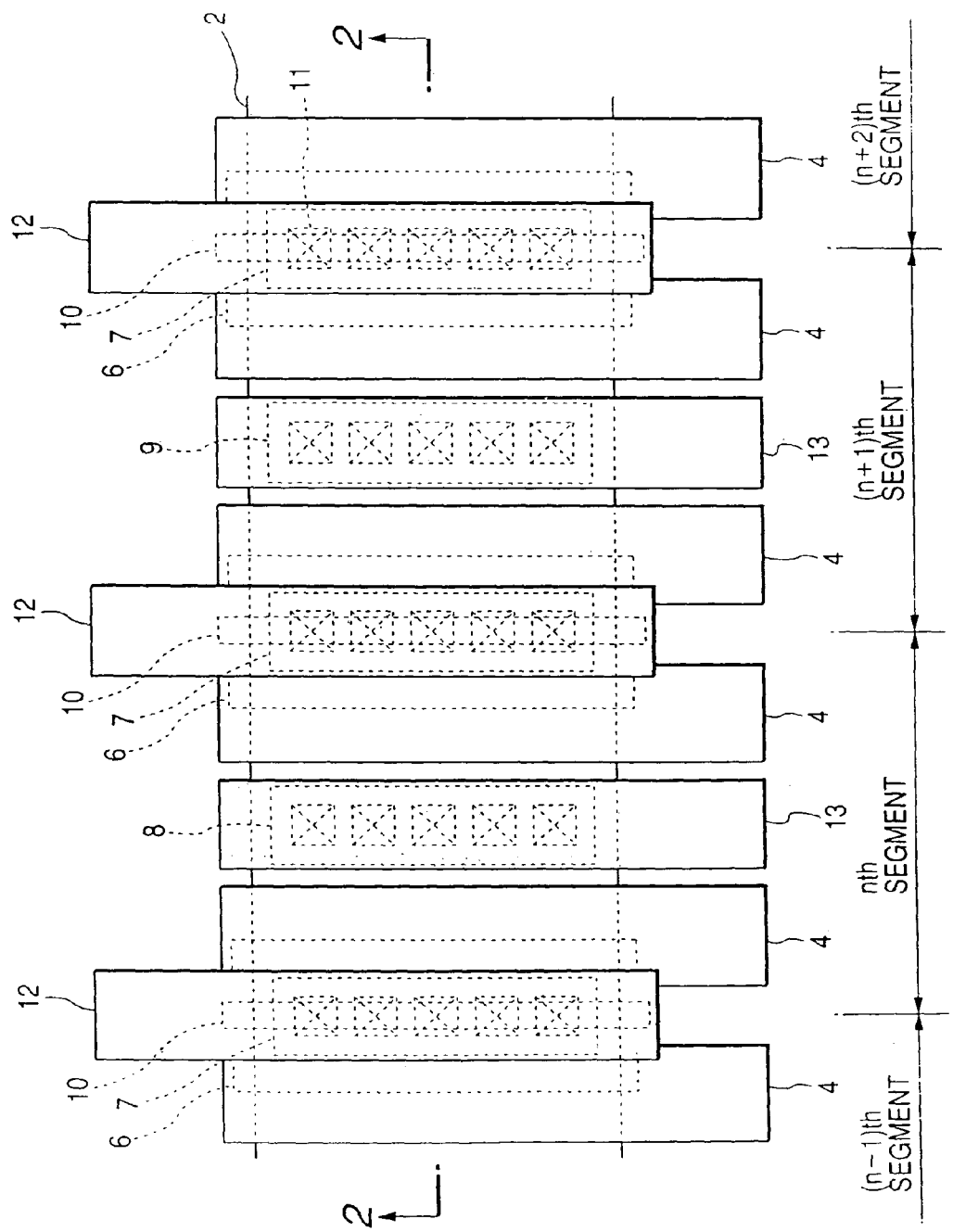
FIG. 1 is a mimetic plan view of a semiconductor device according to Embodiment 1 of the present invention.

In the following, the attached drawings are referenced while the preferred embodiments of the present invention are described in detail.

Embodiment 1

At first, FIGS. 1 to 4 are referenced while a semiconductor device for a liquid jet apparatus according to Embodiment 1 of the present invention is described in detail.

A reference numeral 1 designates a p-type semiconductor substrate; a reference numeral 2 designates an n-type well region (a first semiconductor region); a reference numeral 4 designates a gate electrode; a reference numeral 6 designates a p-type base region (a second semiconductor region); a reference numeral 7 designates an n-type source region; reference numerals 8 and 9 severally designate an n-type drain region; a reference numeral 10 designates a diffusion layer for taking out a base electrode; a reference numeral 11 designates a contact; a reference numeral 12 designates a source electrode; and a reference numeral 13 designates a drain electrode. Moreover, a reference numeral 30 designates an insulated gate type field effect transistor; reference marks Tr1, Tr2 and Tr3 severally designate a switching device composed of the insulated gate type field effect transistors; reference numerals 31, 32 and 33 severally designate an electro-thermal conversion element as a load.

The electro-thermal conversion elements 31 to 33 are disposed with being integrated on the principal surface by a thin film process. Similarly, the switching devices Tr1 to Tr3 are disposed on the surface of the semiconductor substrate 1. As the need arises, by the setting of the disposition directions of the electro-thermal conversion elements 31 to 33 and the switching devices Tr1 to Tr3 to be severally parallel to one another, the integration degree of the semiconductor device can further be increased. In this case, it is preferable to dispose the switching devices Tr1 to Tr3 in the manner shown in FIGS. 1 to 3. Hereupon, a configuration is employed in which all of the transistors of the switching devices Tr1 to Tr3 connected with the electro-thermal conversion elements 31 to 33 have the same structure and no dedicated isolation region is required between the transistors in a transistor array.

One segment is composed of aforesaid two gate electrodes 4 and two source regions 7 with the drain region 8 or 9 put between them. Among these components, the source regions 7 are commonly owned by adjoining segments.

Figure 3:
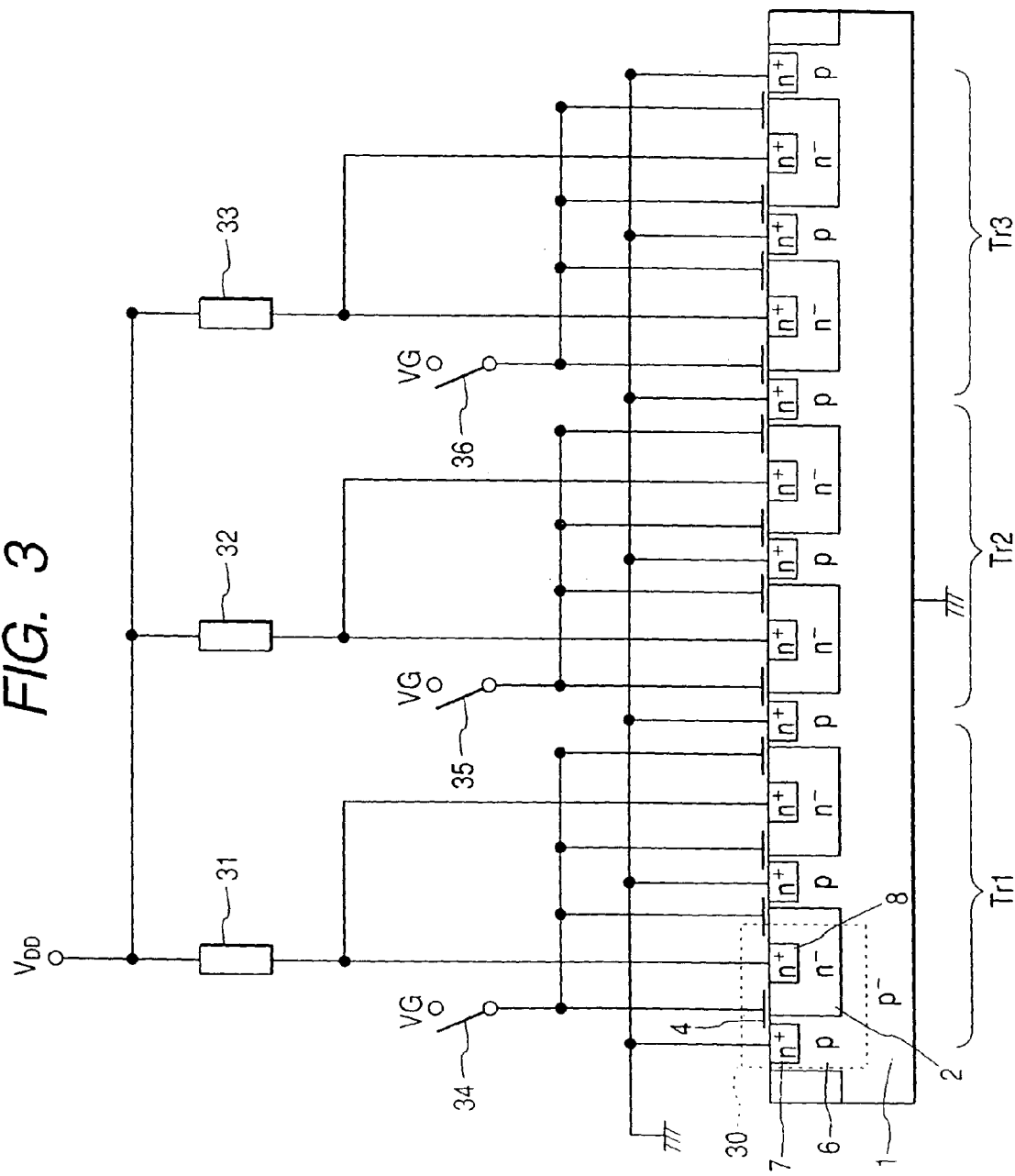
FIG. 3 is a mimetic diagram for illustrating the circuit configuration of the semiconductor device according to the present invention.

In the example shown in FIG. 3, the drain regions 8 and 9 of two segments are connected with one side terminal of each electro-thermal conversion element 31, 32 and 33, and the common source regions 7 are connected with a low reference voltage source supplying a relatively low reference voltage such as 0 V. The other side terminal of each electro-thermal conversion element 31, 32 and 33 are connected with a high reference voltage source supplying a relatively high reference voltage VDD in a degree of, for example, +10 V to +30 V.

An outline of the operation of the semiconductor device is described. A reference voltage such as, for example, a ground potential is given to the p-type semiconductor substrate 1 and the source regions 7. Then, the high reference voltage VDD is supplied to one side terminals of the electro-thermal conversion elements 31 to 33. When an electric current is flowed through only, for example, the electro-thermal conversion element 31 among them, by the turning on of only a switch 34, a gate voltage VG is supplied to the gate electrodes 4 of the transistors of the two segments constituting the switching device Tr1 to turn on the switching device Tr1. Then, an electric current flows from the power source terminal to the grounded terminal through the electro-thermal conversion element 31 and the switching device Tr1 to generate heat in the electro-thermal conversion element 31. Then, as it is well known, the heat is utilized to jet liquid.

In the present embodiment, as shown in FIG. 1, the deep base regions 6 are formed so as to laterally divide a well that has been formed before, into well regions 2. The well region 2 and the base region 6 in the transistor 30 respectively perform the roles of the drain of the transistor 30 and the channel of the transistor 30. Consequently, because the channel is formed after the formation of the drain in contrast with the case of an ordinary metal oxide semiconductor (MOS) transistor in which the drain is formed after the formation of a semiconductor region being a channel, it is possible to set the impurity atom concentration of the drain (hereupon the donor concentration in the first semiconductor region) to be lower than the impurity atom concentration of the channel (hereupon the acceptor concentration in the second semiconductor region). The breakdown voltage of the transistor 30 is determined in accordance with the breakdown voltage of the drain, and the breakdown voltage ordinarily becomes high as the drain concentration is lower or as the depth of the drain is deeper. Consequently, the rated voltage of the semiconductor device can be set higher, and it is possible to increase electric currents, and then the high speed operation of the device can be realized in the present embodiment.

Moreover, the effective channel length of the transistor 30 according to the present embodiment is determined by the difference of the traverse direction diffusion quantities in the base region 6 and in the source region 7. Because the traverse direction diffusion quantities are determined on the basis of physical coefficients, the effective channel length can be set to be shorter than that of conventional transistors. Consequently, the on-resistance of the transistor 30 can be decreased. The decrease of the on-resistance results in the increase of the quantity of capable current flow per unit size, and makes it possible to operate in high speed, save energy and be integrated in a large degree.

Moreover, two gate electrodes 4 are disposed with a source region 7 put between them, and both of the base region 6 and the source region 7 can be formed in a self-adjusting manner by the use of the gate electrodes 4 as a mask. Consequently, no size difference between the base region 6 and the source region 7 owing to their alignment is generated, and the transistor 30 can be made without any diffusion in its threshold values, and a high yield can be realized, and further high reliability can be obtained.

Moreover, for the complete separation of the well region 2, the bottom portion of the base region 6 is formed to have a sufficient depth to adjoin the n-type semiconductor substrate 1 being the ground so that the base region 6 reaches the substrate 1. Owing to such structure, each drain of each segment can severally be separated electrically.

Consequently, even if the source regions 7 and the drain regions 8 and 9 are disposed in a traverse direction without the disposition of any dedicated isolation region, the operation of each switching device Tr1, Tr2 and Tr3 is not prevented.

Moreover, because the diffusion layer 10 for taking out a base electrode is formed to penetrate the source region 7, the base region 6 can be held at a predetermined electric potential without the increase of the occupation area of the base region 6.

Figure 4:
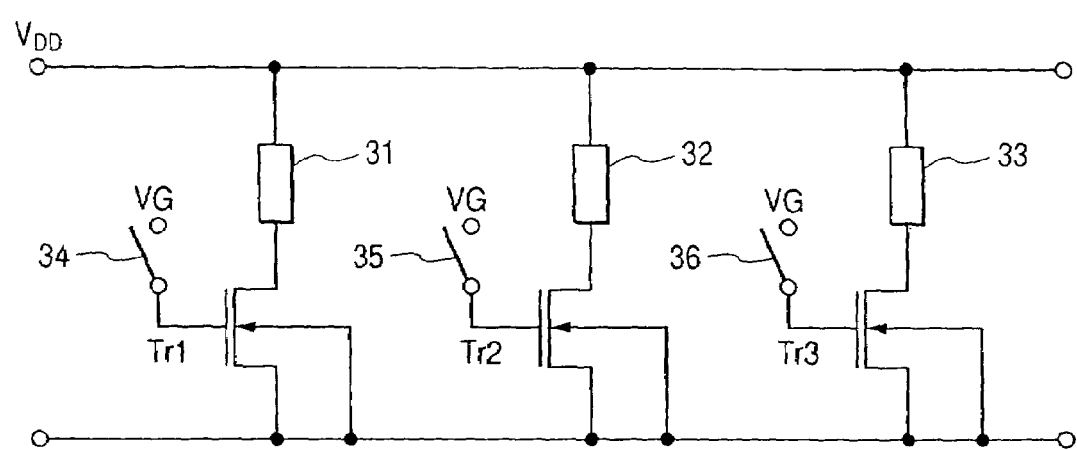
FIG. 4 is a circuit diagram of the semiconductor device according to the present invention.

FIG. 3 and FIG. 4 show an example of a structure in which two drains of transistors (two segments) are connected to one load capable of being driven separately. When an on-signal for driving the load is supplied to the gates of the transistors, the transistors take their on-states. Then, an electric current flows from one drain to the common sources adjoining both sides of the drain. As described above, the sources located on boundaries of the adjoining segments can commonly be used.

Consequently, in the case where the transistors of the present embodiment are disposed in an array to be used as a liquid jet apparatus, there is no necessity of the formation of a particularly dedicated isolation region composed of a semiconductor for separating a p-n junction, the localized oxidation of silicon (LOCOS), dielectrics for separating trenches, and the like between each transistor, and it is possible to realize a semiconductor device that can flow a large electric current and is highly integrated, which enables a reduction in costs. In addition, the leakage current flowing through the substrate 1 from the drain can be suppressed sufficiently.

Embodiment 2

The basic structure of a semiconductor device for a liquid jet apparatus according to Embodiment 2 of the present invention is the same as that of Embodiment 1 mentioned above. Principal differences between both of them are positions of the drain regions 8 and their formation processes.

Figure 5:
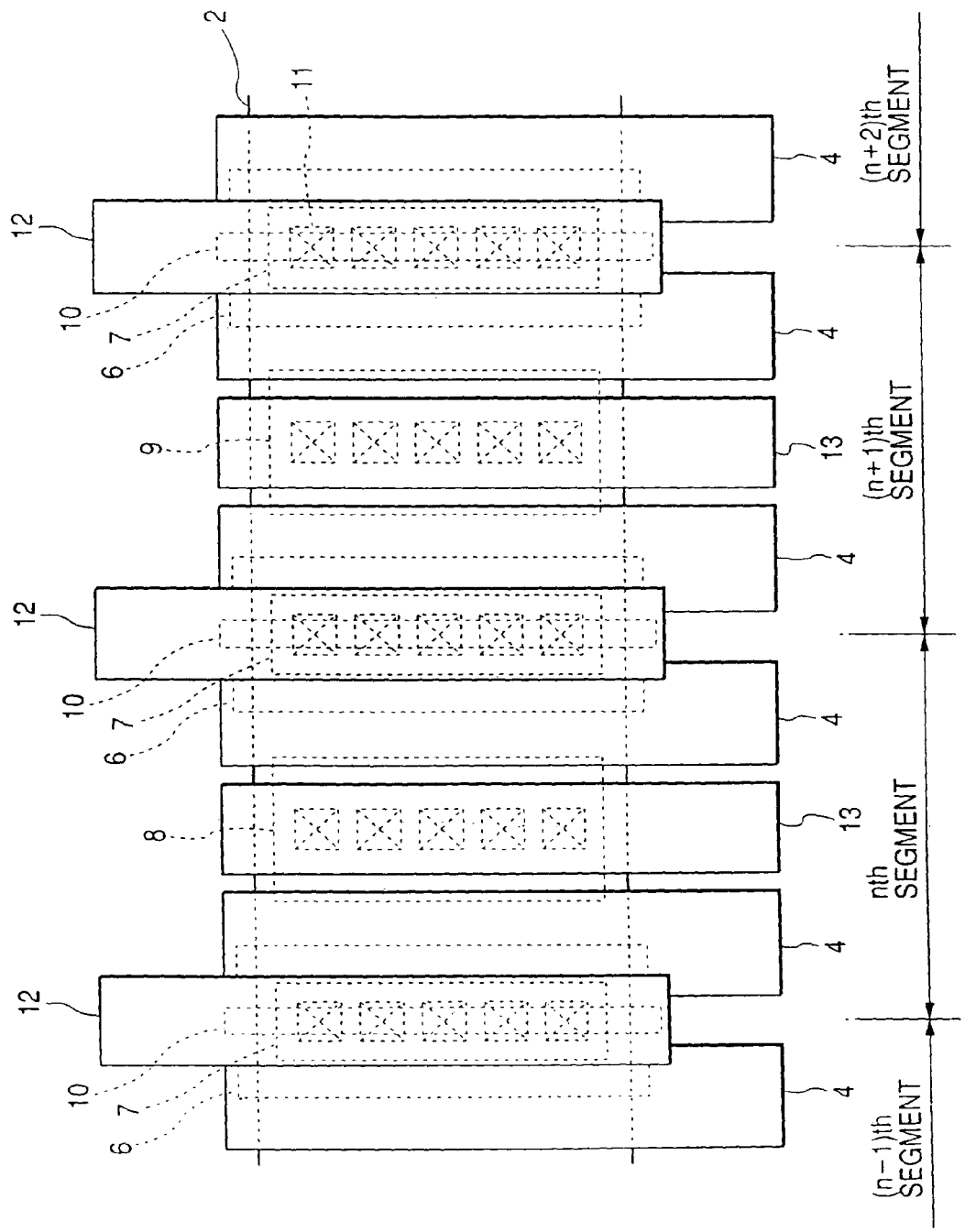
FIG. 5 is a mimetic plan view of a semiconductor device according to Embodiment 2 of the present invention.

FIG. 5 shows a planar structure of the semiconductor device for the liquid jet apparatus according to Embodiment 2 of the present invention, and FIGS. 6A, 6B, 6C, 6D, 6E and 6F show sectional views thereof.

Figure 6A:
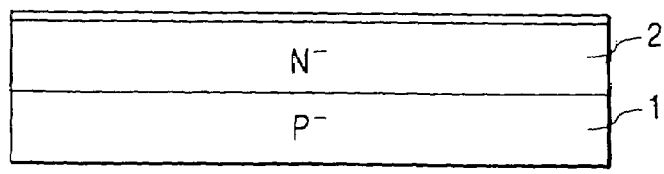
FIGS. 6A, 6B, 6C, 6D, 6E and 6F are mimetic sectional views for illustrating a manufacturing process of the semiconductor device according to Embodiment 2 of the present invention.
Figure 6B:
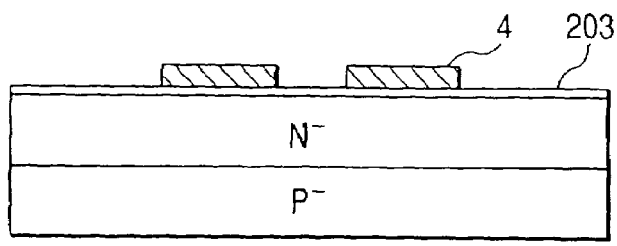
Figure 6C:
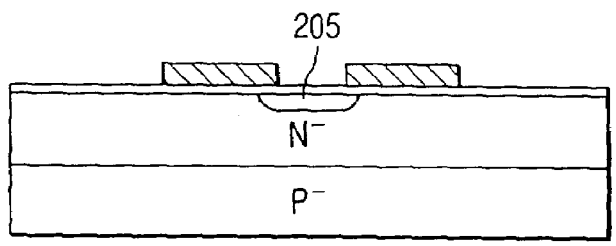
Figure 6D:
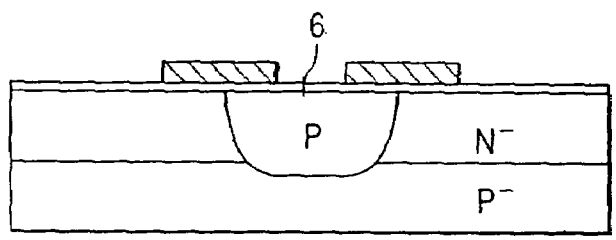
Figure 6E:
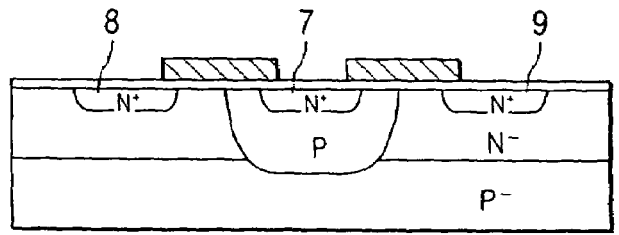

Then, the method for manufacturing the semiconductor device is roughly a method for manufacturing a semiconductor device in which a plurality of electro-thermal conversion elements and a plurality of switching devices for flowing electric currents through the plural electro-thermal conversion elements are integrated on a first conductive type semiconductor substrate, the method comprising the steps of: forming a second conductive type semiconductor layer 2 on a principal surface of the first conductive type semiconductor substrate 1 (FIG. 6A); forming a gate insulator film 203 on the semiconductor layer; forming gate electrodes 4 on the gate insulator film 203 (FIG. 6B); doping a first conductive type impurity by utilizing the gate electrodes 4 as masks (FIG. 6C); forming a semiconductor region by diffusing the first conductive type impurity to be deeper than the second conductive type semiconductor layer (FIG. 6D); and forming a second conductive type source region 7 on a surface side of the semiconductor region by utilizing the gate electrodes 4 as masks and second conductive type drain regions 8 and 9 on a surface side of the second conductive type semiconductor layer (FIG. 6E).

In the following, the method is described in detail.

At first, as shown in FIG. 6A, a p-type semiconductor substrate 1 is prepared. An n-type impurity is selectively introduced into a region to be formed as a well to form an n-type well region 2 on the surface of the p-type semiconductor substrate 1. The n-type well region 2 can be formed on the whole surface of the p-type semiconductor substrate 1. Moreover, an epitaxial growth method can be used when the n-type well region 2 is formed on the whole surface of the p-type semiconductor substrate 1.

Next, as shown in FIG. 6B, a gate insulator film (gate oxide film) 203 is grown on the n-type well region 2 to be 50 nm in the thickness of the film 203 by, for example, a pyrogenic oxidation, and polycrystalline silicon is deposited on the gate insulator film 203 to be 300 nm in the thickness of the film by, for example, a low pressure chemical vapor deposition (LPCVD) method. The polycrystalline silicon is made to have a desired wiring resistance value by, for example, the doping of phosphorus at the same time of the deposition by the LPCVD method, or by the doping of, for example, phosphorus by the use of, for example, an ion implantation method or a solid state diffusion method after the deposition. After that, patterning is performed by means of a photolithography method, and the polycrystalline silicon film is etched. Consequently, the gate electrodes 4 of the MIS type field effect transistor can be formed.

Next, as shown in FIG. 6C, a mask for the ion implantation (not shown) composed of photoresist is formed by the performance of patterning using the photolithography, and the gate electrodes 4 are also used as masks. Then, the ion implantation of a p-type impurity, for example, boron is performed to form an impurity layer 205.

Next, as shown in FIG. 6D, a heat treatment is performed at 1100° C. for 60 minutes in an electric furnace to form the base region 6 to be about 2.2 mm in depth for the traverse electrical separation of the well region 2. In the present embodiment, it is important to design the base region 6 to be deeper than the well region 2 for the complete separation of the well region 2 by the heat treatment, and the conditions of the heat treatment are determined according to the depth of the well region 2, the concentration thereof, the kind of the impurity thereof, and the concentration and the kind of the impurity of the impurity layer 205. The depth of the base region 6 used in the present invention can be selected in a range of, for example, about from 1 mm to 3 mm, and the concentration of the base region 6 can be selected in a range of, for example, about from $1\times10^{15}/cm^3$ to $1\times10^{19}/cm^3$ at the most outside surface.

Next, as shown in FIG. 6E, the source region 7, a first drain region 8 and a second drain region 9 are formed by the ion implantation of, for example, arsenic by the use of gate electrodes 4 as masks. Thus, the source region 7 and the drain regions 8 and 9 are formed overlapping with each other a little while self-adjusting with the gate electrodes 4.

Figure 6F:
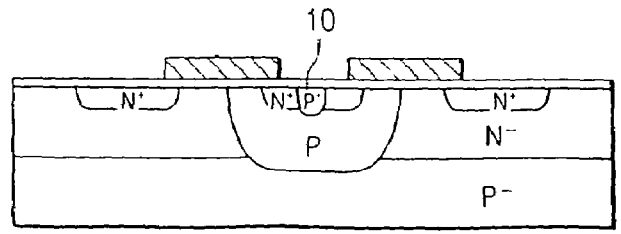

Next, as shown in FIG. 6F, patterning is performed by photolithography to form a mask of photoresist (not shown), and the diffusion layer 10 for taking out a-base electrode is formed by, for example, ion implantation. Although the diffusion layer 10 for taking out the base electrode is not always necessary, it is preferable to form the diffusion layer 10 on the designing of the circuit. Moreover, when a p-type MIS type field effect transistor is made at the same time for signal processing, the formation of the diffusion layer 10 does not increase any process. After that, the heat treatment is performed for, for example, thirty minutes at 950° C., and then the first drain region 8, the second drain region 9 and the diffusion layer 10 for taking out the base electrode are activated.

After that, although it is not shown, an oxide film is deposited by a chemical vapor deposition (CVD) method to form an interlayer insulator film. Then, contact holes for contacts 11 (see FIG. 1) are opened, and a dielectric is deposited. Then, patterning is performed to form wiring. Then, multi-layer wiring is performed as the need arises, and thus an integrated circuit is completed.

Electro-thermal conversion elements are made in the wiring forming process by a well known thin film process, and the elements are integrated on the substrate 1. The circuit configuration in this case is the same as that of the embodiment mentioned above.

Because the base region 6, the source region 7 and the drain regions 8 and 9 are formed by the use of the gate electrodes 4 as the mask for ion implantation, those regions 6, 7 and 8 are formed while being adjusted to the gate electrodes 4, and consequently the high integration of the switching device array and the equalization of the characteristics of each device can be achieved. Moreover, because the source region 7 and the domain regions 8 and 9 are formed in the same process, the embodiment contributes to the suppression of manufacturing costs.

Embodiment 3

Figure 2:
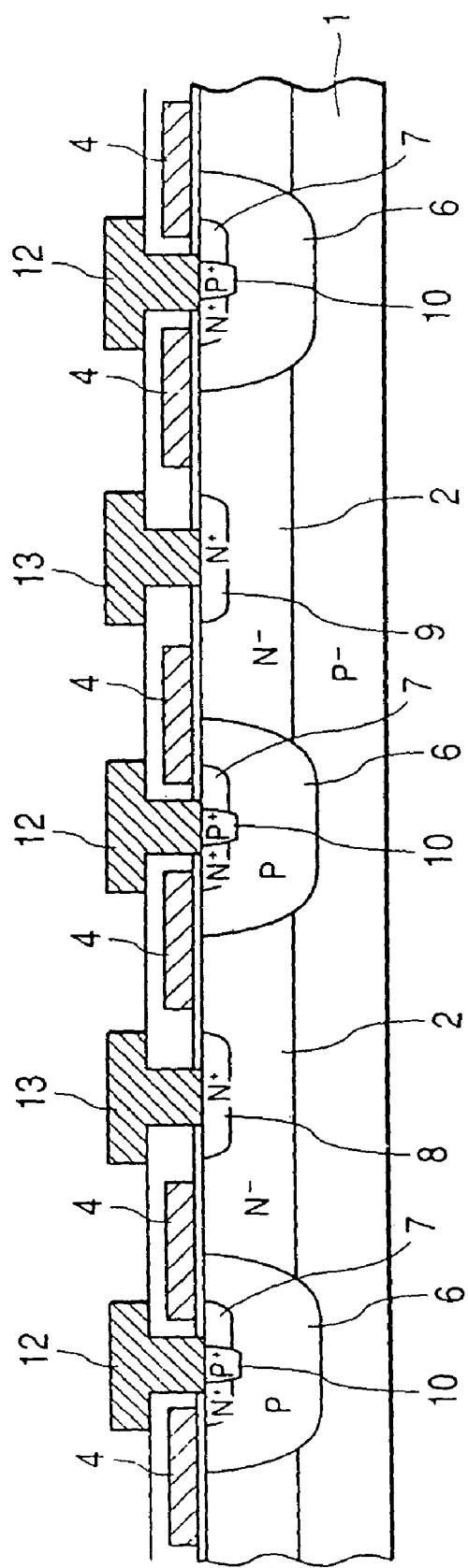
FIG. 2 is a mimetic sectional view of the semiconductor device according to Embodiment 1 of the present invention.

When it is desired to improve the breakdown voltage of the drain region further, it is also preferable to form the end portions of the drain regions 8 and 9 apart from the end portions of the gate electrodes 4 as shown in FIGS. 1 and 2. In particular, a semiconductor device made by the following method can be manufactured without the increase of the number of steps of the photolithography.

Figure 7:
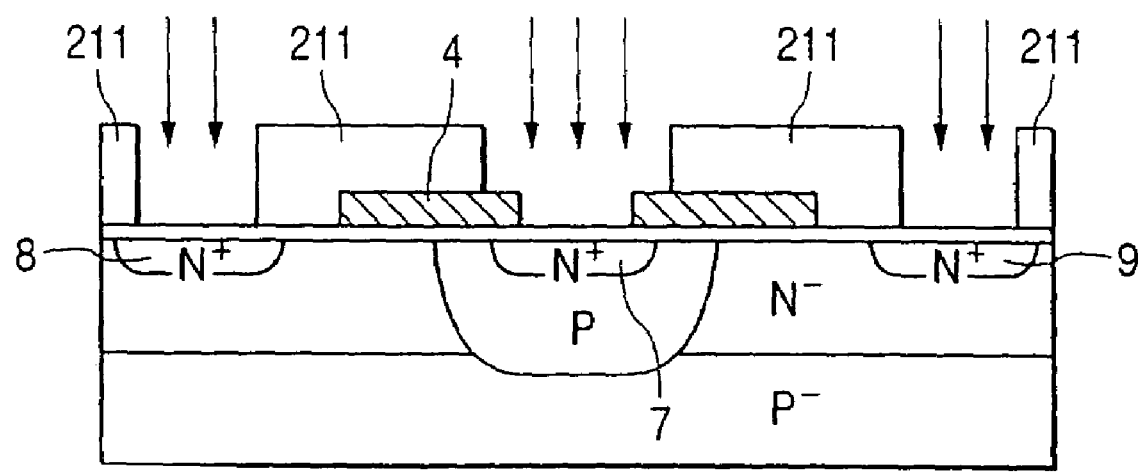
FIG. 7 is a mimetic sectional view for illustrating the manufacturing process of a semiconductor device according to Embodiment 3 of the present invention.

FIG. 7 is a sectional view for illustrating the manufacturing method of a semiconductor device according to Embodiment 3 of the present invention. Hereupon, the manufacturing method is described after the processes of FIGS. 6A to 6D have been performed.

As shown in FIG. 7, photoresist masks 211 are formed by the patterning with the photolithography, and then the source region 7, the first drain region 8 and the second drain region 9 are formed by the ion implantation of, for example, arsenic by the use of the photoresist masks 211 and the gate electrodes 4 as masks. At this time, it is important to form the photoresist masks 211 such that the first drain region 8 and the second drain region 9 have offsets from the gate electrode 4. Thereby, the distance between each drain and each source can sufficiently be kept. Moreover, because there is no high concentration diffusion layer directly under each gate, the decrease of the breakdown voltage owing to the concentration of the electric field can be prevented.

After that, after the process of FIG. 6F, an integrated circuit equipped with electro-thermal conversion elements is completed similarly to Embodiment 2.

Embodiment 4

FIGS. 8A to 8G are referenced while the manufacturing process of a semiconductor device according to Embodiment 4 of the present invention is described.

The feature of the embodiment is that the drain sides of the gate electrodes 4 are formed on insulator films thicker than the gate insulator films 203.

Figure 8A:
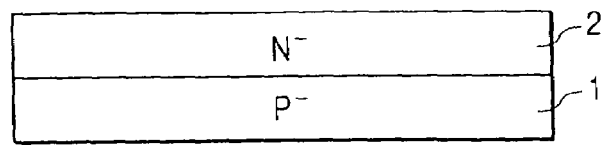
FIGS. 8A, 8B, 8C, 8D, 8E, 8F and 8G are mimetic sectional views for illustrating the manufacturing process of a semiconductor device according to Embodiment 4 of the present invention.
Figure 8B:
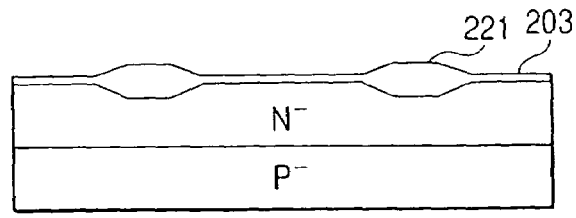
Figure 8C:
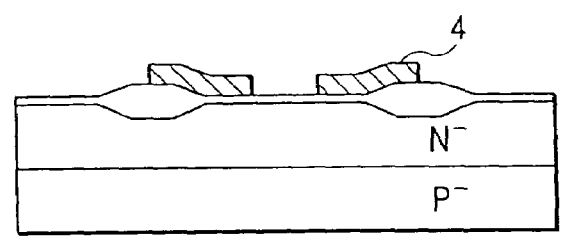
Figure 8D:
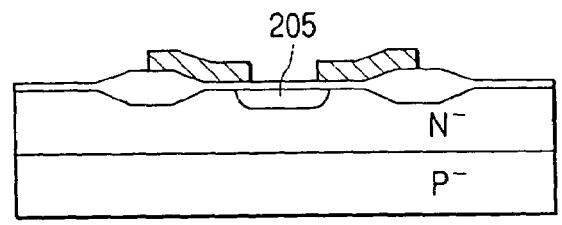
Figure 8E:
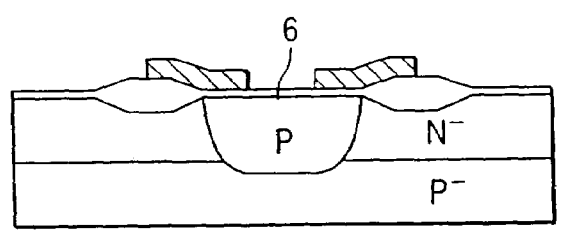
Figure 8F:
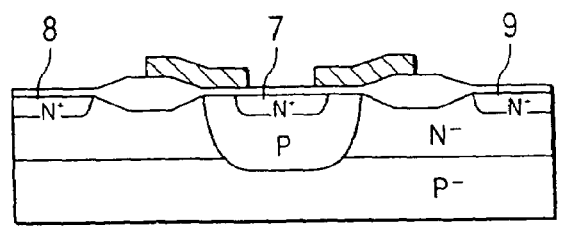

Then, the method for manufacturing the semiconductor device is roughly a method for manufacturing a semiconductor device in which a plurality of electro-thermal conversion elements and a plurality of switching devices for flowing electric currents through the plural electro-thermal conversion elements are integrated on a first conductive type semiconductor substrate, the method comprising the steps of: forming a second conductive type semiconductor layer on a principal surface of the first conductive type semiconductor substrate 1 (FIG. 8A); forming field insulator films 221 on the semiconductor layer selectively (FIG. 8B); forming gate insulator films 203 on the semiconductor layer (FIG. 8B); forming gate electrodes 4 on the gate insulator films 203 and the field insulator films 221 (FIG. 8C); doping a first conductive type impurity by utilizing the gate electrodes 4 as masks (FIG. 8D); forming a semiconductor region by diffusing the first conductive type impurity to be deeper than the second conductive type semiconductor layer (FIG. 8E); and forming a second conductive type source region 7 on a surface side of the semiconductor region by utilizing the gate electrodes 4 as masks and second conductive type drain regions 8 and 9 on a surface side of the second conductive type semiconductor layer by utilizing the field insulator films 221 as masks (FIG. 8F). In the following, the method is described in detail.

At first, as shown in FIG. 8A, an n-type well region 2 is formed on a surface of the p-type semiconductor substrate 1.

Next, a (not shown) pad oxide film is grown to be 10 nm in thickness by, for example, pyrogenic oxidation on the surface of the well region 2. A (not shown) silicon nitride film is deposited on the pad oxide film to be 150 nm in thickness by, for example, LPCVD method. Then, patterning is performed by photolithography to etch the silicon nitride film. After that, field insulator films 221 are selectively grown to be 500 nm in thickness by, for example, the pyrogenic oxidation. After that, the silicon oxide film is completely removed by the use of, for example, phosphoric acid, and the pad oxide film is removed by, for example, the 10 wt% of a hydrogen fluoride solution. Then, the gate insulator films 203 are grown to be 10 nm in thickness on the n-type well region 2 by, for example, the pyrogenic oxidation. At this time, although the aforesaid pad oxide film can be used as the gate insulator films 203 as it is, it is not preferable with respect to its reliability. Thus, as shown in FIG. 8B, the gate insulator films 203 as thin oxide films and the field insulator films (field oxide films) 221 as thick oxide films are disposed at desired positions on the n-type well regions 2.

Next, as shown in FIG. 8C, polycrystalline silicon is deposited on the gate insulator films 203 and the field insulator films 221 to be about 300 nm in thickness by, for example, the LPCVD method. The polycrystalline silicon is made to have a desired wiring resistance value by, for example, the doping of phosphorus at the same time of the deposition by the LPCVD method, or by the doping of, for example, phosphorus by the use of, for example, an ion implantation method or a solid state diffusion method after the deposition. After that, patterning of the polycrystalline silicon film is performed by means of the photolithography such that one end of the film terminates on one of the gate insulator films 203 and the other end thereof terminates on one of the field insulator films 221, and the polycrystalline silicon film is etched. Consequently, the gate electrodes 4 of the MIS type field effect transistor can be formed.

Next, as shown in FIG. 8D, patterning is performed by the photolithography, and the impurity layer 205 is formed by the selective ion implantation of a p-type impurity, for example, boron by using the gate electrodes 4 as masks.

Next, as shown in FIG. 8E, a heat treatment is performed, for example, at 1100° C. for 60 minutes with an electric furnace to form the base region 6 for the traverse electrical separation of the well region 2. In the present embodiment, it is important to design the heat treatment such that the base region 6 becomes deeper than the well region 2 for the complete separation of the well region 2 by the base region 6 in the vertical direction, and it is desirable to design the heat treatment such that the base regions region 6 is situated at a position near to the boundaries between the gate insulator films 203 and the field insulator 221 in the transverse direction.

The reason is that, if the base region 6 is formed only to the half way of the gate insulator films 203, there is the possibility that the electric field to be generated under the gate electrodes 4 concentrates to the thin gate insulator films 203 to destroy the gate insulator films 203. Moreover, if the base region 6 is formed up to the thick field insulator films 221, the base regions 6 under the thick field insulator films 221 are not inverted even if a predetermined voltage is applied to the gate electrodes 4, and the base regions 6 do not perform the switching function of the MIS type electric field transistor. Consequently, even if the switch is turned on, the drivability ability thereof is greatly deteriorated.

Accordingly, the conditions of the aforesaid heat treatment is determined according to the depth of the well region 2, the concentration thereof, the kind of the impurity thereof, the concentration and the kind of the impurity of the impurity layer 205 and the sizes of the masks.

Next, as shown in FIG. 8F, the source region 7, a first drain region 8 and a second drain region 9 are formed by, the ion implantation of, for example, arsenic. At this time, the gate electrodes 4 function as the masks that regulate the end portions of the source electrode 7, and the field insulator films 221 function as the masks that regulate the end portions of the drain regions 8 and 9. Thus, the source region 7 self-adjusts with gate electrodes 4 and the drain regions 8 and 9 self-adjust with the filed insulator films 221.

Figure 8G:
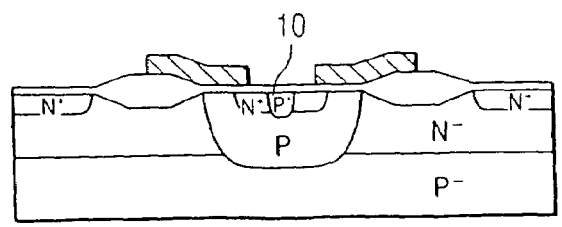

Next, as shown in FIG. 8G, patterning is performed by photolithography to form the diffusion layer 10 for taking out the base electrodes 4 by, for example, ion implantation. Although the diffusion layer 10 for taking out the base electrodes 4 is not always necessary, it is preferable to form the diffusion layer 10 on the designing of the circuit. Moreover, when a p-type MIS type field effect transistor is made at the same time for a signal processing circuit, the formation of the diffusion layer 10 does not increase any process. After that, the heat treatment is performed for, for example, thirty minutes at 950° C., and then the source region 7, the first drain region 8, the second drain region 9 and the diffusion layer 10 for taking out the base electrodes 4 are activated. Thus, the insulators on the drain side under the gate electrodes 4 where the electric field concentrates are formed by the field insulator films 221 being field oxide films, and thereby the breakdown voltage between the gates and the drains of the MIS type field effect transistor can be improved. For example, in the case where a complementary MIS type field effect transistor that requires high speed operation is formed on the same substrate where MIS type field effect transistor that requires a high breakdown voltage is formed at the same time, the insulators can be formed by means of the field insulator films 221 in the process of forming isolation regions of the complementary MIS type field effect transistor. Consequently, the insulators can be formed without any additional process, which is very effective.

After that, although it is not shown, an oxide film is deposited by the CVD method to form an interlayer insulator film. Then, the contact holes for the contacts 11 (see FIG. 1) are opened, and the wiring is formed. As the need arises, multi-layer wiring is performed, and thus an integrated circuit is completed. The electro-thermal conversion elements are made in the wiring forming process by the well known thin film process, and the elements are integrated on the substrate 1. The circuit configuration in this case is the same as that of the embodiments mentioned above.

Embodiment 5

Figure 9:
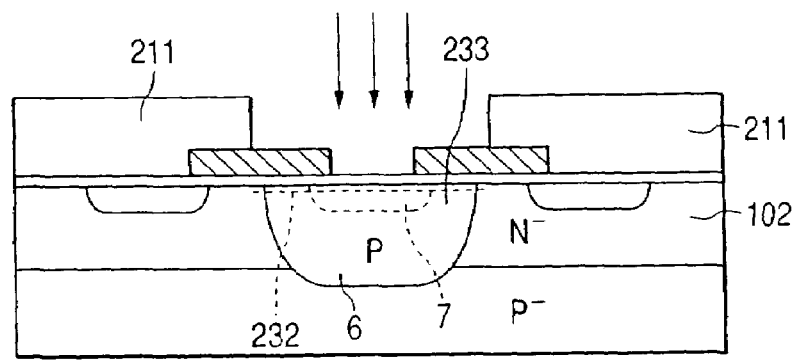
FIG. 9 is a mimetic sectional view for illustrating the manufacturing process of a semiconductor device according to Embodiment 5 of the present invention.

FIG. 9 is a view for illustrating the manufacturing method of a semiconductor device according to Embodiment 5 of the present invention. Hereupon, the manufacturing method is described after the processes of FIGS. 6A to 6D have been performed.

As shown in FIG. 9, the photoresist masks 211 are formed by the patterning with the photolithography, and then a channel dope layer 232 is formed by the ion implantation of, for example, boron at an acceleration energy of 100 keV or more, for example, of 120 keV by the use of the photoresist masks 211 as the masks for the ion implantation. At this time, it is important to form the channel dope layer 232 at least at the source region 7 on the base region 6 (actually the source region 7 is not formed in the present process yet, and the region 7 is formed in the next process or later) and a portion to be a channel 233 between the well regions 2.

Although the photoresist masks 211 are not always necessary, it brings about no problem to perform the ion implantation on the whole surface. However, it is preferable to use the photoresist masks 211 when the concentration of the well regions 2 is very low. Moreover, the formation of the channel dope layer 232 is not necessarily performed at the present process, and the formation may be performed during a period from the formation of the base region 6 to the final activating annealing. Thereby, the channel 233 can be designed in a desired concentration, and the MIS type field effect transistor can be controlled to have a desired threshold value.

After that, by the performance of the similar processes to those after FIG. 6E, an integrated circuit equipped with the electro-thermal conversion elements similarly is completed.

Embodiment 6

Figure 10:
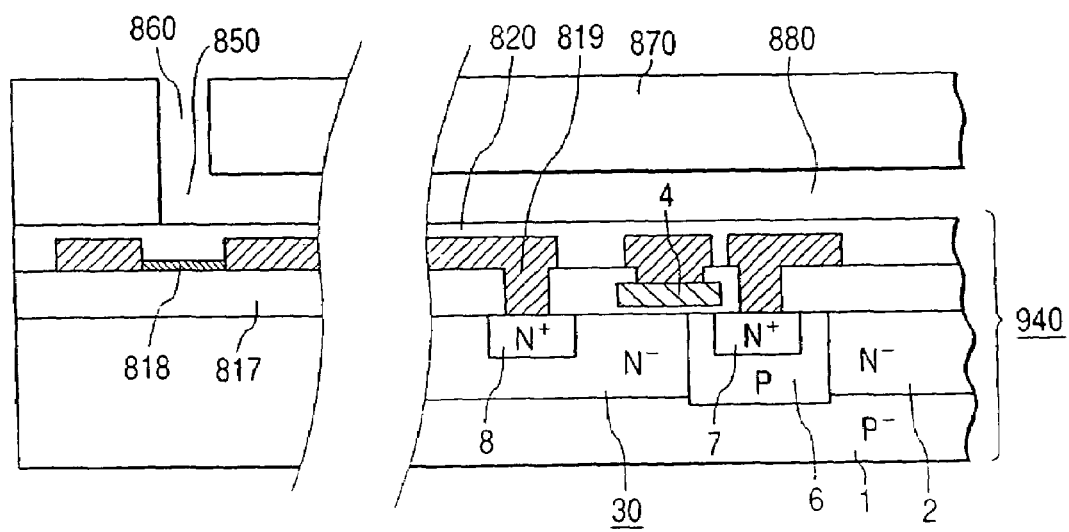
FIG. 10 is a mimetic sectional view showing an example of the structure of a recording head according to the present invention.

FIG. 10 shows an example of the section structure of a part of a recording head in the case where a semiconductor device manufactured by the manufacturing method of each embodiment of the present invention shown in FIGS. 1 to 9 is incorporated in a liquid jet apparatus such as the ink jet recording head. Hereupon, the reference numeral 1 designates the p-type semiconductor substrate made of a single crystal silicon.

The reference numeral 2 designates the n-type well region; the reference numeral 4 designates the gate electrode; the reference numeral 6 designates the p-type base region; the reference numeral 7 designates the n-type source region; and the reference numeral 8 designate the n-type drain region. FIG. 10 mimetically shows that those components constitute a MIS type field effect transistor 30. As described above, it is preferable that no dedicated isolation region is disposed between each transistor (or each segment) and each transistor is arranged in an array.

Moreover, a reference numeral 817 designates an insulator layer such as silicon oxide, or the like, which functions as a thermal storage layer and an insulator layer; a reference numeral 818 designates a heat resistance layer of tantalum nitride, silicon nitride tantalum or the like; a reference numeral 819 designates wiring such as an aluminum alloy; and a reference numeral 820 designates a protective layer such as a silicon nitride or the like. These components constitute a substrate 940 of the recording head. Hereupon, a reference numeral 850 designates a portion being a heating portion, and a reference numeral 860 designates a portion where ink is jetted. Moreover, a top plate 870 forms a liquid path 880 in association with the substrate 940.

The operation of each embodiment of the present invention mentioned above is described.

Figure 11:
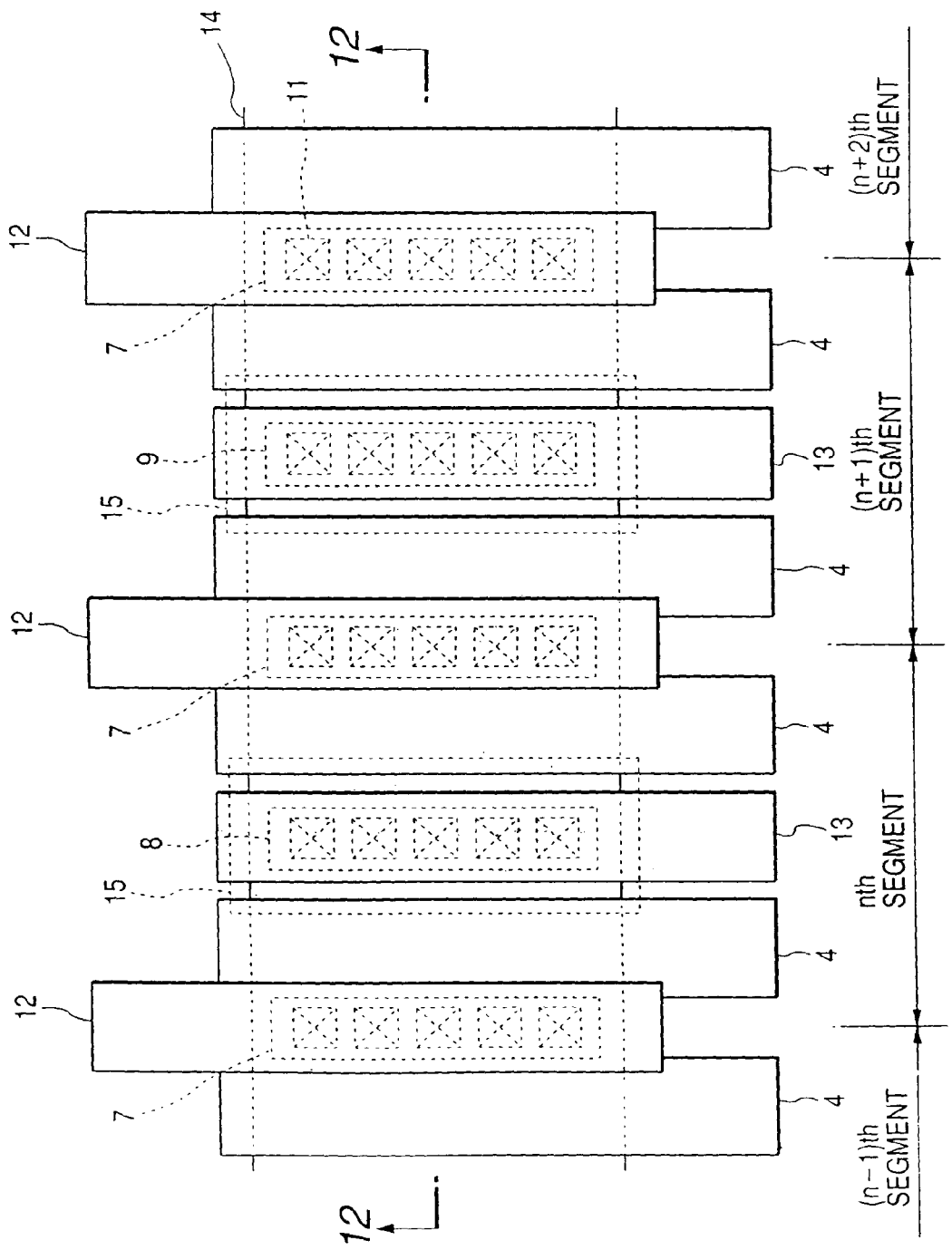
FIG. 11 is a mimetic plan view of a semiconductor device.
Figure 12:
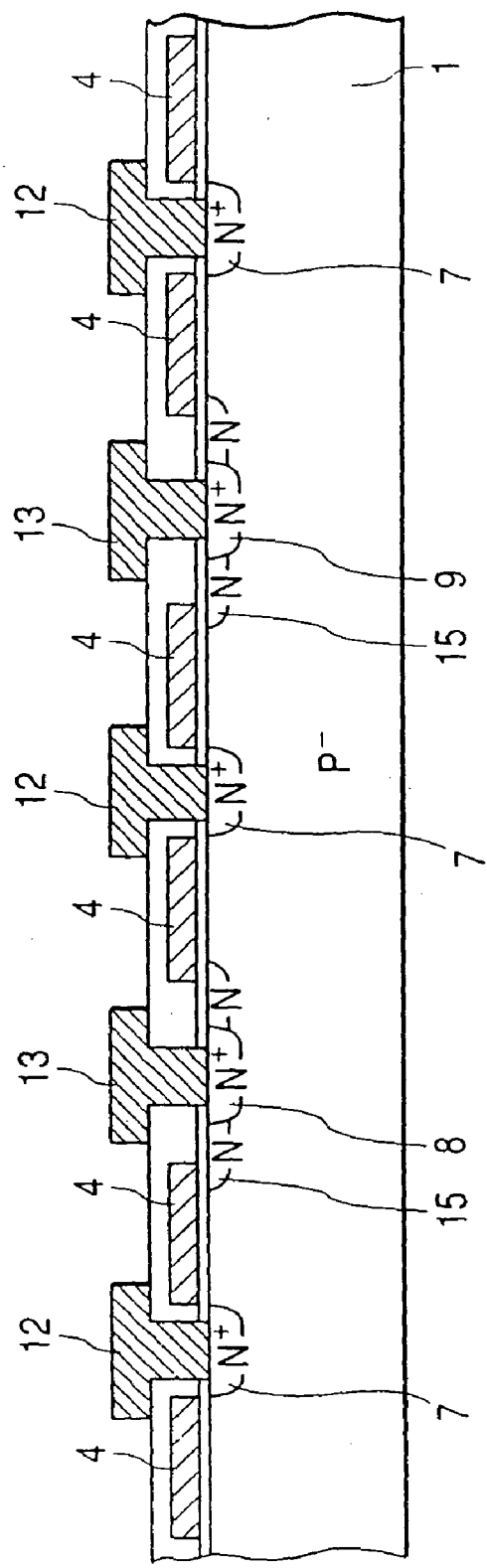
FIG. 12 is a mimetic sectional view of the semiconductor device.

FIG. 11 and FIG. 12 are a plan view and a sectional view, respectively, of a certain MIS type field effect transistor array. The electric separation among electro-thermal conversion elements connected in a matrix can be kept by the sole operation of one of the MIS type field effect transistors formed on the semiconductor substrate 1 or by the concurrent operation of a plurality of them. Hereupon, the reference numeral 4 designates the gate electrode; the reference numeral 7 designates the n-type source region; the reference numeral 8 designates the n-type drain region; the reference numeral 9 designates the other n-type drain region; the reference numeral 11 designates the contact; the reference numeral 12 designates the source electrode; the reference numeral 13 designates the drain electrode; and a reference numeral 15 designates an n-type field relaxation drain region.

However, when the aforesaid conventional MIS type field effect transistor array is driven at the degree of a large electric current necessary for driving the electro-thermal conversion elements, the p-n reverse bias junction portion between the drain and the well (hereupon between the drain and the semiconductor substrate 1) cannot withstand the high electric field to generate a leakage current. Therefore, the conventional MIS type field effect transistor array could not satisfy the breakdown voltage required as the aforesaid electro-thermal conversion element driving semiconductor device. Furthermore, when the on-resistance of the MIS type field effect transistor is large, because the MIS type field effect transistor is used in the state in which the large electric current flows, the electric current is consumed by the on-resistance in vain to disable obtaining necessary current for the operation of the electro-thermal conversion element.

Figure 13:
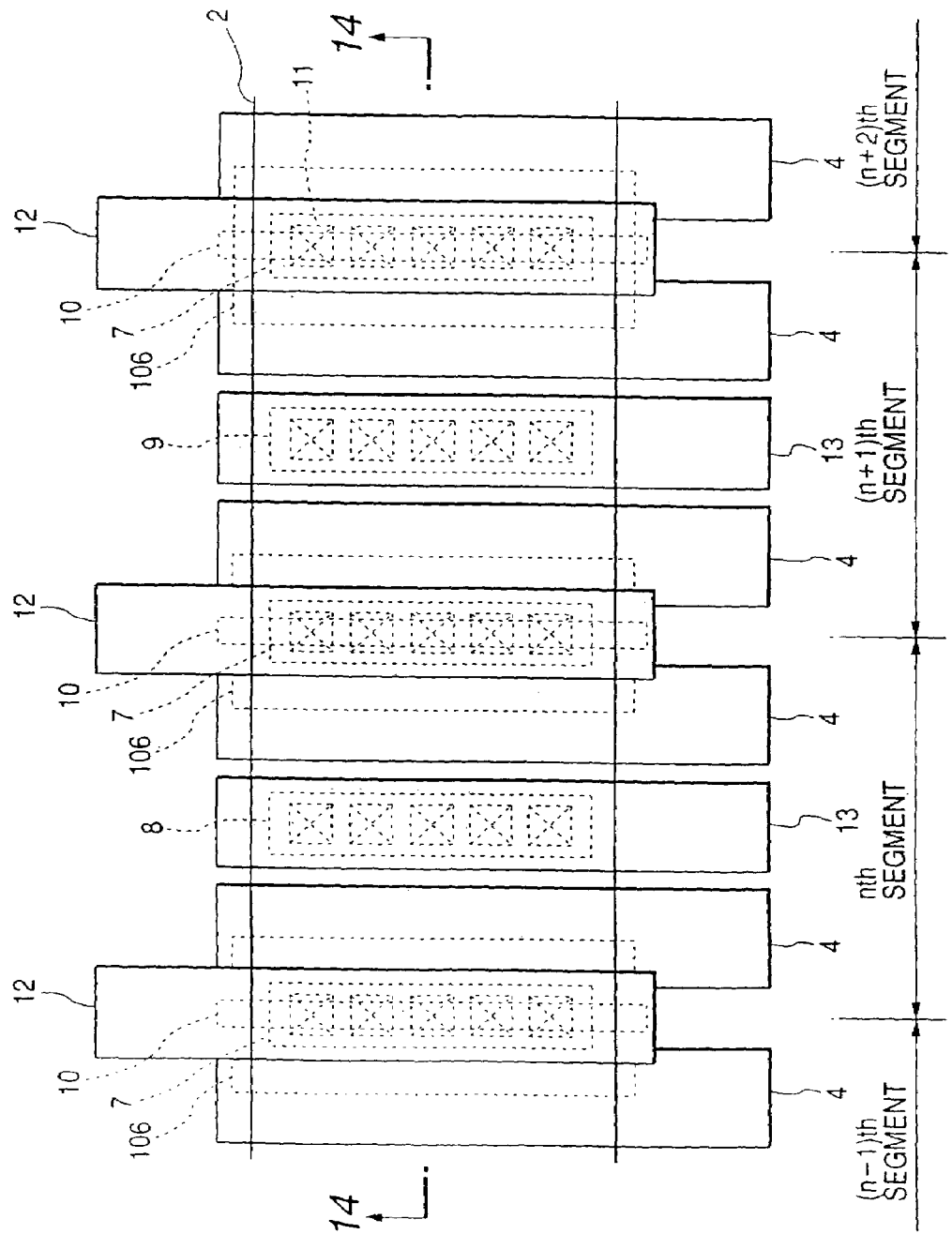
FIG. 13 is a mimetic plan view of a semiconductor device.
Figure 14:
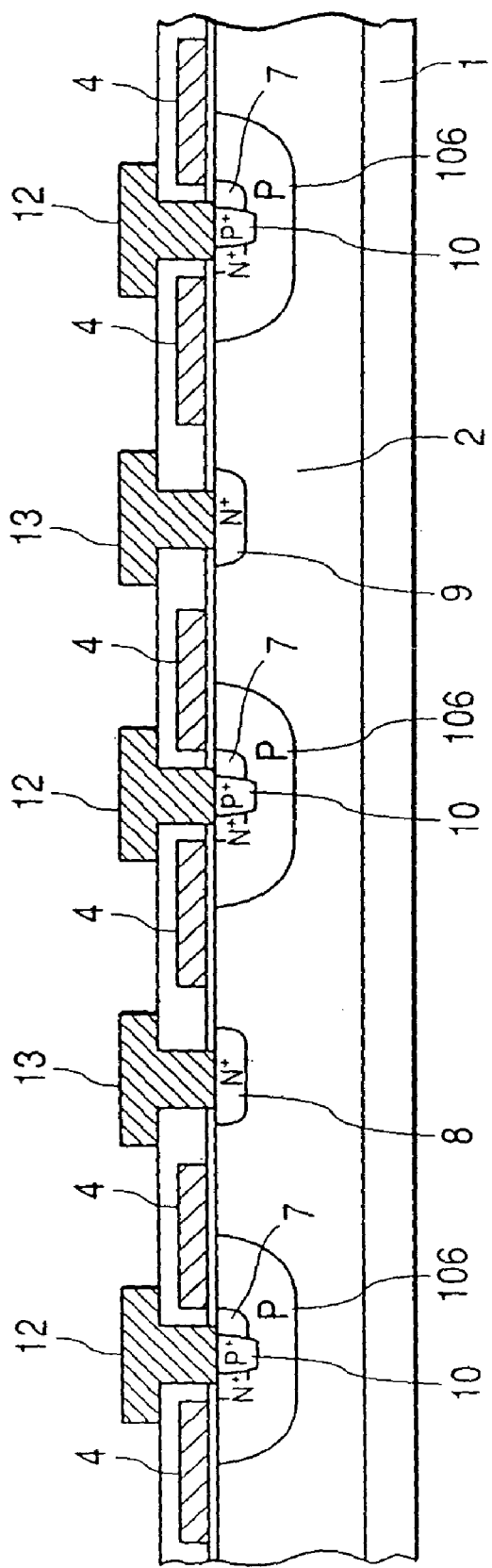
FIG. 14 is a mimetic sectional view of the semiconductor device.

Moreover, for the sake of the improvement of the aforesaid breakdown voltage, an MIS type field effect transistor array shown in the plan view of FIG. 13 and the sectional view in FIG. 14 can be considered. Hereupon, the reference numeral 1 designates the p-type semiconductor substrate. The reference numeral 2 designates the n-type well region; the reference numeral 4 designates the gate electrode; the reference numeral 6 designates the p-type base region; the reference numeral 7 designates the n-type source region; the reference numeral 8 designate the n-type drain region; the reference numeral 9 designates the other n-type drain region; the reference numeral 10 designates the diffusion layer for taking out the base electrode; the reference numeral 11 designates the contact; the reference numeral 12 designates the source electrode; and the reference numeral 13 designates the drain electrode.

The structure of the MIS type field effect transistor is different from the structure of the usual one. In the present structure, a channel is formed in a drain for enabling the drain that determines the breakdown voltage of the transistor to be made deeper and of lower concentration. Consequently, the breakdown voltage thereof can be improved.

However, when the MIS type field effect transistors are arranged in an array, the drain of each transistor is formed with only one common semiconductor layer, and all of the drain potentials take the same common potential. Accordingly, if drains are not separated by the forming of dedicated isolation regions between the switching devices that should severally be switched independently, the electric separation among the electro-thermal conversion elements cannot be ensured. Moreover, when such isolation regions are tried to be newly formed, the manufacturing process of the semiconductor device becomes complicated, and the manufacturing costs are raised. Besides, the area for forming the device also becomes larger. Consequently, the structure of the MIS type field effect transistor shown in FIG. 13 and FIG. 14 is not suitable for the transistor array for a liquid jet apparatus.

On the other hand, according to the semiconductor devices of respective embodiments mentioned above, their drain concentrations can be set to be lower than their channel concentrations, and their drains can be formed to be sufficiently deep. Consequently, the semiconductor devices can have high breakdown voltages and can flow large electric currents. Furthermore, they can operate at high speed owing to their low on-resistances, and then they can realize to be highly integrated and to save energy. Moreover, in a semiconductor device requiring an array-like structure of a plurality of transistors, the semiconductor devices according to the respective embodiments make it easy to isolate respective devices.

Actually, when an MIS type field effect transistor of the structure shown in FIG. 13 and FIG. 14, which has characteristics of a unit device in substantially the same degree as those of the present invention, is actually laid out to have isolation regions for keeping electric separation under the same certain design rule with the same number of masks, the MIS type field effect transistor in conformity of the technology shown in FIG. 13 and FIG. 14 requires the length of 12.0 μm in the arrangement direction of the array for forming one segment thereof. On the contrary, the MIS type field effect transistor of the structure of the present invention shown in FIG. 1 and FIG. 2 can form one segment thereof by occupying the length of 6.0 μm in the arrangement direction of the array, namely, a half length of the segment of FIGS. 13 and 14. There is a tendency such that: the finer the aforesaid design rule becomes, the larger the ratio of the lengths becomes.

Embodiment 7

A semiconductor device according to Embodiment 7 of the present invention is a semiconductor device comprising a transistor array composed of a plurality of insulated gate type field effect transistors, wherein each of the transistors includes: a second conductive type first semiconductor region formed on a principal surface of a first conductive type semiconductor substrate 1; a first conductive type second semiconductor region formed to separate the first semiconductor region; a first conductive type third semiconductor region that is formed to be contained in the second semiconductor region and has an impurity atom concentration higher than that of the second semiconductor region; a second conductive type source region 7 formed on a surface of the third semiconductor region; and a second conductive type drain region 8 formed on a surface of the first semiconductor region.

In the aforesaid semiconductor device and a manufacturing method of the same, the drain concentration thereof can be set to be lower than the channel concentration thereof, and the drain can be formed to be sufficiently deep. Consequently, the semiconductor device has a high breakdown voltage, which enables a large current flow. Moreover, the semiconductor device has a low on-resistance, which enables the high speed operation thereof. Furthermore, the high integration thereof and the low consumption energy thereof can be realized. Moreover, by the formation of a low concentration p-type well region around the source region 7, isolation between devices is ensured even in a semiconductor device requiring an array structure composed of a plurality of transistors.

Figure 15:
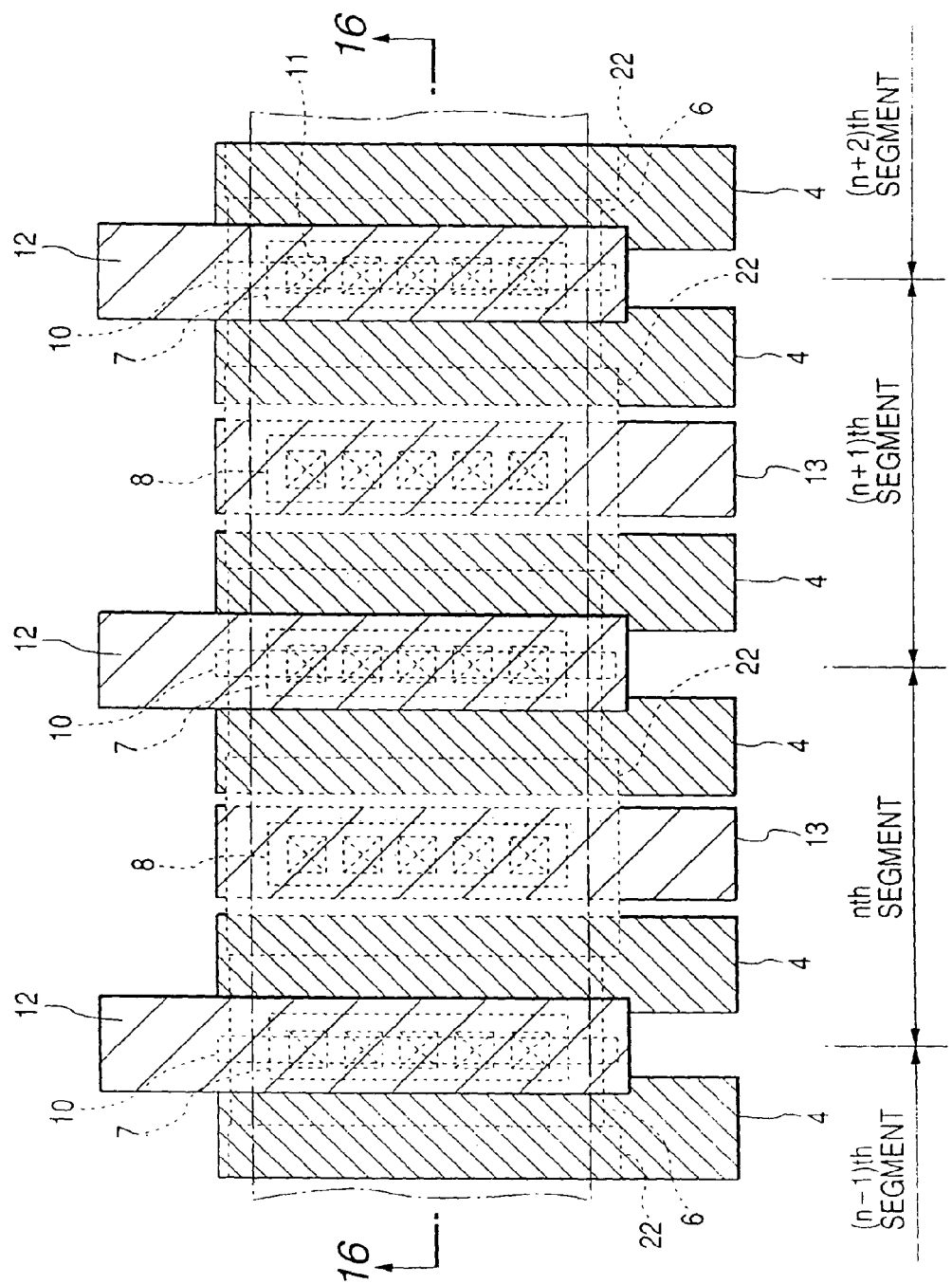
FIG. 15 is a mimetic plan view showing a semiconductor device according to Embodiment 7 of the present invention.
Figure 16:
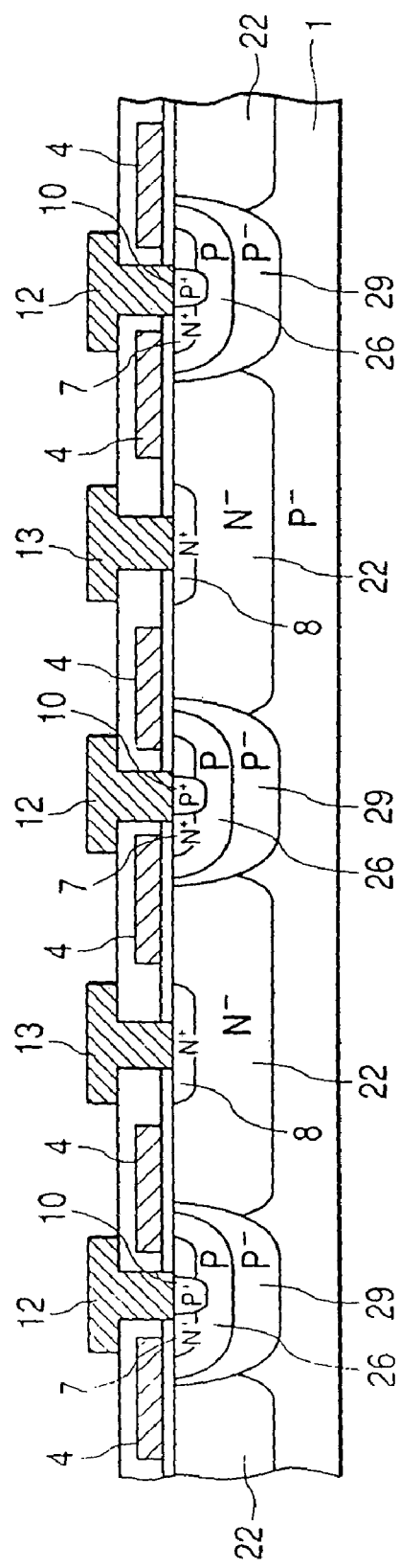
FIG. 16 is a sectional view taken along a line 16—16 in FIG. 15.

FIG. 15 is a mimetic plan view showing a semiconductor device according to Embodiment 7 of the present invention, and FIG. 16 is a sectional view taken along a line 16—16 in FIG. 15.

In FIG. 15 and FIG. 16, a reference numeral 1 designates the p-type semiconductor substrate; a reference numeral 22 designates an n-type well region (the first semiconductor region); a reference numeral 29 designates a p-type well region (the second semiconductor region); the reference numeral 4 designates the gate electrode; a reference numeral 26 designates a p-type base region (a third semiconductor region); the reference numeral 7 designates the n-type source region; the reference numeral 8 designates the n-type drain region; the reference numeral 10 designates the diffusion layer for taking out a base electrode; the reference numeral 11 designates a contact; the reference numeral 12 designates the source electrode; and the reference numeral 13 designates the drain electrode.

Figure 17:
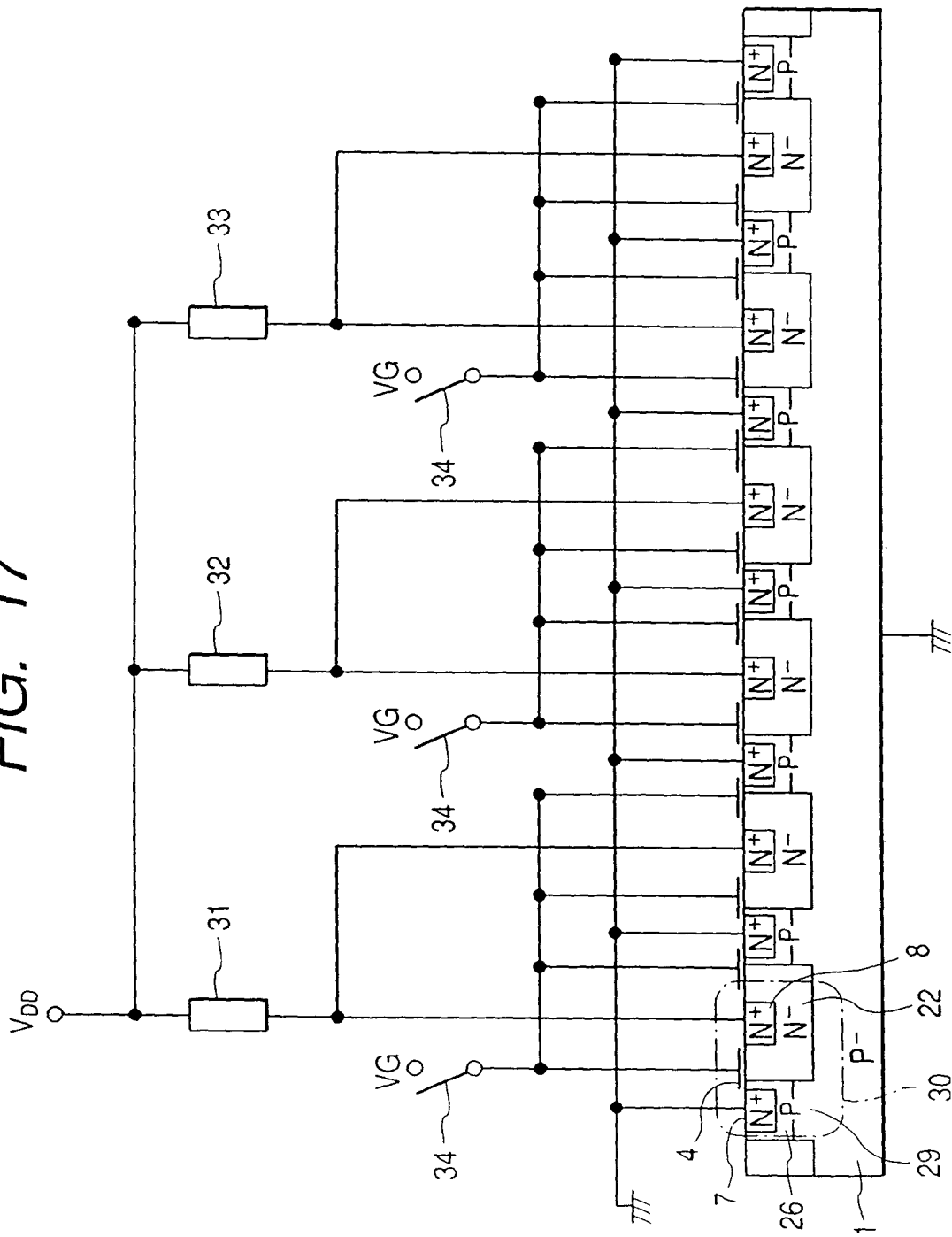
FIG. 17 is a mimetic view for illustrating the semiconductor device of the present invention.

Moreover, FIG. 17 is a view showing a wire connection example in the case where semiconductor devices of the present invention are arranged in an array to be used as an electro-thermal conversion element driving semiconductor device for a liquid jet head of liquid jet apparatus.

In FIG. 17, the reference numeral 1 designates the p-type semiconductor substrate; the reference numeral 22 designates the n-type well region; the reference numeral 29 designates the p-type well region; the reference numeral 4 designates the gate electrode; the reference numeral 26 designates the p-type base region; the reference numeral 7 designates the n-type source region; and the reference numeral 8 designates the n-type drain region. The circuit structure of FIG. 17 is the same as that of FIG. 4.

In the present embodiment, the low concentration p-type well region 29 is deeply formed to separate the low concentration n-type well region 22, which has been formed sufficiently deeply in advance, in the traverse directions. The base region 26 is formed in the low concentration p-type well region 29. The p-type well region 29 and the base region 26 respectively perform the roles of the drain and the channel of an MIS type field effect transistor. Then, it is possible to set the drain concentration lower than the channel concentration. The breakdown voltage of a transistor is determined by the breakdown voltage of the drain. The breakdown voltage of a transistor usually becomes higher, as the drain concentration is lower and the drain depth is deeper. Consequently, the rated voltage of the transistor can be set higher, and the largeness of the electric current flowing the transistor can be enlarged, and further the high speed operation thereof can be realized.

Moreover, because the transistor has a structure forming the p-type well region 29 to separate the n-type well region 22, the drain of each segment can severally be separated electrically in a good separation state.

Embodiment 8

The basic structure of a semiconductor device for a liquid jet apparatus according to Embodiment 8 of the present invention is the same as that of the aforesaid Embodiment 7. Different points between them are the position of the drain region 8 and the forming process of the same.

Figure 18A:
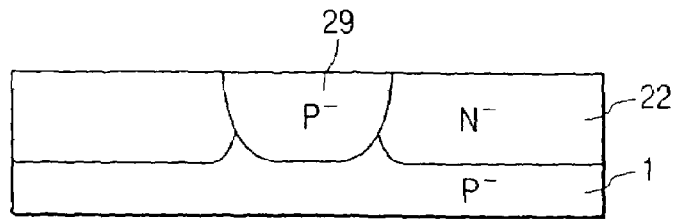
FIGS. 18A, 18B, 18C, 18D, 18E and 18F are mimetic sectional views for illustrating a manufacturing process of a semiconductor device according to Embodiment 8 of the present invention.
Figure 18B:
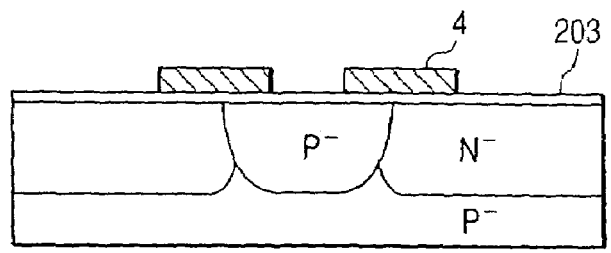
Figure 18C:
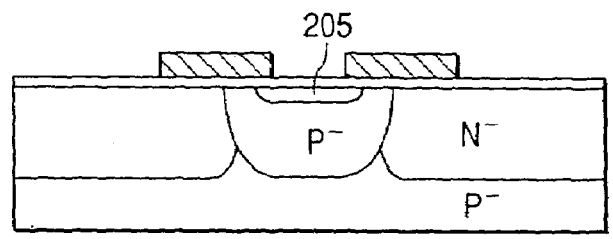
Figure 18D:
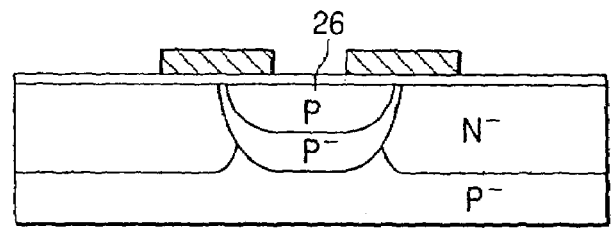
Figure 18E:
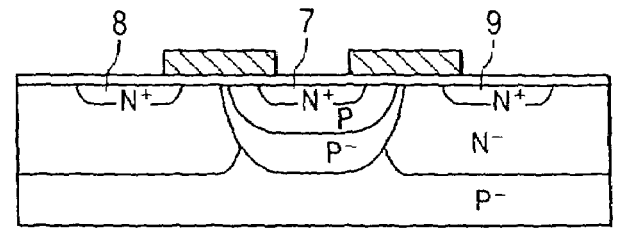

FIGS. 18A to 18F are referenced while a manufacturing process of the semiconductor device according to the present embodiment is described. The method for manufacturing the semiconductor device is roughly a method for manufacturing a semiconductor device in which a plurality of electro-thermal conversion elements and a plurality of switching devices for flowing electric currents through the plural electro-thermal conversion elements are integrated on a first conductive type semiconductor substrate, the method comprising the steps of: forming a second conductive type semiconductor layer on a principal surface of the first conductive type semiconductor substrate 1 (FIG. 18A); forming a gate insulator film 203 on the semiconductor layer (FIG. 18B); forming gate electrodes 4 on the gate insulator film 203 (FIG. 18B); doping a first conductive type impurity by utilizing the gate electrodes 4 as masks (FIG. 18C); forming a semiconductor region by diffusing the first conductive type impurity (FIG. 18D); and forming a second conductive type source region 7 on a surface side of the semiconductor region by utilizing the gate electrodes 4 as masks and second conductive type drain regions 8 and 9 on a surface side of the second conductive type semiconductor layer (FIG. 18E).

In the following, the method is described in detail.

At first, as shown in FIG. 18A, the n-type well region 22 is formed on the surface of the p-type semiconductor substrate 1. Then, as the need arises, the p-type well region 29 is formed to separate the n-type well region 22 in the transverse direction.

Next, as shown in FIG. 18B, the gate insulator film (gate oxide film) 203 is grown on the n-type well region 22 and the p-type well region 29 to be 50 nm in the thickness of the film 203 by, for example, a pyrogenic oxidation, and polycrystalline silicon is deposited on the gate insulator film 203 to be about 300 nm in the thickness of the film by, for example, the LPCVD method. The polycrystalline silicon is made to have a desired wiring resistance value by, for example, the doping of phosphorus at the same time of the deposition by the LPCVD method, or by the doping of, for example, phosphorus by the use of, for example, the ion implantation method or the solid state diffusion method after the deposition. After that, the patterning of photoresist is performed by means of the photolithography method, and the polycrystalline silicon film is etched by the use of the photoresist patterns as masks. Consequently, the gate electrodes 4 of the MIS type field effect transistor can be formed.

Next, a photoresist (not shown) is coated, and the patterning of the photoresist is performed by the photolithography to remove the photoresist only in the region for the formation of the base region 26 (or the impurity layer 205). Then, as shown in FIG. 18C, the selective ion implantation of a p-type impurity, for example, boron is performed to form the impurity layer 205 by the use of the photoresist (not shown) and the gate electrodes 4 as masks.

Next, as shown in FIG. 18D, a heat treatment is performed at, for example, 1100° C. for 60 minutes in an electric furnace to form the base region 26. It is important to design the base region 26 to form a desired effective channel length in order not to raise the on-resistance of the base region 26 by the heat treatment, and the conditions of the heat treatment are determined according to the depth of the p-type well region 29, the concentration thereof, the kind of the impurity, and the concentration and the kind of the impurity of the impurity layer 205.

Next, as shown in FIG. 18E, the source region 7, the first drain region 8 and the second drain region 9 are formed by the ion implantation of, for example, arsenic by the use of gate electrodes 4 as masks.

Figure 18F:
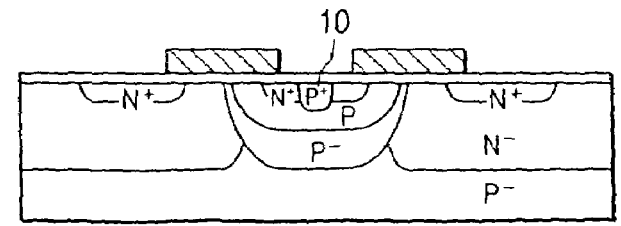

Next, a not shown photoresist is coated thereon, and the patterning thereof is performed by photolithography. Then, as shown in FIG. 18F, the diffusion layer 10 for taking out a base electrode is formed by, for example, ion implantation. Although the diffusion layer 10 for taking out the base electrode is not always necessary, it is preferable to form the diffusion layer 10 on the designing of the circuit. Moreover, when a p-type MIS type field effect transistor is made at the same time as a signal processing circuit, there is no necessity to increase any process. After that, the heat treatment is performed for, for example, thirty minutes at 950° C., and then the source region 7, the first drain region 8, the second drain region 9 and the diffusion layer 10 for taking out the base electrode are activated.

After that, although it is not shown, an oxide film is deposited by the CVD method to form the interlayer insulator film. Then, the contacts are opened, and the wiring is formed. Then, the multi-layer wiring is performed as the need arises, and thus the integrated circuit is completed. The electro-thermal conversion elements are made in the wiring forming process by the well known thin film process, and the elements are integrated on the substrate 1. The circuit configuration in this case is the same as that of each embodiment mentioned above.

Embodiment 9

Figure 19:
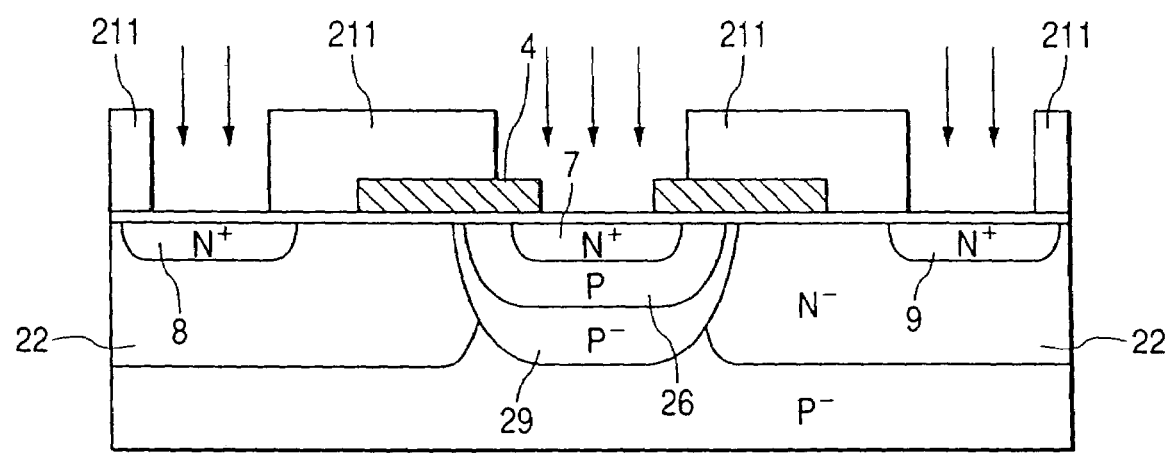
FIG. 19 is a mimetic sectional view for illustrating a manufacturing process of a semiconductor device according to Embodiment 9 of the present invention.

FIG. 19 is a sectional view for illustrating a manufacturing process of a semiconductor device according to another embodiment of the present invention. In FIG. 19, the reference numeral 29 designates the p-type well region; the reference numeral 4 designates the gate electrode; the reference numeral 26 designates the p-type base region; the reference numeral 7 designates the n-type source region; the reference numeral 8 designates the n-type first drain region; the reference numeral 9 designates the n-type second drain region; and the reference numeral 211 designates the photoresist mask.

The present embodiment aims to improve the breakdown voltage between a drain and a source. After the processes of FIGS. 18A to 18D have been performed, as shown in FIG. 19, the photoresist masks 211 are formed by the patterning with the photolithography, and then the source region 7, the first drain region 8 and the second drain region 9 are formed by the ion implantation of, for example, arsenic by the use of the photoresist masks 211 and the gate electrodes 4 as masks. At this time, it is important to form the photoresist masks 211 such that the first drain region 8 and the second drain region 9 have offsets from the gate electrodes 4. Thereby, the distance between each drain and each source can sufficiently be kept. Moreover, because there is no high concentration diffusion layer directly under each gate, the decrease of the breakdown voltage owing to the concentration of the electric field can be prevented.

After that, after the processes similar to those after FIG. 18F have been performed, an integrated circuit equipped with electro-thermal conversion elements is similarly completed.

Embodiment 10

FIGS. 20A to 20G are sectional views for illustrating the manufacturing process of a semiconductor device according to Embodiment 10 of the present invention.

Figure 20A:
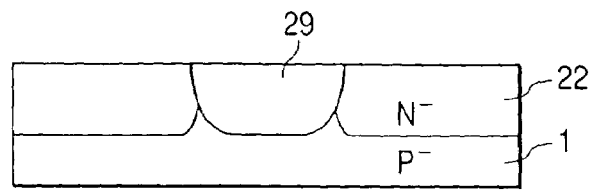
FIGS. 20A, 20B, 20C, 20D, 20E, 20F and 20G are mimetic sectional view for illustrating the manufacturing process of a semiconductor device according to Embodiment 10 of the present invention.
Figure 20B:
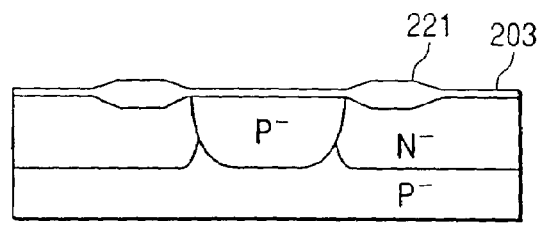
Figure 20C:
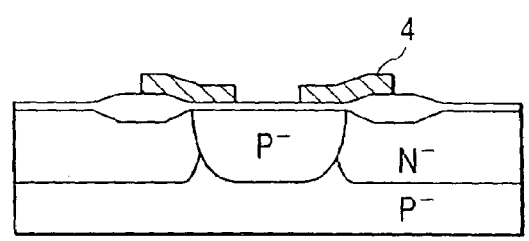
Figure 20D:
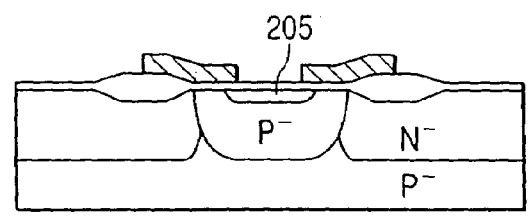
Figure 20E:
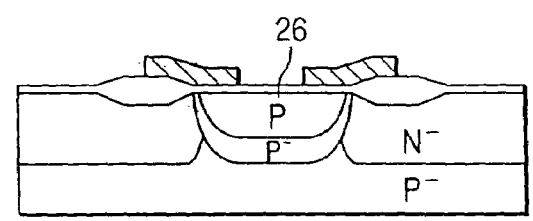
Figure 20F:
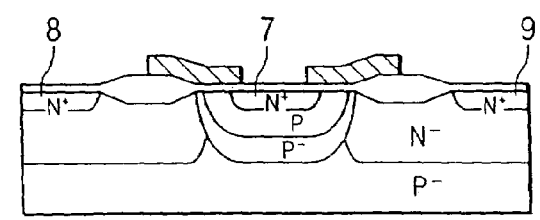

The method for manufacturing the semiconductor device according to the present embodiment roughly is a method for manufacturing a semiconductor device in which a plurality of electro-thermal conversion elements and a plurality of switching devices for flowing electric currents through the plural electro-thermal conversion elements are integrated on a first conductive type semiconductor substrate, the method comprising the steps of: forming a second conductive type semiconductor layer on a principal surface of the first conductive type semiconductor substrate 1 (FIG. 20A); forming field insulator films 221 on the semiconductor layer selectively (FIG. 20B); forming gate insulator films 203 on the semiconductor layer (FIG. 20B); forming gate electrodes 4 on the gate insulator films 203 and the field insulator films 221 (FIG. 20C); doping a first conductive type impurity by utilizing the gate electrodes 4 as masks (FIG. 20D); forming a semiconductor region by diffusing the first conductive type impurity (FIG. 20E); and forming a second conductive type source region 7 on a surface side of the semiconductor region by utilizing the gate electrodes 4 as masks and second conductive type drain regions 8 and 9 on a surface side of the second conductive type semiconductor layer by utilizing the field insulator films 221 as masks (FIG. 20F). In the following, the method is described in detail.

At first, as shown in FIG. 20A, the n-type well region 22 is formed on a surface of the p-type semiconductor substrate 1. Then, as the need arises, the p-type well region 29 is formed to separate the n-type well region 22.

Next, as shown in FIG. 20B, a (not shown) pad oxide film is grown to be 10 nm in thickness by, for example, pyrogenic oxidation on the surfaces of the n-type well region 22 and the p-type well region 29. A (not shown) silicon nitride film is deposited on the pad oxide film to be 150 nm in thickness by, for example, LPCVD method. Then, the patterning of the silicon nitride film is performed by photolithography to etch the silicon nitride film. After that, the field insulator films 221 are selectively grown to be 500 nm in thickness by, for example, the pyrogenic oxidation. After that, the silicon oxide film is completely removed by the use of, for example, phosphoric acid, and the pad oxide film is removed by, for example, the 10 wt % of a hydrogen fluoride solution. Then, the gate insulator films 203 are grown to be 10 nm in thickness on the n-type well region 22 by, for example, the pyrogenic oxidation. At this time, although the aforesaid pad oxide film can be used as the gate insulator films 203 as it is, it is not preferable with respect to its reliability. Thus, as shown in FIG. 20B, the gate insulator films 203 as the thin oxide films and the field insulator films 221 as the thick oxide films are disposed at desired positions on the n-type well regions 22.

Next, as shown in FIG. 20C, polycrystalline silicon is deposited on the gate insulator films 203 and the field insulator films 221 to be about 300 nm in thickness by, for example, the LPCVD method. The polycrystalline silicon is made to have a desired wiring resistance value by, for example, the doping of phosphorus at the same time of the deposition by the LPCVD method, or by the doping of, for example, phosphorus by the use of, for example, an ion implantation method or a solid state diffusion method after the deposition. After that, as shown in the figure, patterning of the polycrystalline silicon film is performed by means of the photolithography such that one end of the film terminates on one of the gate insulator films 203 and the other end thereof terminates on one of the field insulator films 221, and the polycrystalline silicon film is etched. Consequently, the gate electrodes 4 of the MIS type field effect transistor can be formed.

Next, a photoresist (not shown) is coated. Then, the patterning thereof is performed by the photolithography to remove only the resist in the region to be formed as the base region 26 (or the impurity layer 205). Then, as shown in FIG. 20D, the impurity layer 205 is formed by the selective ion implantation of a p-type impurity, for example, boron by using the photoresist (not shown) and the gate electrodes 4 as masks.

Next, as shown in FIG. 20E, a heat treatment is performed, for example, at 1100° C. for 60 minutes in an electric furnace to form the base region 26 determining the effective channel length of the MIS type field effect transistor. It is important to design the heat treatment such that the base region 26 determines a desired effective channel length to prevent the rise of the on-resistance thereof. Moreover, as for the traverse direction, it is desirable to design the heat treatment such that the base region 26 is situated at a position near to the boundaries between the gate insulator films 203 and the field insulator films 221. The reason is that, if the base region 26 is formed only to the half way of the gate insulator films 203, there is the possibility that the electric field to be generated under the gate electrodes 4 concentrates to the thin gate insulator films 203 to destroy the gate insulator films 203. Moreover, if the base region 26 is formed up to the thick field insulator films 221, the base regions 26 under the thick field insulator films 221 are not inverted even if a predetermined voltage is applied to the gate electrodes 4, and the base regions 26 do not perform the switching function of the MIS type electric field transistor. Consequently, even if the switch is turned on, the drivability ability thereof is greatly deteriorated. Accordingly, the conditions of the aforesaid heat treatment is suitably determined according to the depth of the p-type well region 29, the concentration thereof, the kind of the impurity thereof, the concentration and the kind of the impurity of the impurity layer 205 and the sizes of the masks.

Next, as shown in FIG. 20F, the source region 7 is formed by the ion implantation of, for example, arsenic by using the gate electrodes 4 as masks, and the first drain region 8 and the second drain region 9 are formed by the same ion implantation by using the field insulator films 221 as masks.

Figure 20G:
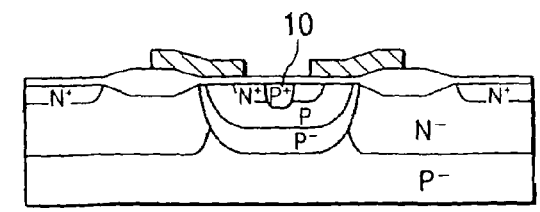

Next, a photoresist (not shown) is coated, and the patterning thereof is performed by the photolithography. Then, the resist in the region to be formed as the diffusion layer 10 for taking out the base electrodes 4 is removed. After that, as shown in FIG. 20G, the diffusion layer 10 for taking out the base electrodes 4 is formed by, for example, the ion implantation method. Although the diffusion layer 10 for taking out the base electrodes 4 is not always necessary, it is preferable to form the diffusion layer 10 on the designing of the circuit. Moreover, when a p-type MIS type field effect transistor is made at the same time for a signal processing circuit, there is no necessity for increasing the number of processes. After that, the heat treatment is performed for, for example, thirty minutes at 950° C., and then the source region 7, the first drain region 8, the second drain region 9 and the diffusion layer 10 for taking out the base electrodes 4 are activated. Thus, the insulators on the drain side under the gate electrodes 4, where the electric field concentrates, are formed by the field insulator films 221, and thereby the breakdown voltage between the gates and the drains of the MIS type field effect transistor can be improved. For example, in the case where a complementary MIS type field effect transistor that requires high speed operation is formed on the same substrate where MIS type field effect transistor that requires a high breakdown voltage is formed at the same time, the insulators can be formed without any additional process. Consequently, the formation of the field insulator films 221 is very effective.

After that, although it is not shown, an oxide film is deposited by the CVD method to form the interlayer insulator film. Then, the contacts are opened, and the wiring is formed. As the need arises, the multi-layer wiring is performed, and thus an integrated circuit is completed. The electro-thermal conversion elements are made in the wiring forming process by the well known thin film process, and the elements are integrated on the substrate 1. The circuit configuration in this case is the same as that of the embodiments mentioned above.

Embodiment 11

Figure 21:
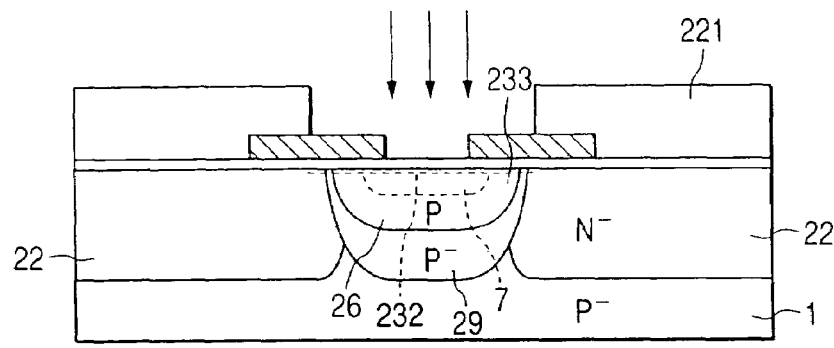
FIG. 21 is a mimetic sectional view for illustrating the manufacturing process of a semiconductor device according to Embodiment 11 of the present invention.

FIG. 21 is a sectional view for illustrating another manufacturing method according to an embodiment of the present invention. In FIG. 21, the reference numeral 22 designates the n-type well region; the reference numeral 26 designates the p-type base region; the reference numeral 7 designates the n-type source region; the reference numeral 221 designates a photoresist mask; the reference numeral 232 designates the channel dope layer; and the reference numeral 233 designates the channel.

The present embodiment aims to control the threshold level of an MIS type field effect transistor at a desired threshold level. After the performance of the processes of FIGS. 18A to 18D, as shown in FIG. 21, the photoresist masks 211 are formed by the patterning with the photolithography, and then the channel dope layer 232 is formed by the ion implantation of, for example, boron at an acceleration energy of 100 keV or more, for example, of 120 keV by the use of the photoresist masks 211 as the masks for the ion implantation. At this time, it is important to form the channel dope layer 232 at least in the source region 7 in the base region 26 (actually the source region 7 is not formed in the present process yet, and the source region 7 is formed in the next process or later) and a portion to be a channel 233 between the n-type well regions 22. Although the photoresist masks 211 are not always necessary, it brings about no problem to perform the ion implantation on the whole surface. However, it is preferable to use the photoresist masks 211 when the concentrations of the n-type well regions 22 are very low. Moreover, the formation of the channel dope layer 232 is not necessarily performed in the present process, and the formation may be performed during a period from the formation of the base region 26 to the final activating annealing. Thereby, the channel 233 can be designed in a desired concentration, and the MIS type field effect transistor can be controlled to have a desired threshold value.

After that, by the performance of the similar processes to those after FIG. 18E, an integrated circuit equipped with the electro-thermal conversion elements similarly is completed.

Embodiment 12

Figure 22:
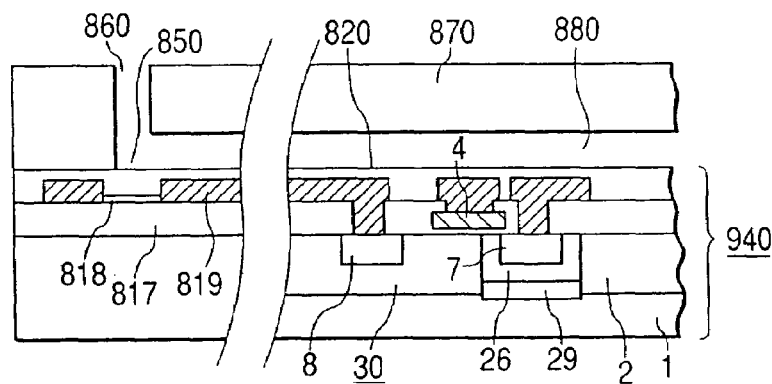
FIG. 22 is a mimetic sectional view showing a part of a liquid jet head according to the present invention.

FIG. 22 is a mimetic sectional view showing a part of a recording head used as an electro-thermal conversion element driving semiconductor device according to respective Embodiments 7 to 11 of the present invention mentioned above. In FIG. 22, the reference numeral 1 designates the p-type semiconductor substrate made of a single crystal silicon. The reference numeral 29 designates the p-type well region; the reference numeral 22 designates the n-type well region; the reference numeral 8 designates the n-type drain region; the reference numeral 26 designates the p-type base region; the reference numeral 7 designates the n-type source region; and the reference numeral 4 designates the gate electrode. These components constitute a electro-thermal conversion element driving semiconductor device 930 using the MIS type field effect transistor. The reference numeral 817 designates an insulator layer such as silicon oxide, or the like, which functions as a thermal storage layer; the reference numeral 818 designates the heat resistance layer; the reference numeral 819 designates the wiring; and the reference numeral 820 designates the protective layer. These components constitute the substrate 940 of the recording head. Hereupon, the reference numeral 850 designates the portion being the heating portion, and ink is jetted from the portion 860 being an exhaust port. Moreover, the top plate 870 forms the liquid path 880 in association with the substrate 940.

As described above, according to Embodiments 7 to 12 of the present invention, their drain concentrations can be set to be lower than their channel concentrations, and their drains can be formed to be deeper. Consequently, the semiconductor devices can have high breakdown voltages and can flow large electric currents. Furthermore, they can operate at high speed owing to their low on-resistances, and then they can realize high integration and energy conservation. Moreover, in a semiconductor device requiring an array-like structure of a plurality of transistors, the semiconductor devices according to the respective embodiments make it easily possible to isolate respective devices without any rise of costs.

Incidentally, in Embodiments 7 to 12, as a measure against the case where the n-type well region 22 is formed deeply, the p-type well region 29 is formed by introducing an impurity and after that the base region 26 is formed in another process. When the deeper n-type well region 22 is not necessary, by the separate formation of the n-type well region 22 in the traverse direction at every drain, the base region 26 adjoins to the p-type substrate 1 at the upper part of the substrate 1 remaining between two adjoining n-type wells even if the base region 26 is not formed to be deeper than the n-type well region 22. Consequently, the base region 26 and the substrate 1 can be made to be at the same electric potential.

The manufacturing methods of a semiconductor device according to each embodiment described in the following is roughly characterized by the steps of: forming a second conductive type semiconductor layer on a principal surface of a first conductive type semiconductor substrate; forming a gate insulator film on the semiconductor layer; forming gate electrodes on the gate insulator film; doping a first conductive type impurity by utilizing the gate electrodes as masks; forming a semiconductor region by diffusing the first conductive type impurity; and forming a second conductive type source region on a surface side of the semiconductor region by utilizing the gate electrodes as masks and second conductive type drain regions on, a surface side of the second conductive type semiconductor layer. The methods are also characterized in that a transistor structure symmetrical with respect to the source region can be obtained. In the following, the methods are described in detail.

Embodiment 13

The method for manufacturing a semiconductor device according to Embodiment 13 of the present invention is a method for manufacturing a semiconductor device in which a plurality of insulated gate type field effect transistors are arranged in an array, the method comprising the steps of: forming a second conductive type well region on a principal surface of a first conductive type semiconductor substrate; forming a gate insulator film on the well region; forming a plurality of gate electrodes on the gate insulator film; forming a first conductive type semiconductor region by diffusing a first conductive type impurity after performing the ion implantation of the impurity between adjoining two gate electrodes on the source region forming side by using the two gate electrodes as masks in such a way that the ion implantation is performed with a fixed angle to a normal line direction of the semiconductor substrate while the semiconductor substrate is rotated; and forming a second conductive type source region in the semiconductor region by utilizing the two gate electrode as masks and a second conductive type drain region severally in two of the well regions disposed to put the semiconductor region between them by performing the ion implantation of the impurity with the fixed angle to the normal line direction of the semiconductor substrate while the semiconductor substrate is rotated.

There are many cases where various kinds of devices are made by using a semiconductor wafer in which an orientation flat (OF) is formed in a surface direction of 90° or 45° to the principal crystal orientation of the semiconductor wafer, and by disposing the coordinate axes of the semiconductor device to be perpendicular or horizontal to the OF. When ion implantation is performed from the perpendicular direction to the plane direction of a semiconductor substrate (e.g. (100) plane) if a device is formed by means of the ion implantation method for forming the device in such an arrangement, channeling is generated.

When a crystal, for example a single crystal silicon, is viewed from a direction perpendicular to a crystal face having a small index number such as a (100) plane, a (110) plane, a (111) plane, or the like, the area occupied by atom trains in a crystal face is several percents and almost all of the crystal face is occupied by space. That is, when ions are irradiated on the crystal face at an angle same as that of the crystal axis, a phenomenon such that most ions reach the inside of the crystal without any large collision with atoms occurs.

When such a channeling phenomenon occurs, a silicon substrate has a profile largely different from an injected impurity distribution in the substrate that has been calculated on the supposition that the silicon substrate is amorphous. Consequently, electric characteristics of the device differ from the designed ones largely.

Accordingly, usually the channeling prevention technique is used that at the time of ion implantation the ion implantation is performed at an injection angle larger than a critical angle computed by the use of the values concerning the crystal axes of a substrate, an impurity kind to be injected, injection energy, and the like as parameters.

In case of an MIS type field effect transistor array having one common drain per one segment as shown in FIG. 1, because the drain of each transistor is common and the plane direction of the principal surface of the substrate forming the semiconductor device is a lower dimensional plane direction of the single crystal silicon, there is a case where the differences of the characteristics between adjoining transistors are made.

Figure 23:
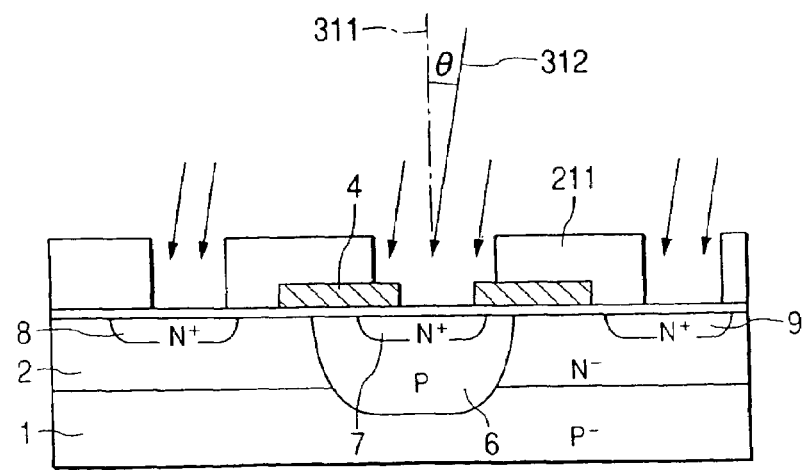
FIG. 23 is a sectional structure view of a semiconductor device.

That is, when an incident angle θ of an ion beam 312 inclining toward a drain or a source from the gate electrodes 4 to the normal line 311 of the principal surface of the semiconductor substrate (wafer) 1 is set after the well region 2, the base region 6, the gate electrodes 4 and the photoresist masks 211 have been formed on the semiconductor substrate 1 in the case where the array arrangement of MIS type field effect transistors having common drains as shown in FIG. 23, ions are implanted into the source regions arranged at both sides of a drain region at an incident angle (−θ) in a respective reverse direction when it is viewed from the drain region side.

Because an effective channel is regulated by the diffusion of impurities in the p-type base region 6 and the n-type source region 7 in the manufacturing method of the MIS type field effect transistors as described above, if ion implantation is performed at an inclining incident angle, the effective channel lengths of adjoining two MIS type field effect transistors become different from each other.

In such a case, the following deteriorations of characteristics occur: the threshold voltages of adjoining transistors are unequal, and the values of electric currents flowing at the operation of MIS type field effect transistors differ between adjoining transistors.

There is a case where the p-type base region 6 and the n-type source region 7 are formed with different ion implantation apparatuses because the quantities of impurities for the ion implantation thereto are different between them. There is also a case where the more remarkable differences of the characteristics of adjoining transistors are made in the array arrangement of the MIS type field effect transistors having the drains commonly when the critical injection angles stipulated in each ion implantation apparatus differ from each other.

Furthermore, when the ion implantation apparatus used at the time of the formation of a base has a larger critical angle and the ion implantation apparatus used at the time of the formation of a source has a smaller critical angle, the difference of the effective channel lengths between adjoining transistors becomes further larger.

Figure 24A:
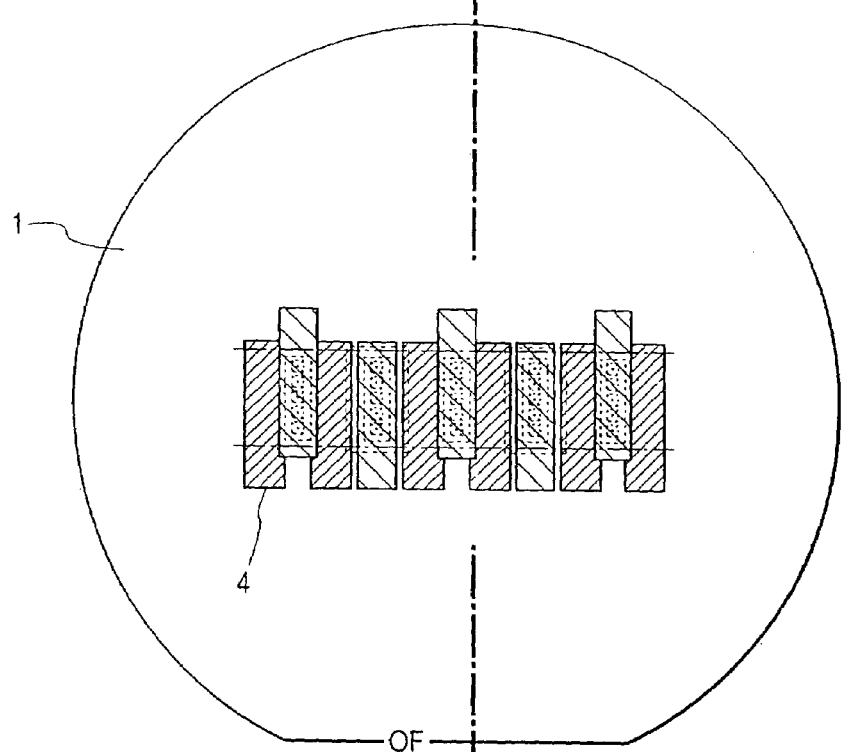
FIG. 24A is a mimetic plan view showing an example of a layout of a semiconductor device to a principal surface of a semiconductor substrate.
Figure 24B:
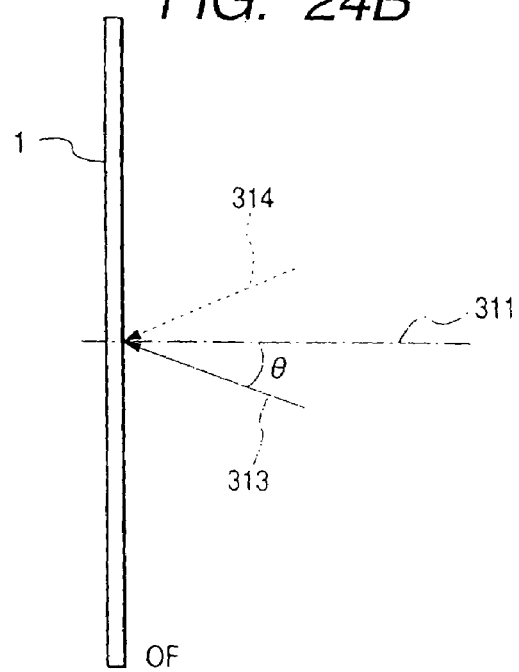
FIG. 24B is a view for illustrating an ion implantation angle to the surface of the semiconductor substrate.
Figure 25A:
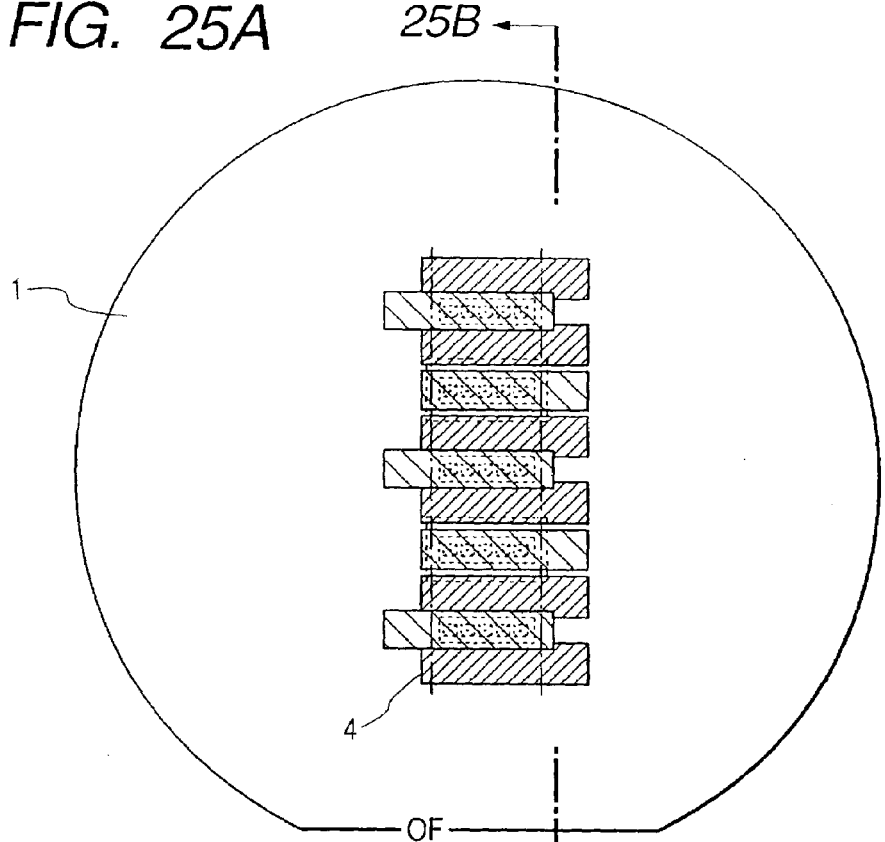
FIG. 25A is a mimetic plan view showing an example of another layout of a semiconductor device to a principal surface of a semiconductor substrate.
Figure 25B:
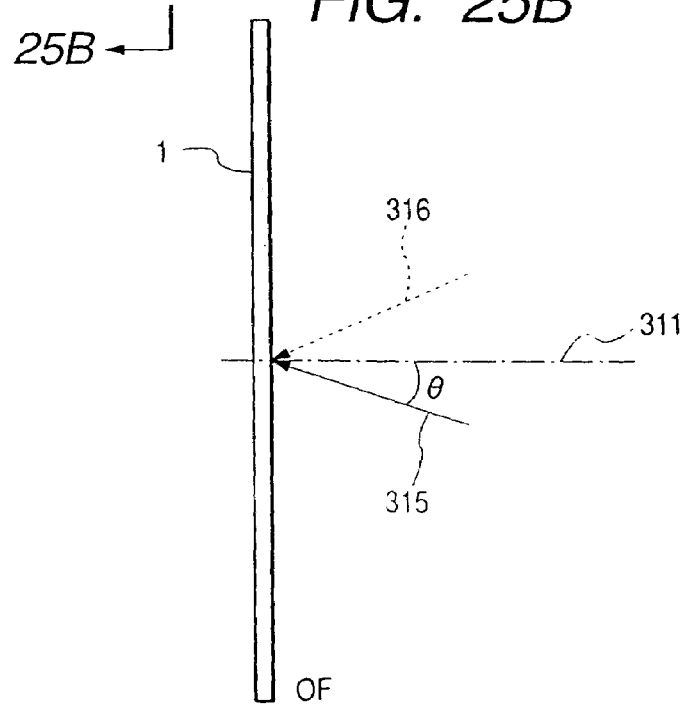
FIG. 25B is a view for illustrating an ion implantation angle to the surface of the semiconductor substrate.
Figure 26:
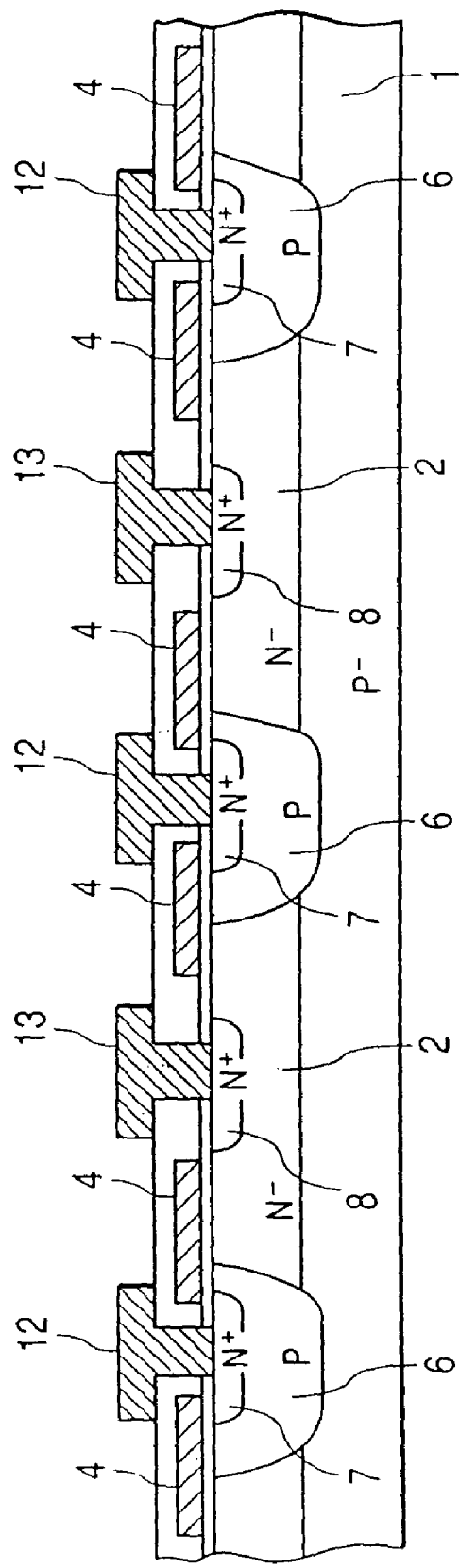
FIG. 26 is a sectional structure view of a semiconductor device.

However, when the array arrangement of the MIS field effect transistors having drains commonly is employed, as shown in FIG. 24A and FIG. 24B, by the setting of beam directions to a direction inclining by an incident angle of θ or −θ like the beam 313 or 314 in the same direction as the arrangement direction of the gate electrodes 4 to the normal line 311 of the principal surface of the semiconductor substrate 1, the aforesaid changes of the characteristics between adjoining transistors are not produced. However, as shown in FIGS. 25A and 25B, if the beam directions are set to be a direction inclining by the incident angle of θ or −θ like the beam 315 or 316 in the direction perpendicular to the arrangement direction of the gate electrodes 4 to the normal line 311 of the principal surface of the semiconductor substrate 1, the array arrangement becomes a transistor array having a sectional structure symmetrical on the right side and on the left side as shown in FIG. 26. Consequently, the defect of the disagreement of the characteristics between adjoining transistors arranged in an array is produced. Such beam incident angle dependency becomes a large restriction on the layout of a circuit.

Accordingly, the present embodiment makes it possible to keep the symmetrical property of each transistor without depending on the circuit layouts on a wafer by performing the ion implantation while rotating the semiconductor substrate.

Figure 27:
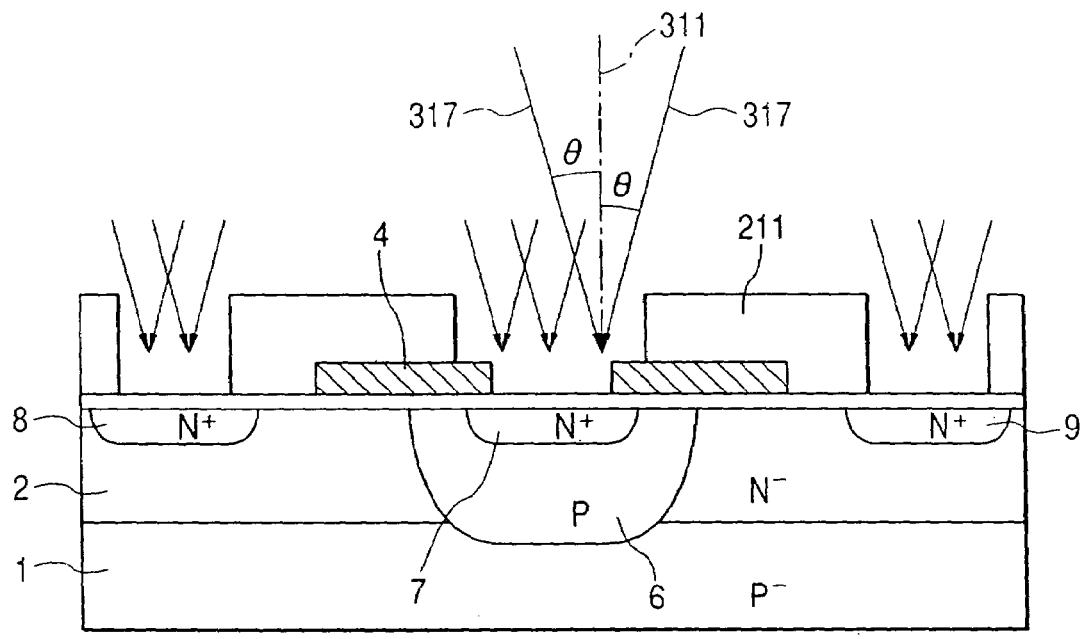
FIG. 27 is a mimetic sectional view of a semiconductor device according to the present invention.
Figure 28:
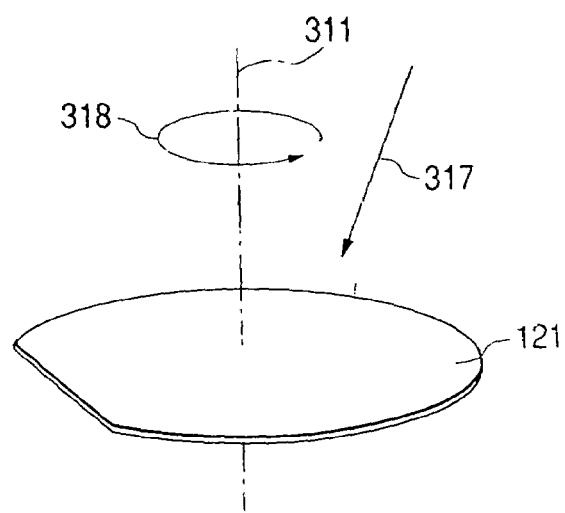
FIG. 28 is a mimetic view showing an ion implantation method to a semiconductor devicec according to the present invention.

The manufacturing method of a semiconductor device according to the present embodiment injects an impurity at the critical angle to the channeling at the time of forming the base region 6, the source region 7, and the drain region 8, as shown in FIGS. 27 and 28, while rotating the substrate 1 (wafer 121) in the outer periphery direction of the substrate 1. Consequently, the positional relation between the end face of the base region 6 formed by introducing an impurity by the ion implantation and by the thermal diffusion of the implanted impurity and the end faces of the source region 7 and the drain region 8 formed by the same introducing of an impurity by the ion implantation and by the thermal diffusion of the implanted impurity can be formed in a well controlled state no matter how the transistors are arranged on the principal surface of the semiconductor substrate 1.

That is, when the array arrangement of the MIS type field effect transistors having drains commonly is employed, as shown in FIG. 27, after the formation of the well regions 2, the base region 6, the gate electrodes 4 and the masks 211, the incident angle 192 of an ion beam 317 against the normal line 311 of the semiconductor substrate 1 (wafer) from the gate electrodes 4 to the surface of the substrate 1 into the direction of the drain 8 or 9 or the source 7 is set to be θ. When the ion beam is injected while the semiconductor substrate 1 is rotated in the outer peripheral direction of the substrate 1, the ion implantation can be performed in such a way that the ions are evenly implanted to the masks 211. Moreover, the effective channel lengths of adjoining two MIS type field effect transistors become the same or substantially the same.

Incidentally, in the injection of the impurity at the time of the formation of the base region 6, the source region 7, and the drain regions 8 and 9, it is preferable to rotate the substrate 1 at the speed of 10 to 60 rpm. Although the center of the rotation depends on the scanning range of the ion beam, the center may be the center of the wafer, or may be a position other than the center of the wafer. Moreover, it is preferable to rotate the substrate 1 by every step of an angle within a range from 45° to 90° to perform the ion implantation of an impurity by the division of the implantation into four times to eight times. More preferably, the ion should be implanted at the angular step of 45° by the division to eight times.

Figure 29B:
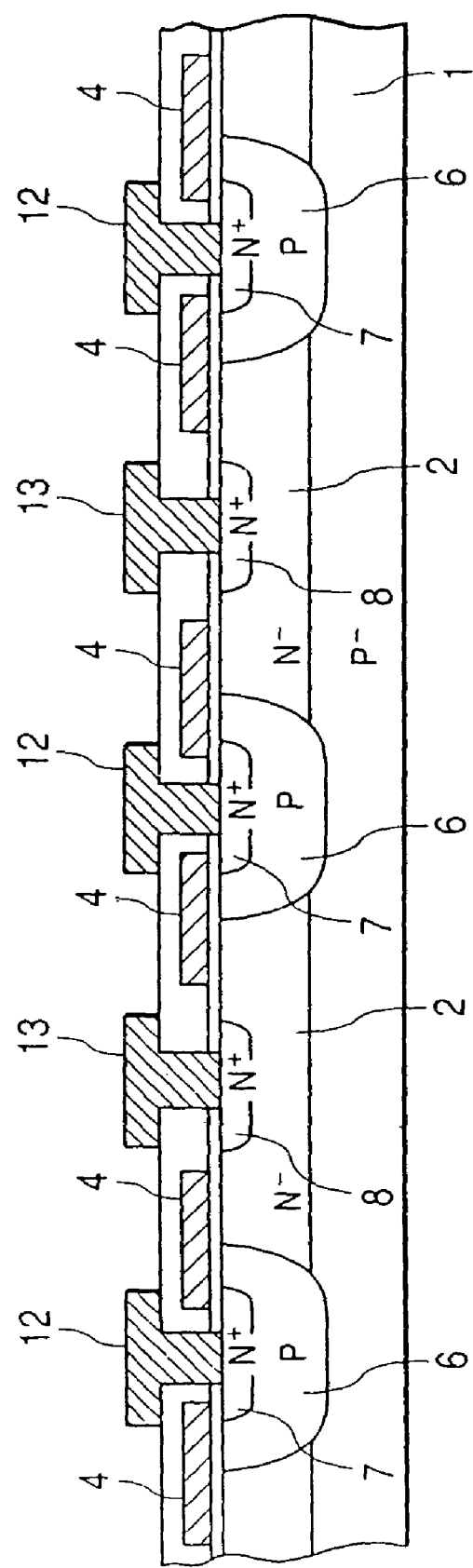
FIG. 29B is a mimetic sectional view taken along a line 29B—29B in FIG. 29A.

The semiconductor device thus manufactured, as show in FIGS. 29A and 29B, has a sectional structure symmetrical on the right side and on the left side. Here a transistor includes on the semiconductor substrate 1 the well region 2, the base region 6 formed deeply to separate the well region 2 completely, the source region 7 formed on the base region 6, the drain region 8 formed in the well region 2, the gate electrodes 4 formed on the gate insulator film, the source electrode 12 connected with the source region 7, and the drain electrode connected with the drain region 8. A reference numeral 14 designates a contact hole.

Moreover, both the base region 6 and the source region 7 are formed by using the gate electrodes 4 as masks. As described above, it is preferable to rotate the substrate 1 at the speed of 10 to 60 rpm when the aforesaid regions are formed. Or it is preferable to rotate the substrate 1 at an angular step of 45° to 90° to perform the ion implantation from four times to eight times. More preferably, the ion should be implanted at the angular step of 45° by the division to eight times. Moreover, it is preferable that the angle of an ion beam inclining against the normal line direction of the semiconductor substrate 1 is within a range from 3° to 10°, preferably 7°, in the case where the principal surface of the semiconductor substrate 1 is, for example, a (100) plane, a (110) plane or a (111) plane. As a preferable condition for manufacturing, it is preferable to set the direction of the ion beam to be 7° against the normal line direction of the semiconductor substrate 1 being a (100) plane.

As a result, the channel lengths of transistors arranged in an array become evenly uniform. Consequently, no size difference owing to alignment is caused, and the MIS type field effect transistors can be manufactured without any diffusion in their threshold values. Moreover a high yield can be realized, and high reliability can be obtained.

Embodiment 14

FIGS. 30A, 30B, 30C, 30D, and 30E are sectional views for illustrating a manufacturing process of a semiconductor device according to the present invention.

Figure 30A:
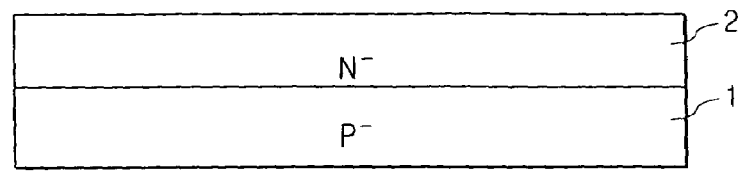
FIGS. 30A, 30B, 30C, 30D and 30E are mimetic sectional views of a semiconductor device according to an embodiment of the present invention.
Figure 30B:
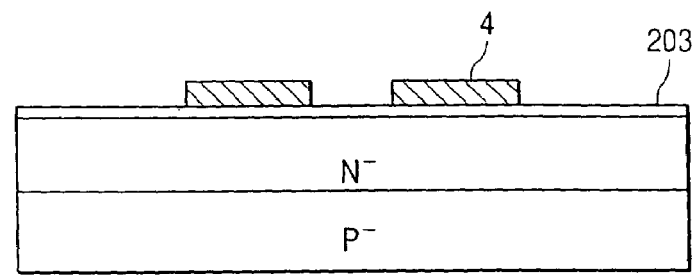
Figure 30C:
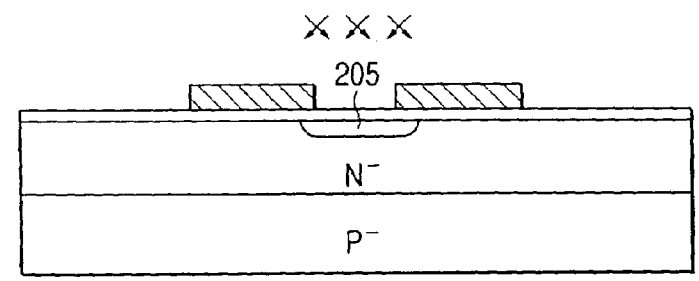
Figure 30D:
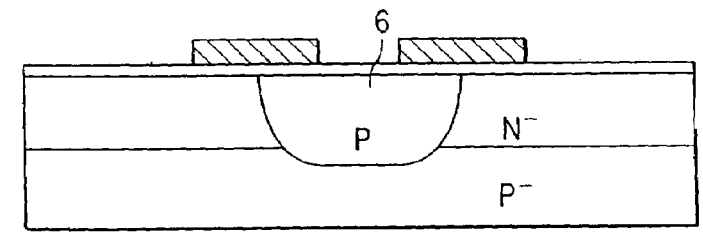
Figure 30E:
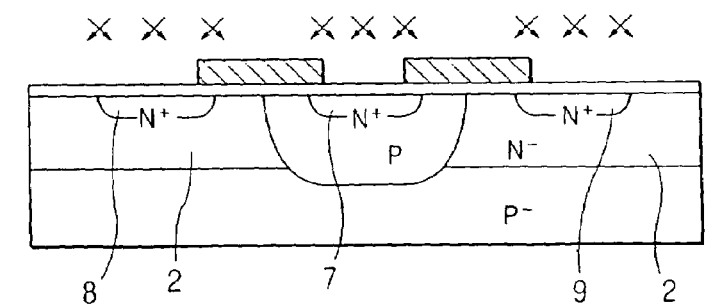

The present embodiment is roughly a method for manufacturing a semiconductor device in which a plurality of insulated gate type field effect transistors are arranged in an array, the method comprising the steps of: forming a second conductive type first semiconductor region on a principal surface of a first conductive type semiconductor substrate 1 (FIG. 30A); forming a gate insulator film 203 on the first semiconductor region (FIG. 30B); forming a plurality of gate electrodes 4 on the gate insulator film 203 (FIG. 30B); forming a first conductive type second semiconductor region by diffusing a first conductive type impurity after implanting the impurity between two adjoining gate electrodes by using the two gate electrodes as masks at a fixed angle to a normal line direction of the semiconductor substrate while rotating the semiconductor substrate 1 (FIGS. 30C and 30D); and forming a second conductive type source region in the second semiconductor region by utilizing the two gate electrodes as masks and a second conductive type drain region 8, 9 severally in two of the first semiconductor regions disposed to put the second semiconductor region between them by implanting the impurity at the fixed angle to the normal line direction of the semiconductor substrate 1 while rotating the semiconductor substrate 1 (FIG. 30E). In the following, the method is described in detail.

As shown in FIG. 30A, the n-type well region 2 is formed on a principal surface of the p-type semiconductor substrate 1. The n-type well region 2 may be formed on the whole principal surface of the p-type semiconductor substrate 1, or as the need arises, the well region 2 may selectively be formed. Moreover, when the n-type well region 2 is formed on the whole principal surface of the p-type semiconductor substrate 1, an epitaxial growth method may be employed.

Next, as shown in FIG. 30B, the gate insulator film 203 is grown on the n-type well region 2 to be 50 nm in thickness by, for example, the pyrogenic oxidation, and the polycrystalline silicon is deposited on the gate insulator film 203 to be 300 nm in the thickness of the film thereof by, for example, the LPCVD method. The polycrystalline silicon is made to have a desired resistance value by, for example, the doping of phosphorus at the same time of the deposition by the LPCVD method, or by the doping of, for example, phosphorus by the use of, for example, the ion implantation method or the solid state diffusion method after the deposition. After that, patterning is performed by means of the photolithography to form resist masks (not shown), and the polycrystalline silicon film is etched. Consequently, the gate electrodes 4 of the MIS type field effect transistor can be formed.

Next, as shown in FIG. 30C, the patterning is performed by the photolithography to form resist masks (not shown), and the gate electrodes 4 are also used as masks. Then, the selective ion implantation of a p-type impurity, for example, boron is performed into the principal surface of the of the semiconductor substrate 1 while the substrate 1 is rotated around the center thereof in the peripheral direction thereof as shown in FIG. 28, and then the impurity layer 205 is formed.

Next, as shown in FIG. 30D, a heat treatment is performed at, for example, 1100° C. for 60 minutes in an electric furnace to form the base region 6 to separate the well region 2 in a traverse direction electrically. It is preferable to design the heat treatment such that the base region 6 is formed to be deeper than the well region 2 for the complete separation of the well region 2, and the conditions of the heat treatment are determined according to the depth of the well region 2, the concentration thereof, the kind of the impurity thereof, and the concentration and the kind of the impurity of the impurity layer 205. Here, the structure in which the base region 6 reaches the p-type semiconductor substrate 1 is shown, but the structure of the base region 6 is not limited to such a structure.

Next, as shown in FIG. 30E, the source region 7, the first drain region 8 and the second drain region 9 are formed by the ion implantation of, for example, arsenic by the use of gate electrodes 4 as masks while the substrate 1 is rotated as shown in FIG. 28.

After that, the heat treatment is performed for, for example, thirty minutes at 950° C., and then the source region 7, the first drain region 8 and the second drain region 9 are activated.

As the source is commonly owned here, the source region 7, the base region 6, the well region 2 on the left side in the figures, and the first drain region 8 respectively constitute the source, the channel and the drain of an MIS type field effect transistor, and the source region 7, the base region 6, the well region 2 on the right side in the figures, and the second drain region 9 respectively constitute the source, the channel and the drain of another MIS type field effect transistor.

After that, although it is not shown, an oxide film is deposited by the CVD method to form an interlayer insulator film. Then, contacts are opened, and wiring is formed. Then, multi-layer wiring is performed as the need arises, and thus an integrated circuit is completed. Electro-thermal conversion elements are made in the wiring forming process by the well known thin film process, and the elements are integrated on the substrate 1. The circuit configuration in this case is the same as that of each embodiment mentioned above.

The manufacturing method of the present embodiment can suitably be used for the manufacturing of a head for a liquid jet apparatus that has already been described.

Embodiment 15

FIGS. 31A to 31F are sectional views for illustrating the manufacturing process of a semiconductor device according to the present embodiment.

Figure 31A:
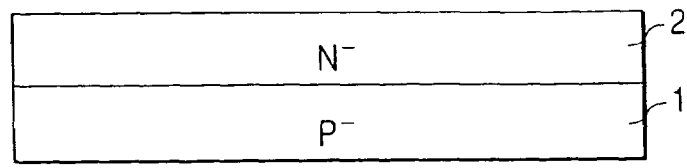
FIGS. 31A, 31B, 31C, 31D, 31E and 31F are mimetic sectional views of a semiconductor device according to an embodiment of the present invention.
Figure 31B:
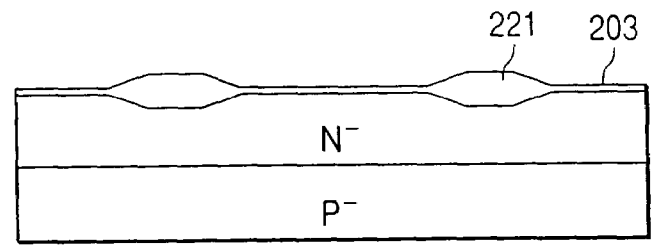
Figure 31C:
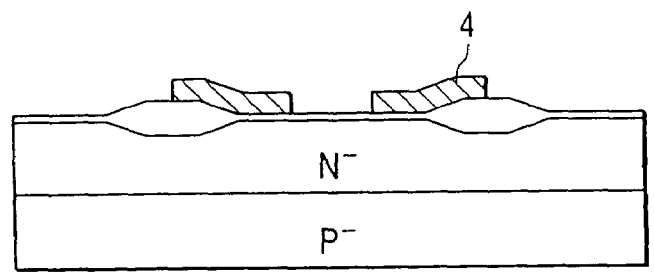
Figure 31D:
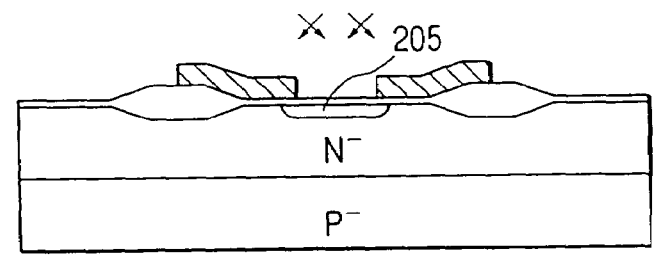
Figure 31E:
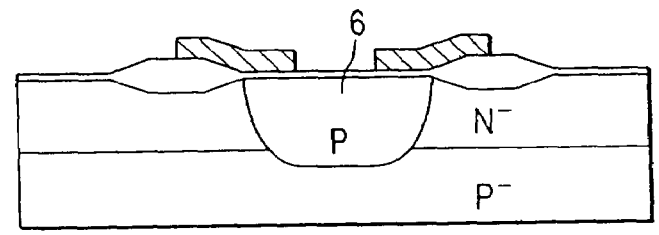
Figure 31F:
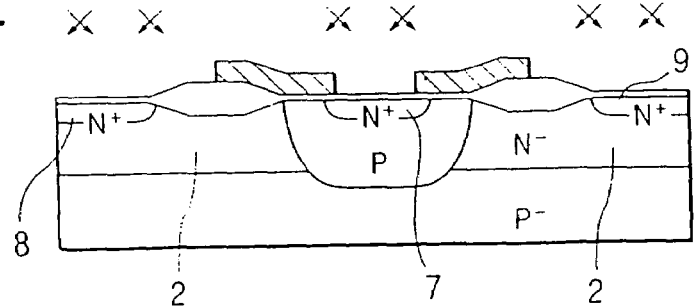

The manufacturing process of a semiconductor device of the present embodiment is roughly a method for manufacturing a semiconductor device in which a plurality of insulated gate type field effect transistors are arranged in an array, the method comprising the steps of: forming the second conductive type well region 2 on a principal surface of the first conductive type semiconductor substrate 1 (FIG. 31A); forming the field insulator films 221 on the well region 2 selectively (FIG. 31B); forming the gate insulator films 203 on the well region 2 (FIG. 31B); forming the gate electrodes 4 on the gate insulator films 203 and the field insulator films 221 (FIG. 31C); forming the first conductive type semiconductor region by diffusing the first conductive type impurity after implanting the impurity between two adjoining gate electrodes on the source region forming side by using the two gate electrodes as masks at the fixed angle to the normal line direction of the semiconductor substrate 1 while rotating the semiconductor substrate 1 (FIGS. 31D and 31E); and forming the second conductive type source region 7 in the semiconductor region by utilizing the two gate electrodes 4 as masks and the second conductive type drain regions 8, 9 severally in two well regions 2 disposed to put the semiconductor region between them by utilizing the field insulator films 211 as masks by implanting the impurity at the fixed angle to the normal line direction of the semiconductor substrate 1 while rotating the semiconductor substrate 1 (FIG. 31F). In the following, the method is described in detail.

As shown in FIG. 31A, the n-type well region 2 is formed on a surface of the p-type semiconductor substrate 1.

Next, a (not shown) pad oxide film is grown to be about 10 nm in thickness by, for example, pyrogenic oxidation on the surface of the well region 2. A (not shown) silicon nitride film is deposited on the pad oxide film to be 150 nm in thickness by, for example, LPCVD method. Then, patterning is performed by the photolithography to etch the silicon nitride film. After that, field insulator films 221 are selectively grown to be 500 nm in thickness by, for example, the pyrogenic oxidation. After that, the silicon oxide film is completely removed by the use of, for example, phosphoric acid, and the pad oxide film is removed by, for example, the 10 wt% of a hydrogen fluoride solution. Then, the gate insulator films 203 are grown to be 10 nm in thickness on the n-type well region 2 by, for example, the pyrogenic oxidation. At this time, although the aforesaid pad oxide film can be used as the gate insulator films 203 as it is, it is not preferable with respect to its reliability. Thus, as shown in FIG. 31B, the gate insulator films 203 as thin oxide films and the field insulator films 221 as thick oxide films are disposed at desired positions on the n-type well regions 2.

Next, as shown in FIG. 31C, polycrystalline silicon is deposited on the gate insulator films 203 and the field insulator films 221 to be about 300 nm in thickness by, for example, the LPCVD method. The polycrystalline silicon is made to have a desired resistance value by, for example, the doping of phosphorus at the same time of the deposition by the LPCVD method, or by the doping of, for example, phosphorus by the use of, for example, an ion implantation method or a solid state diffusion method after the deposition. After that, as shown in the figures, patterning of the polycrystalline silicon film is performed by means of the photolithography such that one end of the film terminates on one of the gate insulator films 203 and the other end thereof terminates on one of the field insulator films 221, and the polycrystalline silicon film is etched. Consequently, the gate electrodes 4 of the MIS type field effect transistor can be formed.

Next, as shown in FIG. 31D, patterning is performed by the photolithography, and the impurity layer 205 is formed by the selective ion implantation of a p-type impurity, for example, boron into the principal surface of the p-type semiconductor substrate 1 by using the gate electrodes 4 as masks while the substrate 1 is rotated as shown in FIG. 28.

Next, as shown in FIG. 31E, a heat treatment is performed, for example, at 1100° C. for 60 minutes in an electric furnace to form the base region 6 for the traverse electrical separation of the well region 2. It is desirable to design the heat treatment such that the base region 6 becomes deeper than the well region 2 for the complete separation of the well region 2 by the base region 6 in the vertical direction, and it is desirable to design the heat treatment such that the base region 6 is situated at a position near to the boundaries between the gate insulator films 203 and the field insulator 221 in the transverse direction. The reason is that, if the base region 6 is formed only to the half way of the gate insulator films 203, there is the possibility that the electric field to be generated under the gate electrodes 4 concentrates to the thin gate insulator films 203 to destroy the gate insulator films 203. Moreover, if the base region 6 is formed up to the thick field insulator films 221, the base regions 6 under the thick field insulator films 221 are not inverted even if a predetermined voltage is applied to the gate electrodes 4, and it becomes difficult for the base regions 6 to perform the switching function of the MIS type electric field transistor. Consequently, even if the switch is turned on, the drivability ability thereof is greatly deteriorated. Accordingly, the conditions of the aforesaid heat treatment is determined according to the depth of the well region 2, the concentration thereof, the kind of the impurity thereof, the concentration and the kind of the impurity of the impurity layer 205 and the sizes of the masks.

Next, as shown in FIG. 31F, the source region 7 is formed by utilizing the gate electrodes 4 as masks and the first drain region 8 and the second drain region 9 are formed by utilizing the field insulator films 211 as masks, by the performance of the ion implantation of, for example, arsenic into the principal surface of the p-type semiconductor substrate 1 while the substrate 1 is rotated as shown in FIG. 28.

After that, the heat treatment is performed for, for example, thirty minutes at 950° C., and then the source region 7, the first drain region 8 and the second drain region 9 are activated. Thus, the insulators on the drain side under the gate electrodes 4 where the electric field concentrates are formed by the field insulator films 221, and thereby the breakdown voltage between the gates and the drains of the MIS type field effect transistor can be improved. For example, in the case where a complementary MIS type field effect transistor that requires high speed operation is formed on the same substrate where an MIS type field effect transistor that requires a high breakdown voltage is formed at the same time, the insulators can be formed without any additional process, which is very effective.

After that, although it is not shown, an oxide film is deposited by the CVD method to form an interlayer insulator film. Then, the contacts are opened, and the wiring is formed. As the need arises, multi-layer wiring may be performed, and thus an integrated circuit is finally completed. The electro-thermal conversion elements are made in the wiring forming process by the well known thin film process, and the elements are integrated on the substrate 1. The circuit configuration in this case is the same as that of the embodiments mentioned above.

As described above, according to Embodiments 13 to 15, because the ion implantation of the impurity is performed while the substrate 1 is rotated at the time of the formation of at least one of the base region 6, the source region 7 and the drain regions 8, 9, in a semiconductor device requiring an array structure composed of a plurality of transistors, the device structures of both side transistors having a commonly pulled out source electrode put between them can be formed as the same and symmetrical structures, and their threshold voltage and on-resistances at operation can accurately be formed to their designed values.

Consequently, an MIS type field effect transistor having a high breakdown voltage and being capable of operating at high speed can be formed at a high yield and with high reliability in low costs.

Embodiment 16

The aforesaid Embodiments 13 to 15 are effective in case of using a wafer (substrate) having a principal surface according with a low dimensional plane direction (e.g. a (100) plane) of a silicon single crystal constituting the wafer, i.e. the so-called JUST substrate.

Then, in the following embodiment, a manufacturing method of a semiconductor is described in which the substrate is not always required to be rotated.

A semiconductor device of the present embodiment is a semiconductor device in which a plurality of insulated gate type field effect transistors are disposed in an array, the insulated gate type field effect transistors severally comprising: a second conductive type first semiconductor region formed on a first conductive type semiconductor substrate including one principal surface having a plane direction inclining (e.g. $\theta=4°$) to a lower dimensional plane direction; a first conductive type second semiconductor region formed to separate the first semiconductor region, the second semiconductor region having a concentration higher than that of the first semiconductor region; a second conductive type source region formed in the second semiconductor region; and a second conductive type drain region formed in the first semiconductor region.

Moreover, a method for manufacturing the semiconductor device comprises the steps of: forming a second conductive type well region on a first conductive type semiconductor substrate including one principal surface having a plane direction inclining (e.g. $\theta=4°$) to a lower dimensional plane direction; forming a gate insulator film in the well region; forming gate electrodes on the gate insulator film; forming a base region by diffusing a first conductive type impurity after doping the impurity into the semiconductor substrate perpendicularly (including directions capable of being substantially regarded as perpendicular) by utilizing the gate electrodes as masks; and forming a second conductive type source region in the base region by utilizing the gate electrodes as masks and a second conductive type drain region in the well region by performing the ion implantation of the impurity into the semiconductor substrate severally perpendicularly (including directions capable of being substantially regarded as perpendicular).

Moreover, another method for manufacturing the semiconductor device comprises the steps of: forming a second conductive type well region on a first conductive type semiconductor substrate including one principal surface having a plane direction inclining (e.g. $\theta=4°$) to a lower dimensional plane direction; forming a field insulator film in the well region selectively; forming a gate insulator film in the well region; forming gate electrodes on the gate insulator film and the field insulator film; forming a base region by diffusing a first conductive type impurity after doping the impurity into the semiconductor substrate perpendicularly (including directions capable of being substantially regarded as perpendicular) by utilizing the gate electrodes as masks; and forming a second conductive type source region in the base region by utilizing the gate electrodes as masks and a second conductive type drain region in the second conductive type well region by utilizing the filed insulator film as a mask, by performing the ion implantation of the impurity into the semiconductor substrate severally perpendicularly (including directions capable of being substantially regarded as perpendicular).

Figure 32:
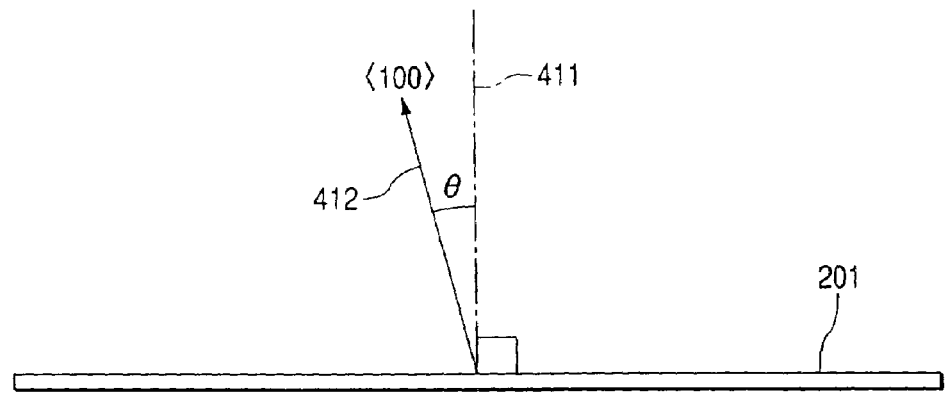
FIG. 32 is a mimetic view showing a plane direction of a principal surface of a semiconductor according to the present invention.

In the present embodiment, as shown in FIG. 32, the plane direction of a principal surface of a semiconductor substrate 201 inclines (e.g. $\theta=4°$) to a lower dimensional plane direction 412 (e.g. the plane direction <100> of a (100) substrate) to be used in the formation of an ordinary semiconductor device. Even if the ion implantation is performed in a direction according to the normal line direction 411 of the semiconductor substrate 201 is such a way, no channeling happens. As the lower dimensional plane direction, there are a plane direction <110> of a (110) plane and a plane direction <111> of a (111) plane besides the plane direction <100> of the (100) plane. It is desirable to set the direction to incline to the normal line direction by an angle from 3° to 10°, preferably 4°.

The formation of the inclination to the lower dimensional plane direction is realized by, for example, the cutting out of a wafer from a single crystal ingot such that the wafer inclines to the lower dimensional plane direction by a fixed angle. Incidentally, for the indication of the plane of a principal surface of a semiconductor, Miller indices are used by the notation of, for example, (100). Moreover, for example, the notation of <100> is used as the meaning of a crystal axis corresponding to the principal surface, and then corresponds to the normal lien of the (100) plane. The meaning of "inclining to a plane direction" is that the principal surface of the substrate inclines to, for example, the (100) plane of a single crystal, namely <100> inclines to the normal line direction of the principal surface.

A substrate inclining to the plane direction of the single crystal thereof is called as an OFF substrate, and a substrate having the inclination of zero is called as a JUST substrate.

For example, when simple n-type MOS FET's are actually made on various substrates and the mobility of them is measured, the results are as follows.

| | <Carrier Mobility of NMOS> | |
|---|---|---|
| Kind of Substrate | P(100) JUST Substrate | P(100) 4° OFF Substrate |
| NMOS 50/50 (μm) | 619 (cm$^2$/V · sec) | 586 (cm$^2$/V · sec) |
| NMOS 50/3 | 609 | 569 |
| NMOS 12/3 | 617 | 576 |

That is, the mobility becomes smaller by 3% in the case of the 4° OFF substrate (inclining by 4°) in comparison with the case of the JUST substrate (having no inclination). However, the difference does not matter on practical use.

In the aforesaid semiconductor device and the manufacturing method thereof according to the present invention, because the injection of the impurity is performed in the direction perpendicular to the semiconductor substrate 1 at the time of the formation of the base region 6, the source region 7 and the drain regions 8 and 9, the formed transistor has a structure such that the positional relation between the end face of the base region 6 formed by the introducing of the impurity by the ion implantation and by the thermal diffusion of the implanted impurity and the end faces of the source region 7 and the drain regions 8 and 9 formed by the same introducing of the impurity by the ion implantation and by the thermal diffusion of the implanted impurity is symmetrical, and thereby, the transistors can be formed in a well controlled state no matter how the transistors are arranged on the principal surface of the semiconductor substrate 1.

Figure 33:
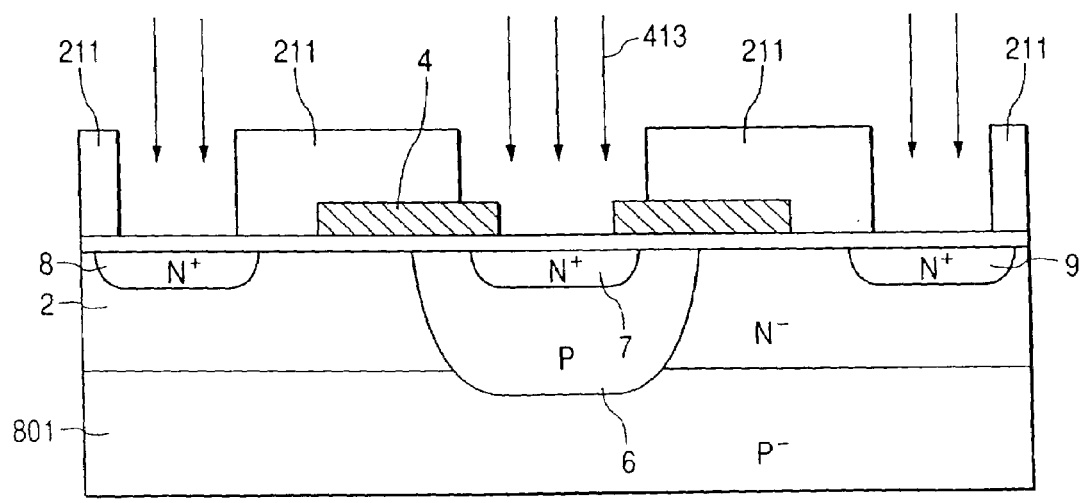
FIG. 33 is a mimetic sectional diagram of the semiconductor device according to the present invention.

That is, when the array arrangement of the MIS type field effect transistors having drains commonly is employed, as shown in FIGS. 32 and 33, after the formation of the well regions 2, the base region 6, the gate electrodes 4 and the photoresist masks 211 on the semiconductor substrate 201 including a principal surface having the plane direction inclining (e.g. q=4°) to a lower dimensional plane direction, the performance of ion implantation 413 into a principal surface perpendicularly in the direction from the gate electrode 4 to the drain or the source enables the uniform ion implantation on the right side and on the left side to the masks. Consequently, the effective channel lengths of adjoining two MIS type field effect transistors become the same (even if there are little errors, the lengths can be regarded as the same).

The manufacturing process is substantially the same as that of the embodiment described by reference to FIGS. 6 to 9, and the different point between both of them is only that an OFF substrate is used as the substrate of the present embodiment. According to the present embodiment, the limitation on a wafer is removed, and a good semiconductor device can be manufactured at a low cost.

As described above, according to Embodiment 16 of the present invention, even if the injection of the impurity is performed in the perpendicular direction to the semiconductor substrate 801 at the time of the formation of the base region 6, the source region 7 and the drain regions 8 and 9, no discrepancy from designed values owing to the channeling at the time of the injection of the impurity happens. Furthermore, in a semiconductor device requiring an array structure composed of a plurality of transistors like one as described concerning the related art, Embodiment 16 can form the device structures on both sides of a source electrode pulled out commonly the same, and can form the transistors having accurate threshold values and on-resistances at operation against their designed values.

Consequently, Embodiment 16 can form an MIS type field effect transistor having a high breakdown voltage and capable of operating at a high speed in a high yield and with high reliability and further at a low price.

<Liquid Jet Apparatus>

An example of an ink jet printer is described as an example of a liquid jet apparatus of the present invention.

Figure 34:
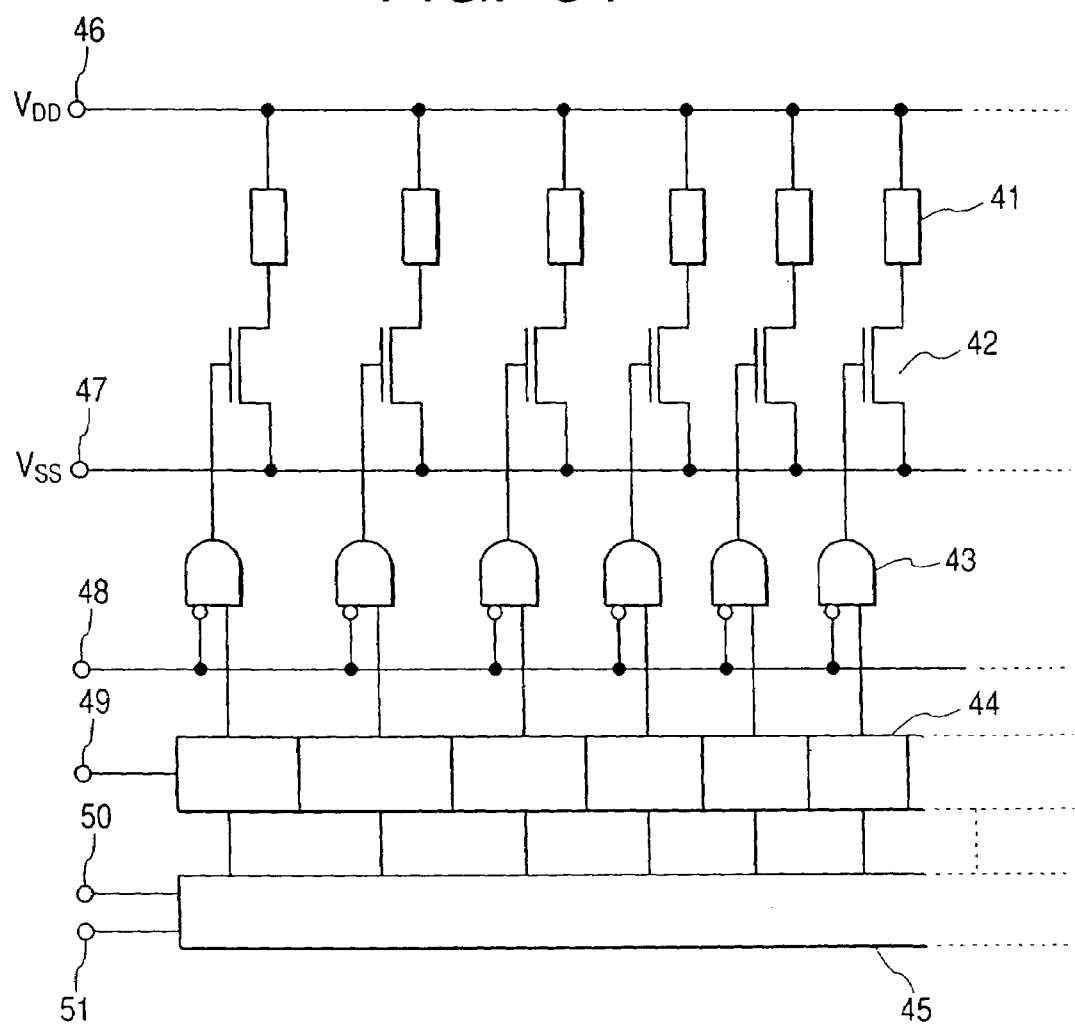
FIG. 34 is a circuit block diagram of a semiconductor device according to the present invention.

FIG. 34 is a diagram showing the circuit configuration of a semiconductor device constituting a recording head of an ink jet printer according to the present invention. As the semiconductor device, the devices manufactured in conformity with all the embodiments described above may be used.

A reference numeral 41 designates an array of electro-thermal conversion elements as loads; a reference numeral 42 designates an array of switching devices; a reference numeral 43 designates an array of logical gates; a reference numeral 44 designates a latch circuit; and a reference numeral 45 designates a shift register.

A reference numeral 46 designates a terminal to which a source voltage VDD is supplied; a reference numeral 47 designates a terminal to which the ground voltage VSS is supplied; a reference numeral 48 designates a terminal to which an enable signal controlling the on-timing of the switching devices in the array 42 is input; a reference numeral 49 designates a terminal to which a signal controlling the latch circuit 44 is input; a reference numeral 50 designates a terminal to which a picture signal is input; and a reference numeral 51 designates a terminal to which a clock signal is input.

The array 41 of the electro-thermal conversion elements, the array 42 of the switching devices, the array 43 of the logical gates, the latch circuit 44 and the shift resister 45 are disposed in parallel to one another on one chip, and the rough layout is the same as that shown in FIG. 34.

A digital picture signal input from the terminal 50 is rearranged to be parallel by the shift register 45, and rearranged picture signals are latched by the latch circuit 44. When the logical gates are enabled, the switching devices in the array 42 are turned on or off according to the signals latched by the latch circuit 44 to flow electric currents through selected electro-thermal conversion elements in the array 41.

The transistor in each embodiment mentioned above can suitably be used as the switching devices in the array 42. Then, it is preferable that no dedicated isolation region is formed between the switching devices in the array 42 and an isolation region such as a field insulator film is formed between a plurality of arrays, for example, between the arrays 42 and 41 and between the arrays 42 and 43 (or between the latch circuit 44 and the shift register 45).

Figure 35:
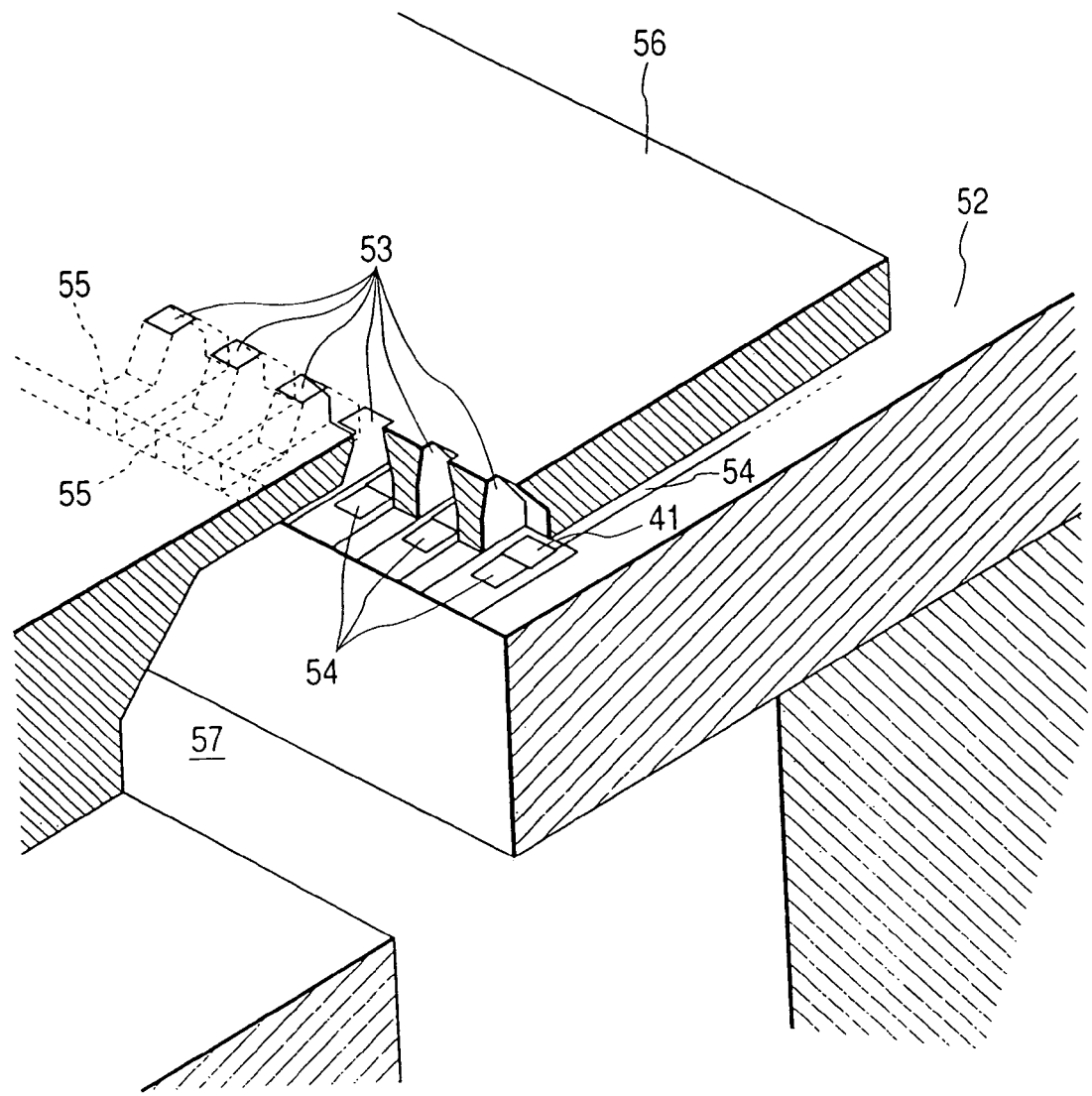
FIG. 35 is a mimetic view for illustrating the structure of a liquid jet head according to the present invention.

FIG. 35 is a mimetic view of a liquid jet head.

Electro-thermal conversion elements (heaters) for jetting ink from an exhaust port 53 with air bubbles produced by the heat generated by electric currents flowing through the elements are arranged in a plurality of rows on a device substrate 52 on which the circuit of FIG. 34 are formed. A wiring electrode 54 is provided to each electro-thermal conversion element 41, and one end side of the wiring electrode 54 is electrically connected with the switching device 42 in the array 42.

A channel 55 for supplying ink to the exhaust portion 53 located at a position opposed to the electro-thermal conversion element 41 is formed correspondingly to each exhaust portion 53. Walls constituting the exhaust portions 53 and the channels 55 are formed in a member 56 with grooves, and the channels 55 and a common liquid chamber 57 for supplying ink to the plural channels 55 are formed by the coupling of the member 56 with grooves and the device substrate 52.

Figure 36:
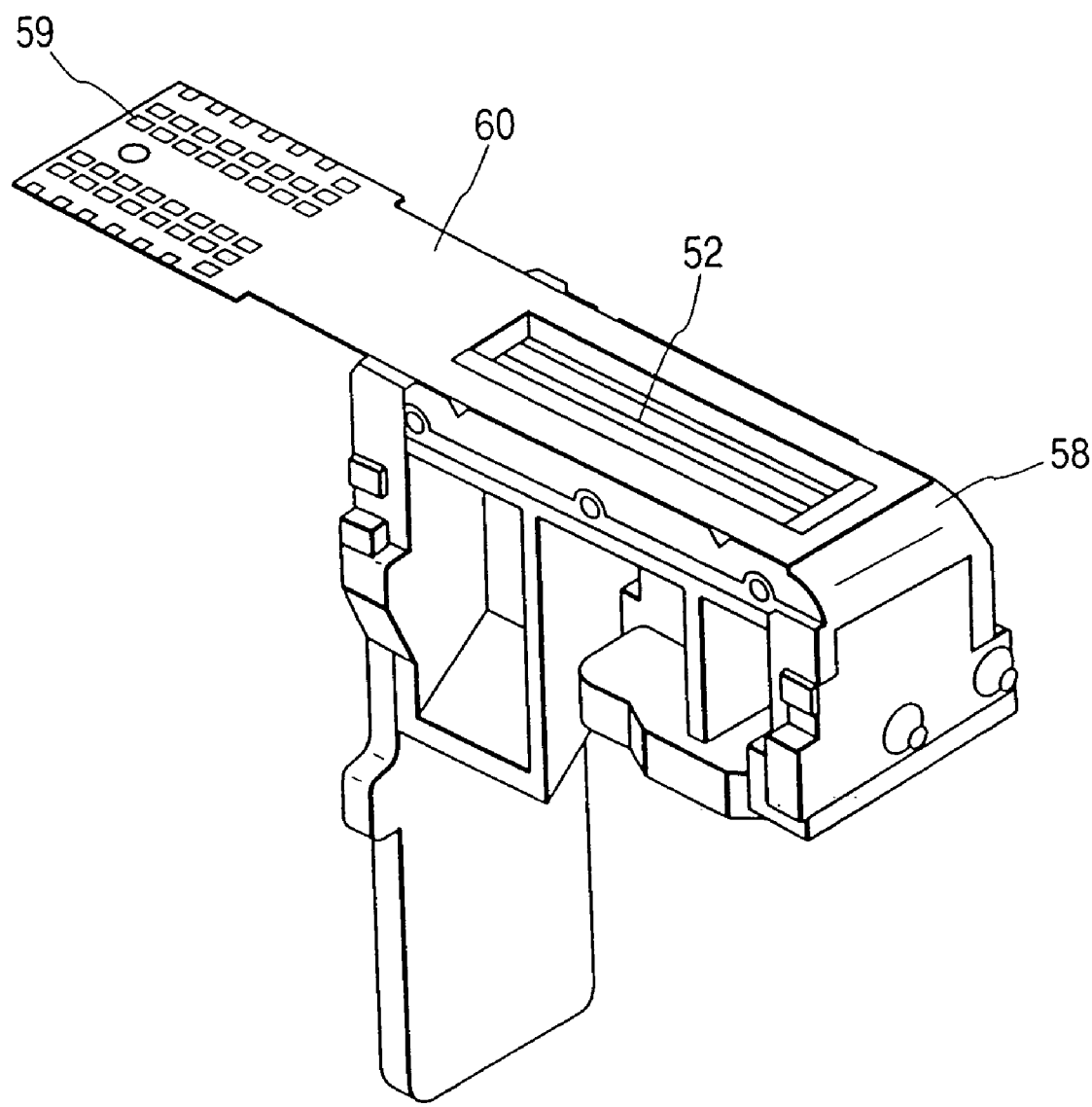
FIG. 36 is a mimetic perspective view showing the external appearance of the liquid jet head according to the present invention.

FIG. 36 shows the structure of the liquid jet head incorporating the device substrate 52 according to the present invention. The device substrate 52 is incorporated in a frame 58. The member 56 for forming the exhaust portions 53 and the channels 55 is attached to the device substrate 52. And, contact pads 59 for receiving electric signals from the printer are provided on the device substrate 52, and through the contact pads 59 and a flexible printed wiring board 60, electric signals being various kinds of driving signals are supplied to the device substrate 52.

Figure 37:
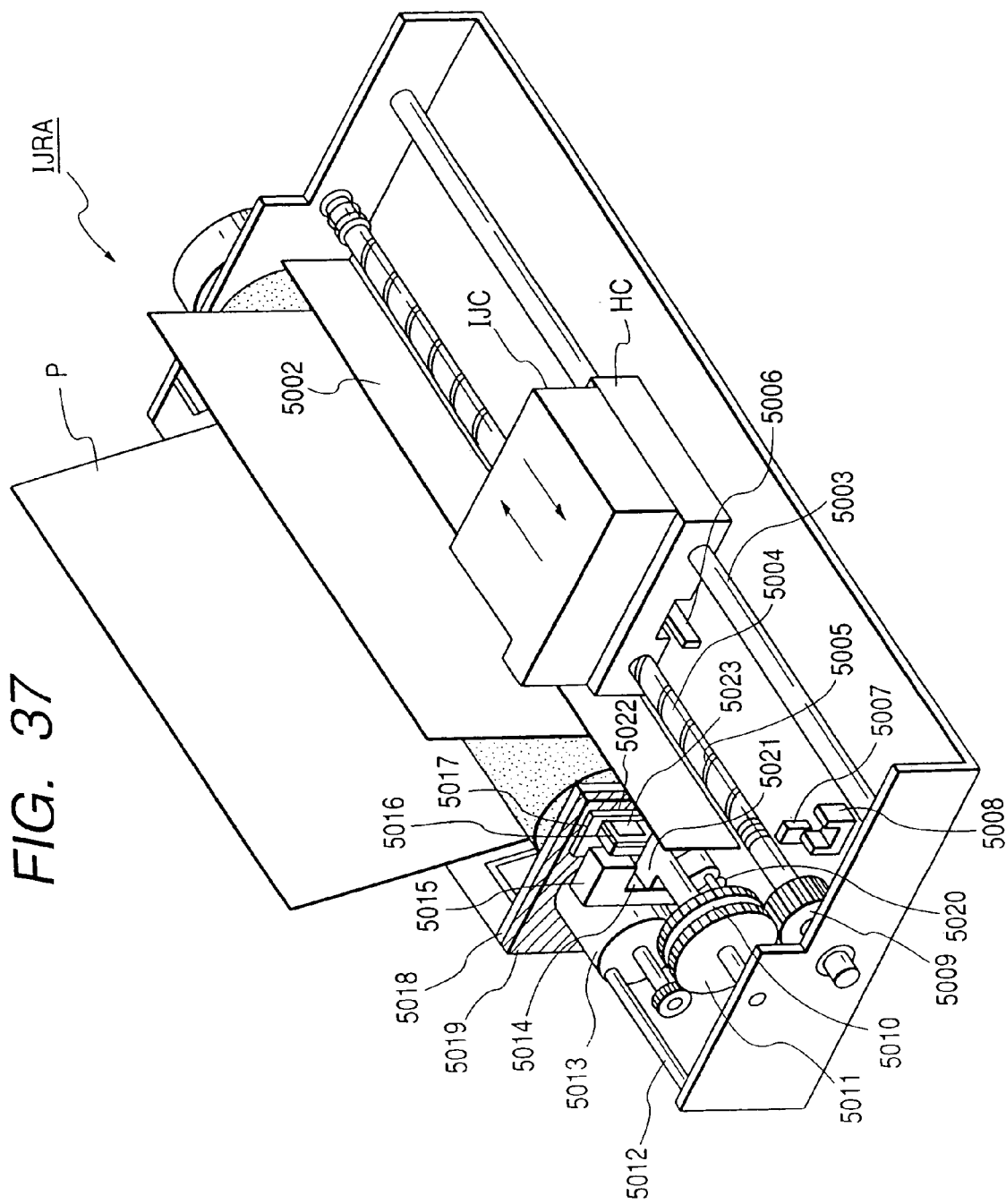
FIG. 37 is a mimetic view showing the liquid jet apparatus according to the present invention.
Figure 38:
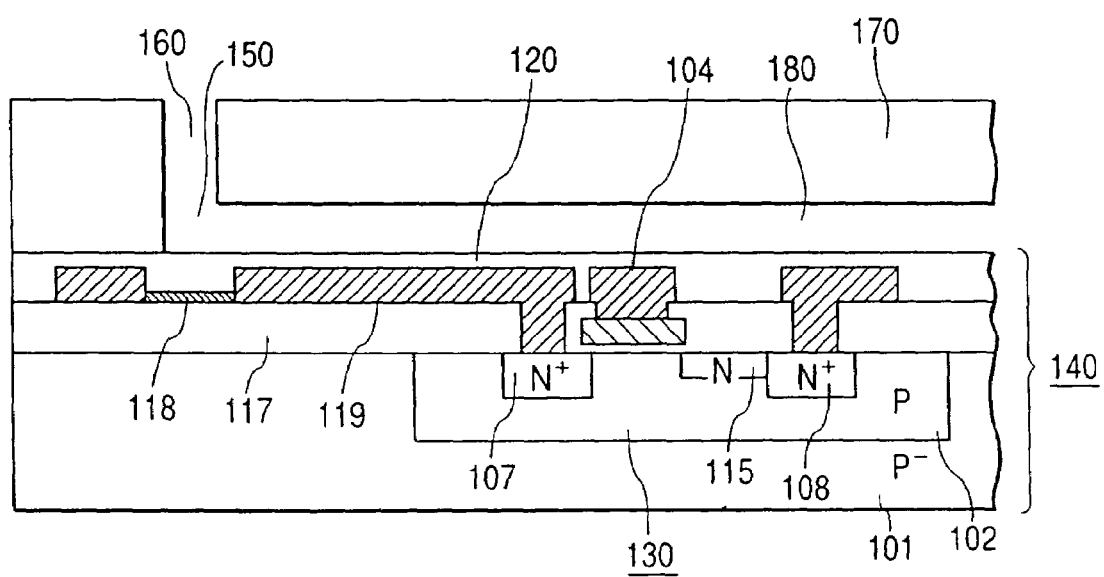
FIG. 38 is a mimetic sectional view showing a conventional liquid jet head.

FIG. 37 is a conspectus view of an ink jet recording apparatus IJRA in which an ink jet head according to the present invention is installed. A carriage HC engaged with a spiral groove 5004 of a lead screw 5005 rotated through driving force transmitting gears 5011 and 5009 with being interlocked with the forward and reverse rotations of a driving motor 5013 has a pin (not shown), and the carriage HC reciprocatory moves in the directions of arrows "a" and "b". A reference numeral 5002 designates a sheet pressing board to press a sheet against a platen 5000 being recording medium conveying means for conveying a sheet in carriage moving direction. Reference numerals 5007 and 5008 designate a photocoupler being detecting means for ascertaining the existence of a lever 5006 of the carriage HC at the position to perform the switching of the rotation direction of the driving motor 5013 and other operation. A reference numeral 5016 designates a member for supporting a cap member 5022 for capping the front surface of the recording head, and a reference numeral 5015 designates a sucking means for sucking the inside of the cap member 5022 to perform the suction recovery of the recording head through an opening 5023 in the cap member 5022. A reference numeral 5017 designates a cleaning blade, and a reference numeral 5019 designates a member for enabling the movement of the cleaning blade 5017 in the lengthwise direction, on which a main body supporting board 5018 is supported. It is needless to say that well known cleaning blades can be applied to the present embodiment besides the disclosed shape. Moreover, a reference numeral 5012 designates lever for initiating the sucking of the suction recovery, and the lever 5012 moves in association with a cam 5020 for transmitting and controlling the driving force from the driving motor 5013 with a known transmission mechanism such as clutch switching and the like.

Incidentally, a controller (not shown) composed of electric circuitry for supplying image signals, drive controlling signals and the like to the device substrate 52 is equipped in the present printer.

Although the present invention has been described in its preferred form with a certain degree of particularity, obviously many changes and variations are possible therein. It is therefore to be understood that the present invention may be practiced differently than as specifically described herein without departing from scope and the sprit thereof.

What is claimed is:

1. A method for manufacturing a semiconductor device in which a plurality of electro-thermal conversion elements and a plurality of insulated gate type field effect transistors for flowing electric currents through said plurality of electrotherinal conversion elements are integrated on a first conductive type semicouductor substrate, said method comprising the steps of:

forming a second conductive type first semiconductor region on one principal surface of the first conductive type semiconductor substrate;

forming a gate insulator film on said first semiconductor region;

forming a first gate electrode on said gate insulator film;

doping a first conductive type impurity by utilizing said first gate electrode as a mask;

forming a second semiconductor region for providing a channel region of an insulated gate type field effect transistor of said plurality of insulated gate type field effect transistors, by diffusing said first conductive type impurity; and forming a second conductive type source region on the surface side of said second semiconductor region and a second conductive type drain region on the surface side of said first semiconductor region, wherein said source region is formed by utilizing said first gate electrode as a mask such that said source region extends from beneath said first gate electrode to beneath a second gate electrode formed on said gate insulator film, wherein said source region is formed by ion implantation of an impurity from a direction inclined at a predetermined angle from a direction normal to the first conductive type semiconductor substrate, and wherein said drain region is formed with a mask to offset said drain region from said first gate electrode.

2. A method according to claim 1, further comprising the steps of:

performing a first conductive type ion implantation through an area between said first and second gate electrodes into at least a channel region pat between said source region and said first semiconductor region on the surface side of said second semiconductor region after said step of forming said second semiconductor region; and performing a heat treatment for electrically activating an impurity implanted by said first conductive type ion implantation.

3. A method according to claim 1, further comprising the steps of:

performing a first conductive type ion implantation through an area between said first and second gate electrodes into at least a channel region put between said source region and said first semiconductor region on the surface side of said second semiconductor region after said step of forming said second semiconductor region; and performing a heat treatment for electrically activating an impurity implanted by said first conductive type ion implantation, wherein said first conductivc type ion implantation is ion implantation in which ions of boron are implanted in energy of 100 keV or more.

4. A method according to ciaim 1, wherein said drain region is providcd in plurality, at least two of said plurality of drain regions being connected wit the same one of said plurality of electra-thermal conversion elements, and wherein said source region is provided in plurality, each of said plurality of source regions being connected wit one another.

* * * * *

UNITED STATES PATENT AND TRADEMARK OFFICE
CERTIFICATE OF CORRECTION

PATENT NO. : 7,056,798 B2
APPLICATION NO. : 10/657269
DATED : June 6, 2006
INVENTOR(S) : Mineo Shimotsusa et al.

It is certified that error appears in the above-identified patent and that said Letters Patent is hereby corrected as shown below:

COVER PAGE:
(56) References Cited FOREIGN PATENT DOCUMENTS, "JF 62-98764 5/1997" should be deleted.

COLUMN 2:
Line 10, "5- 129597," should read -- 5-129597, --.

COLUMN 3:
Line 44, "its" (both occurrences) should read -- their --.

COLUMN 6:
Line 52, "surface f" should read -- surface of --.

COLUMN 7:
Line 39, "compose" should read -- composed --.

COLUMN 8:
Line 40, "view" should read -- views --; and
Line 66, "devicec" should read -- device --.

COLUMN 12:
Line 61, "1 mm to 3 mm," should read -- 1µm to 3µm, --.

COLUMN 13:
Line 6, "a-base" should read -- a base --.

COLUMN 15:
Line 22, "regions" should be deleted; and
Line 39, "is" should read -- are --.

COLUMN 17:
Lines 5 and 67, "designate" should read -- designates --.

COLUMN 20:
Line 5, "flowing" should read -- flowing through --.

COLUMN 23:
Line 49, "is suitably" should read -- are suitably --.

UNITED STATES PATENT AND TRADEMARK OFFICE
CERTIFICATE OF CORRECTION

| | |
|---|---|
| PATENT NO. | : 7,056,798 B2 |
| APPLICATION NO. | : 10/657269 |
| DATED | : June 6, 2006 |
| INVENTOR(S) | : Mineo Shimotsusa et al. |

It is certified that error appears in the above-identified patent and that said Letters Patent is hereby corrected as shown below:

COLUMN 26:
Line 7, "on," should read -- on --; and
Line 32, "electrode" should read --electrodes --.

COLUMN 28:
Line 55, "show" should read -- shown --.

COLUMN 30:
Line 14, "of the" (second occurrence) should be deleted.

COLUMN 32:
Line 36, "is" should read -- are --.

COLUMN 34:
Line 12, "filed" should read -- field --.

COLUMN 35:
Line 21, "(e.g. q=4°)" should read -- (e.g. θ=4°) --.

COLUMN 36:
Line 40, "circuit" should read -- circuits --.

COLUMN 37:
Line 46, "therinal" should read -- thermal --; and
Line 47, "semicouductor" should read -- semiconductor --.

UNITED STATES PATENT AND TRADEMARK OFFICE
CERTIFICATE OF CORRECTION

PATENT NO. : 7,056,798 B2
APPLICATION NO. : 10/657269
DATED : June 6, 2006
INVENTOR(S) : Mineo Shimotsusa et al.

It is certified that error appears in the above-identified patent and that said Letters Patent is hereby corrected as shown below:

COLUMN 38:
Line 25, "pat" should read -- put --;
Line 45, "conductivc" should read -- conductive --;
Line 48, "ciaim 1," should read -- claim 1, --;
Line 49, "providcd" should read -- provided --;
Line 50, "wit" should read -- with --;
Line 51, "electra-thermal" should read -- electro-thermal --; and
Line 53, "wit" should read -- with --.

Signed and Sealed this

Sixteenth Day of January, 2007

JON W. DUDAS
*Director of the United States Patent and Trademark Office*